US006961010B2

(12) United States Patent  (10) Patent No.: US 6,961,010 B2
Tsang  (45) Date of Patent: Nov. 1, 2005

(54) DC-FREE CODE DESIGN WITH INCREASED DISTANCE BETWEEN CODE WORDS

(75) Inventor: Kinhing P. Tsang, Plymouth, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 69 days.

(21) Appl. No.: 10/639,830

(22) Filed: Aug. 13, 2003

(65)  Prior Publication Data

US 2005/0040976 A1 Feb. 24, 2005

(51) Int. Cl.[7] .................................................. H03M 7/00
(52) U.S. Cl. .............................. 341/59; 341/58; 341/67
(58) Field of Search ................................ 341/58–59, 67, 341/81

(56)  References Cited

U.S. PATENT DOCUMENTS

| | | | |
|---|---|---|---|
| 4,517,552 A | * 5/1985 | Shirota et al. ................. 341/58 |
| 4,675,652 A | 6/1987 | Machado .................... 340/347 |
| 4,677,421 A | * 6/1987 | Taniyama ..................... 341/59 |
| 5,016,258 A | * 5/1991 | Tanaka et al. ............... 375/242 |
| RE34,088 E | 10/1992 | Johnson et al. ............. 714/759 |
| 5,243,604 A | 9/1993 | Tsang et al. ................ 714/765 |
| 5,381,424 A | 1/1995 | Tsang .......................... 714/769 |
| 5,450,443 A | 9/1995 | Siegel et al. ................ 375/286 |
| 5,537,112 A | 7/1996 | Tsang .......................... 341/59 |
| 5,608,397 A | 3/1997 | Soljanin ....................... 341/58 |
| 5,731,768 A | 3/1998 | Tsang .......................... 341/59 |
| 5,742,243 A | * 4/1998 | Moriyama ................... 341/59 |
| 5,757,822 A | * 5/1998 | Fisher et al. ................ 714/755 |
| 5,774,078 A | * 6/1998 | Tanaka et al. ............... 341/68 |
| 5,781,133 A | 7/1998 | Tsang .......................... 341/59 |
| 5,852,520 A | * 12/1998 | Ido et al. ..................... 360/40 |
| 5,892,466 A | * 4/1999 | Walker ........................ 341/57 |
| 5,901,158 A | 5/1999 | Weng et al. ............. 371/37.12 |
| 5,960,041 A | 9/1999 | Calderbank et al. ........ 375/292 |
| 6,011,497 A | 1/2000 | Tsang et al. ................. 341/59 |
| 6,052,072 A | 4/2000 | Tsang et al. ................. 341/59 |
| 6,058,087 A | * 5/2000 | Tomita .................... 369/47.22 |
| 6,111,834 A | 8/2000 | Rub et al. .................... 360/48 |
| 6,198,413 B1 | * 3/2001 | Widmer ....................... 341/58 |
| 6,198,582 B1 | 3/2001 | Tsang et al. ................. 360/40 |
| 6,229,459 B1 | * 5/2001 | Noda .......................... 341/59 |
| 6,288,655 B1 | 9/2001 | Tsang et al. ................. 341/59 |
| 6,353,912 B1 | 3/2002 | Uchida ...................... 714/792 |
| 6,362,757 B1 | 3/2002 | Lee et al. ................... 341/102 |
| 6,377,532 B1 | 4/2002 | Jung et al. ............... 369/59.23 |
| 6,388,587 B1 | * 5/2002 | Brickner et al. ............. 341/59 |

(Continued)

OTHER PUBLICATIONS

K.A.S. Immink and Levente Patrovics, "Performance Assessment of DC–Free Multimode Codes", IEEE Transactions on Communications, Mar. 1997, vol. 45, No. 3, pp. 293–299.

Volker Bruan and K.A.S. Immink, "An Enumerative Coding Technique for DC–Free Runlength–Limited Sequences", IEEE Transaction on Communications, Dec. 2000, vol. 48, No. 12, pp. 2024–2031.

K.A.S. Immink, "Spectral Null Codes", IEEE Transaction Con Magnetics, Mar. 1990, vol. 26, No. 2, pp. 1130–1135.

Chang Ki Jeong and Eon Kyeong Joo, "Trellis, Multilevel, and Turbo Codes with DC–Free Characteristic", IEICE Trans. Fundamentals, Dec. 2000, vol. E38–A, No. 12, pp. 2706–2714.

Primary Examiner—Michael Tokar
Assistant Examiner—Khai Nguyen
(74) Attorney, Agent, or Firm—Westman, Champlin & Kelly

(57) ABSTRACT

A method and apparatus are provided for encoding digital information. A sequence of successive data words are encoded into a sequence of successive code words according to a code, such that a running digital sum (RDS) of the sequence of successive code words is bounded and is constrained to predetermined, non-adjacent values at boundaries between the code words.

24 Claims, 14 Drawing Sheets

U.S. PATENT DOCUMENTS

| | | | |
|---|---|---|---|
| 6,393,598 B1 | 5/2002 | Tsang et al. | 714/795 |
| 6,467,060 B1 | 10/2002 | Malakapalli et al. | 714/758 |
| 6,480,125 B2 | 11/2002 | Rub et al. | 341/50 |
| 6,535,151 B2 | 3/2003 | Coene | 341/102 |
| 6,559,779 B2 | 5/2003 | Noda et al. | 341/58 |
| 6,567,610 B2 | 5/2003 | Ando et al. | 386/105 |
| 6,614,369 B1 * | 9/2003 | Widmer | 341/59 |
| 6,661,356 B1 * | 12/2003 | Oberg | 341/58 |
| 6,867,713 B2 * | 3/2005 | Tsang | 341/58 |

* cited by examiner

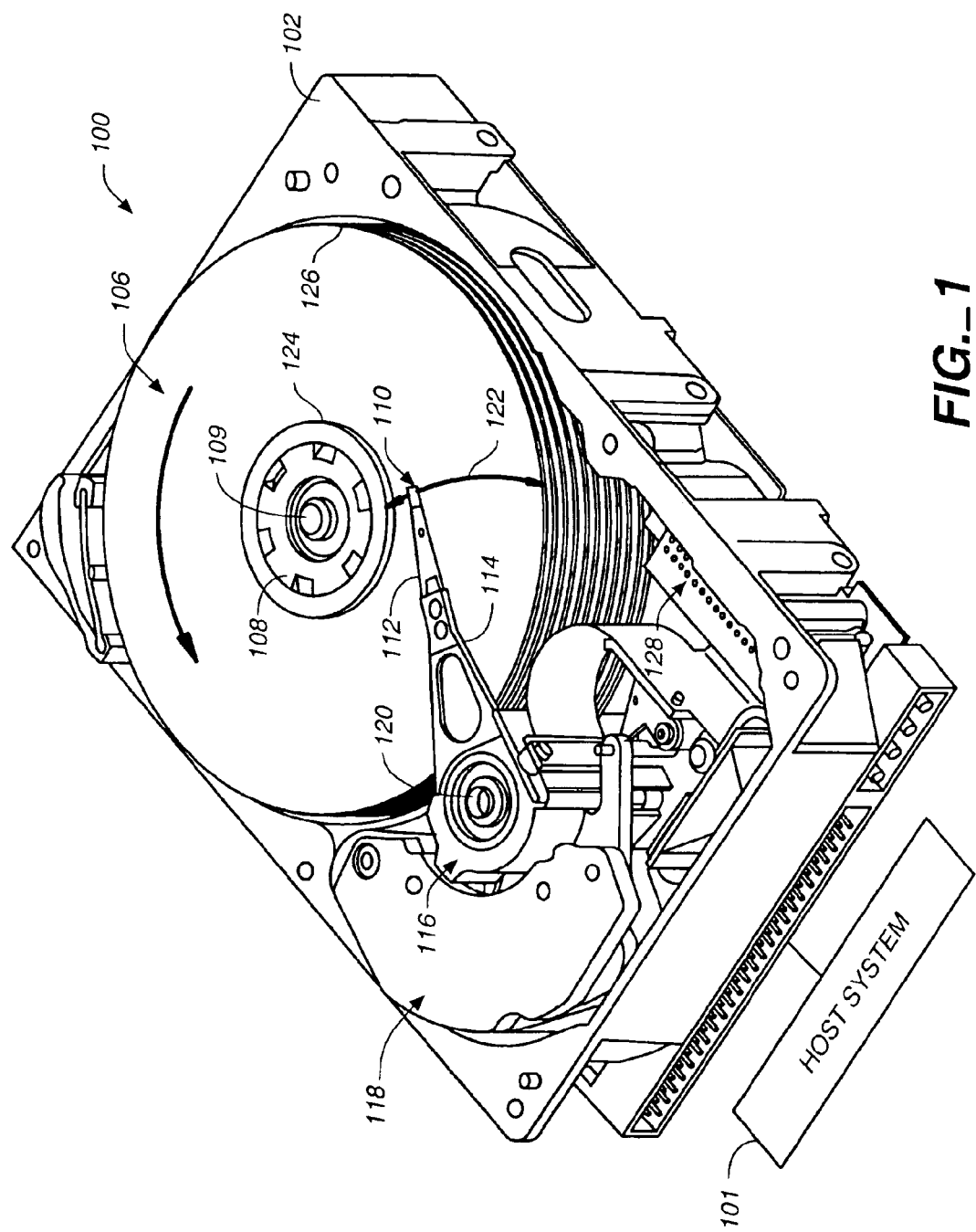
FIG._1

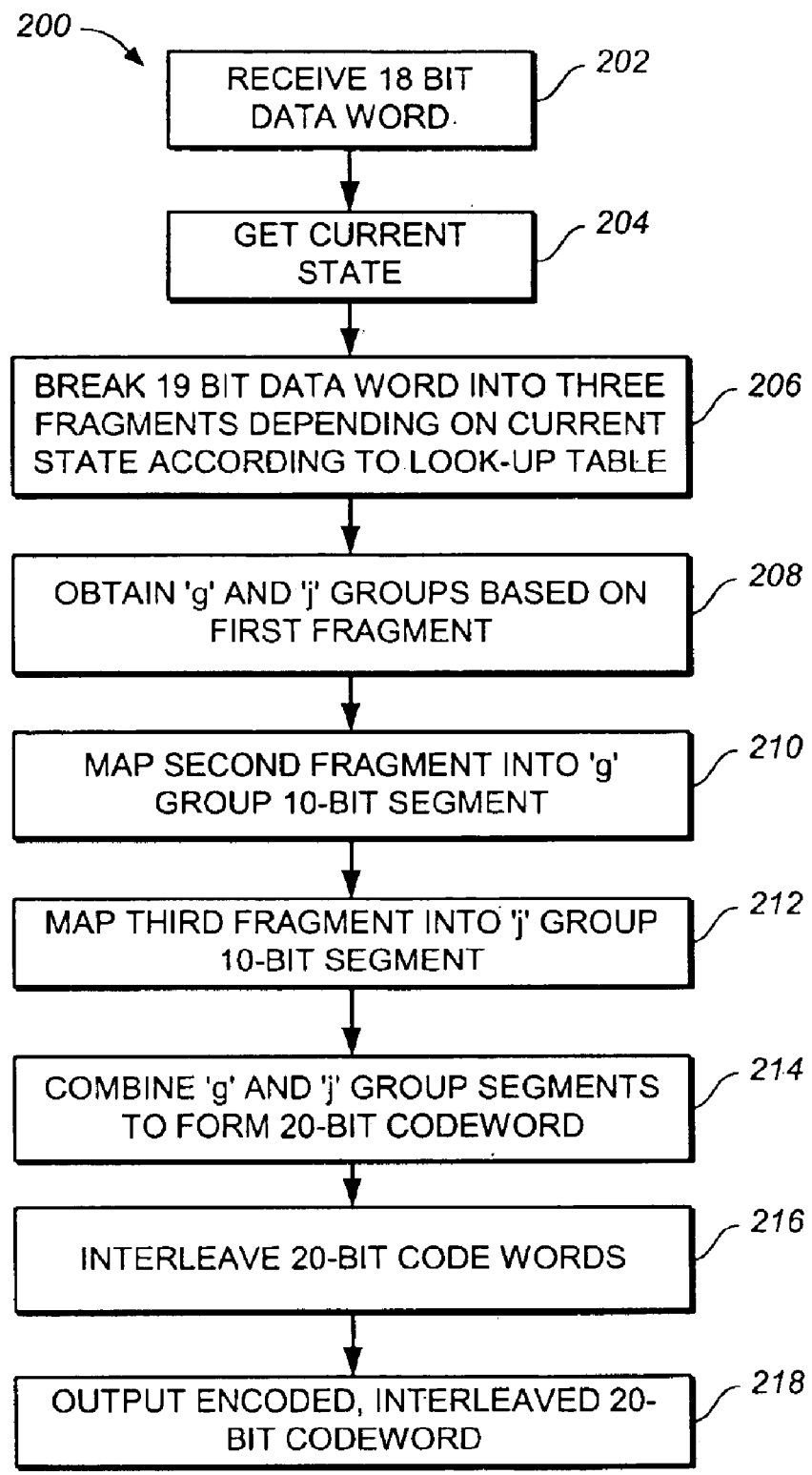
FIG._2

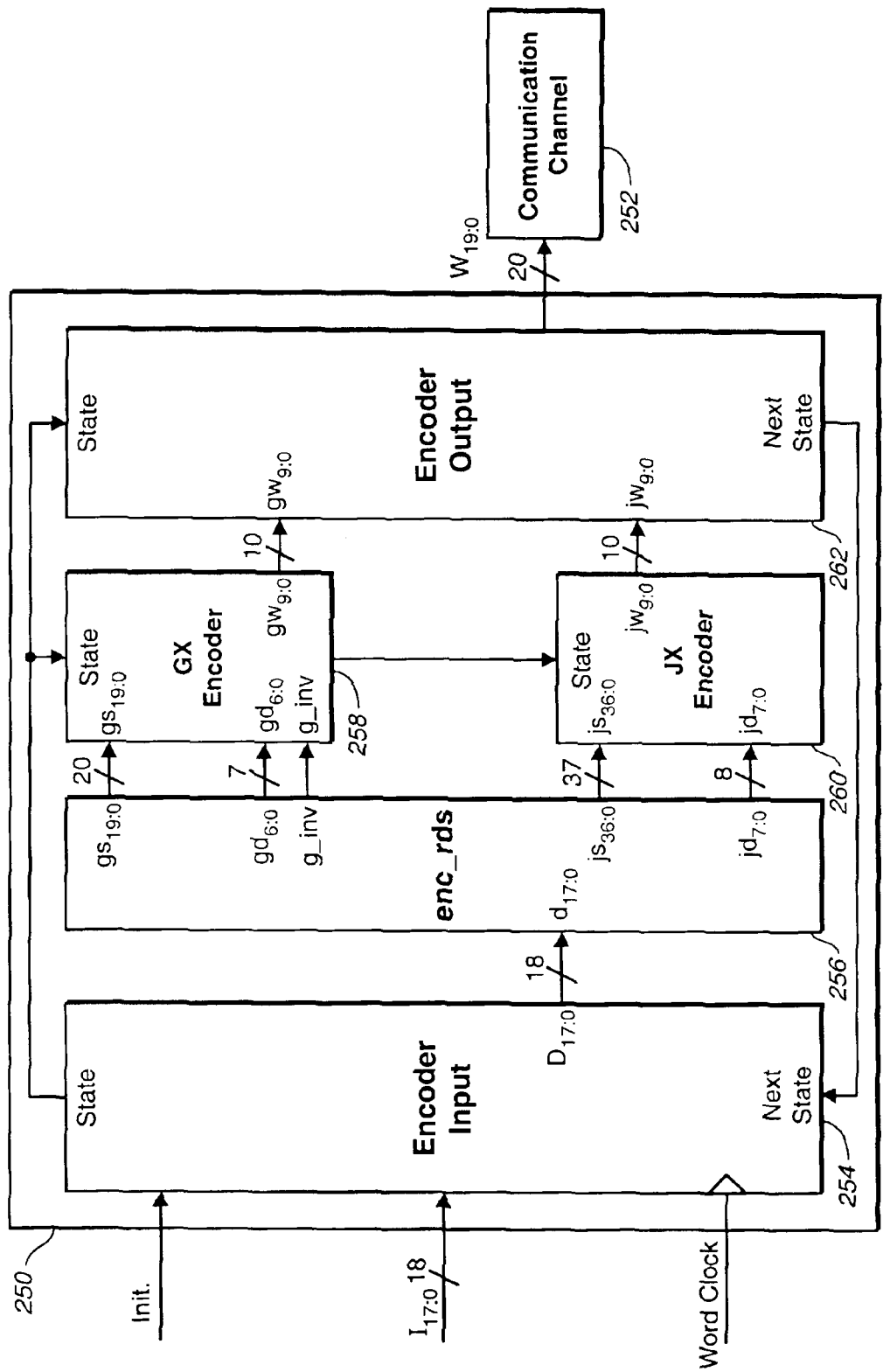
FIG._3

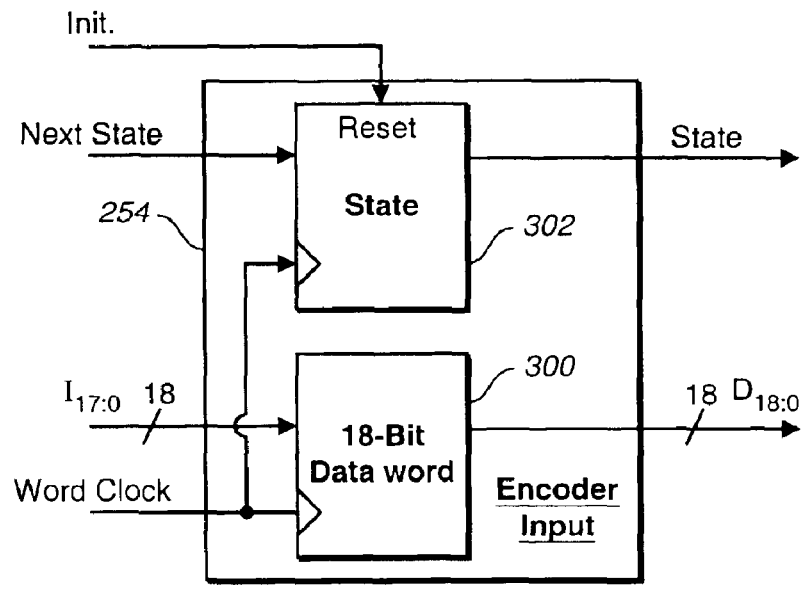
FIG._4
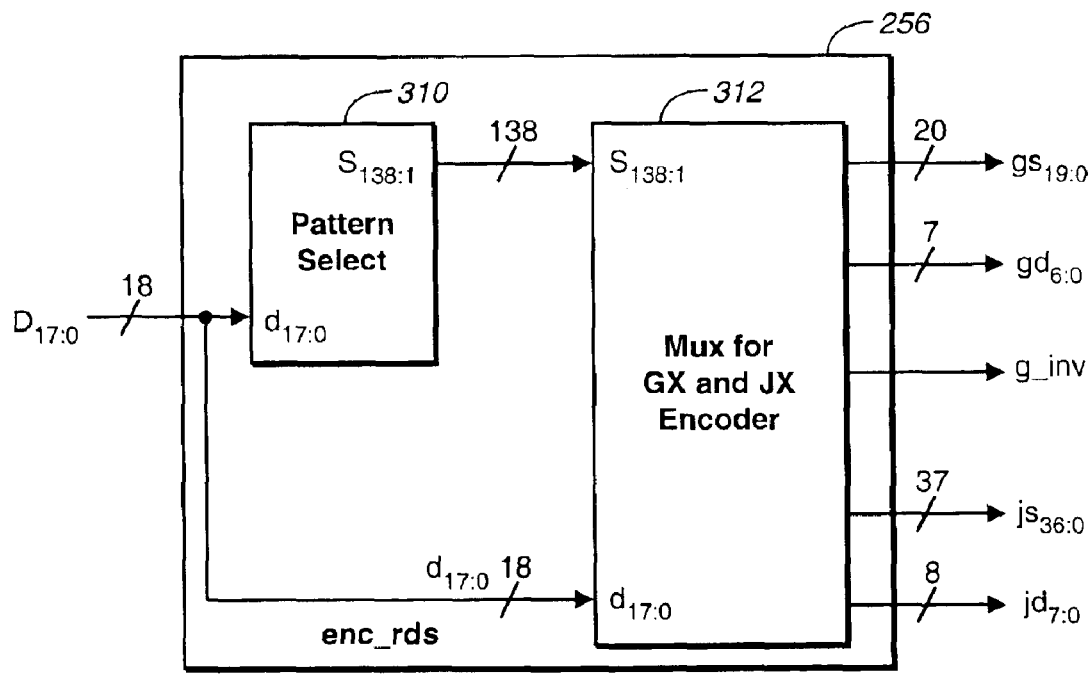
FIG._5

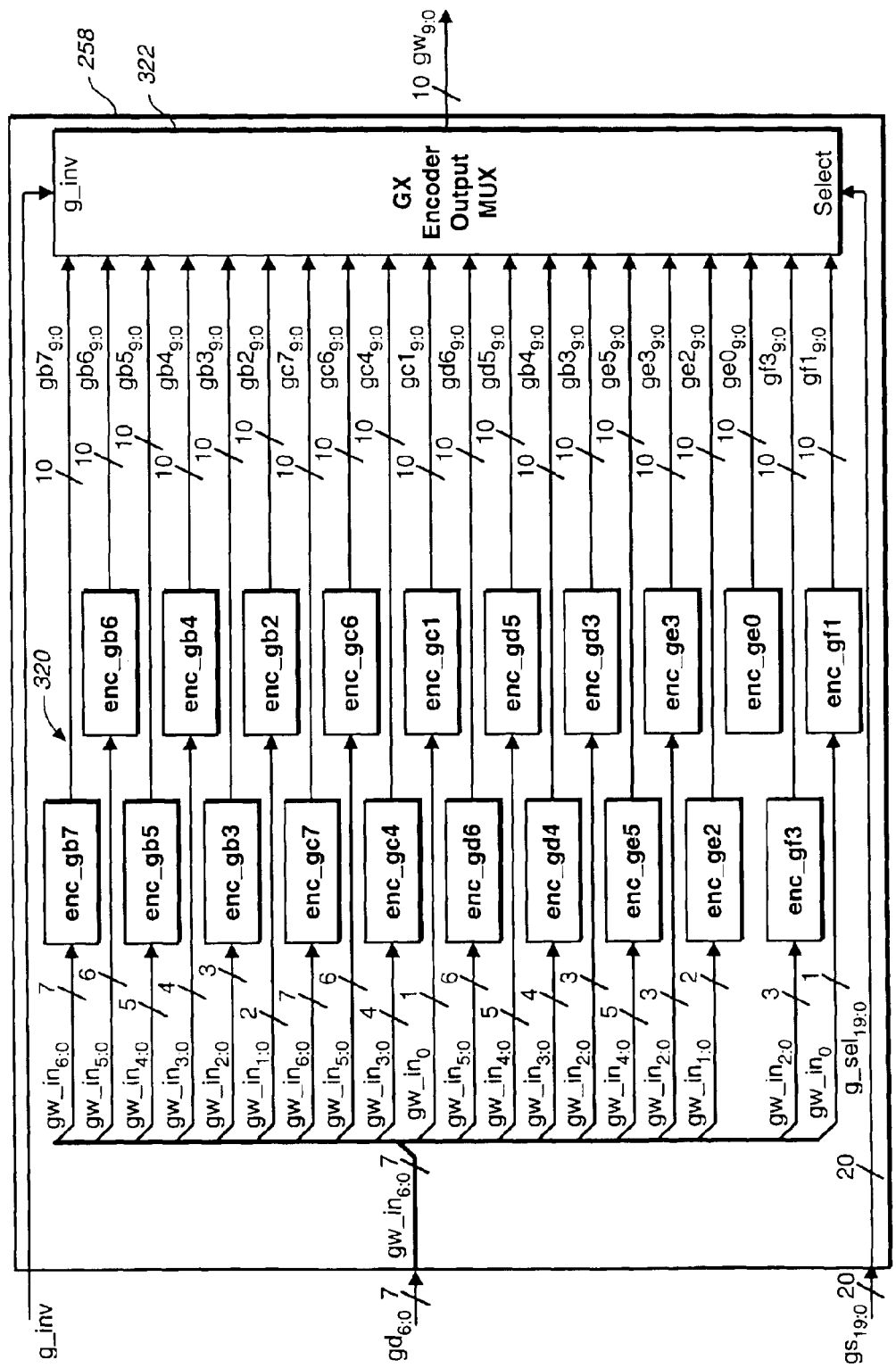
FIG._6

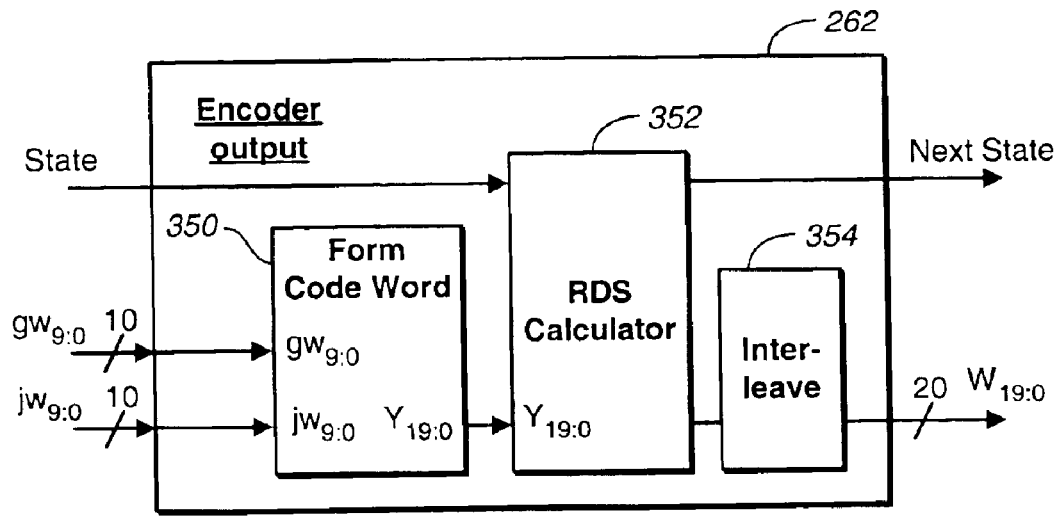
FIG._8
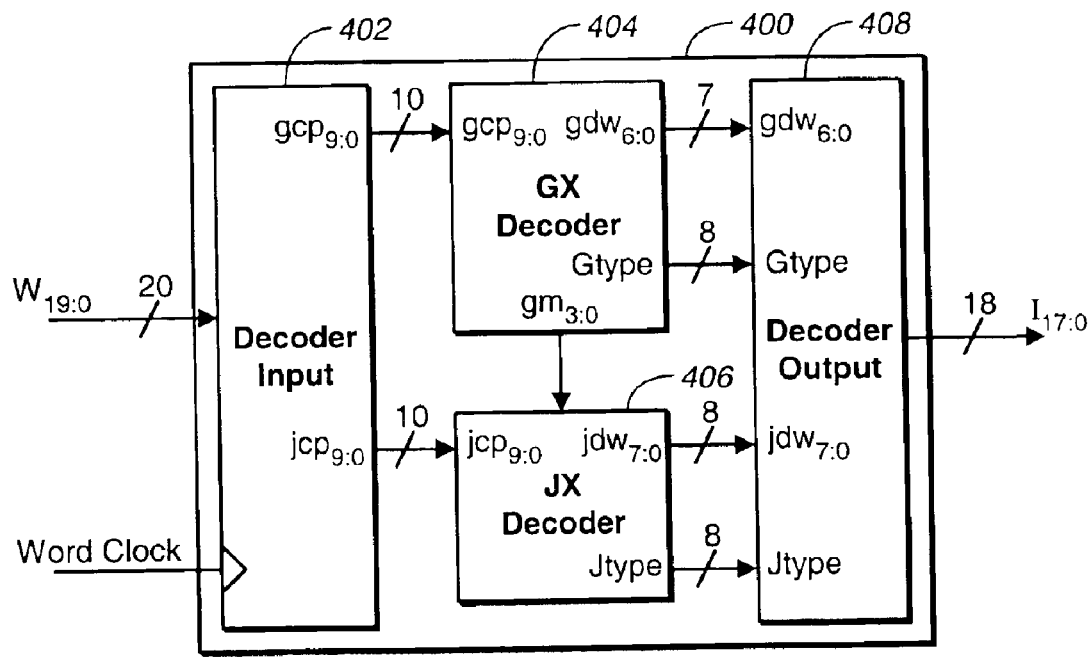
FIG._9

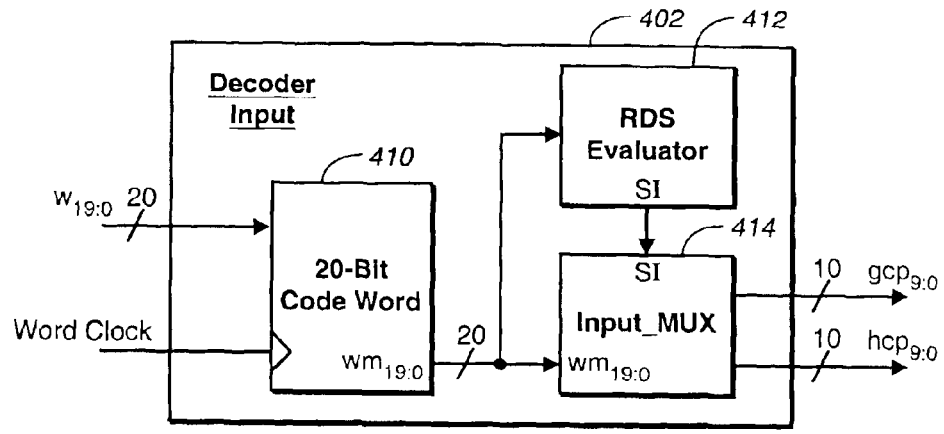
FIG._10
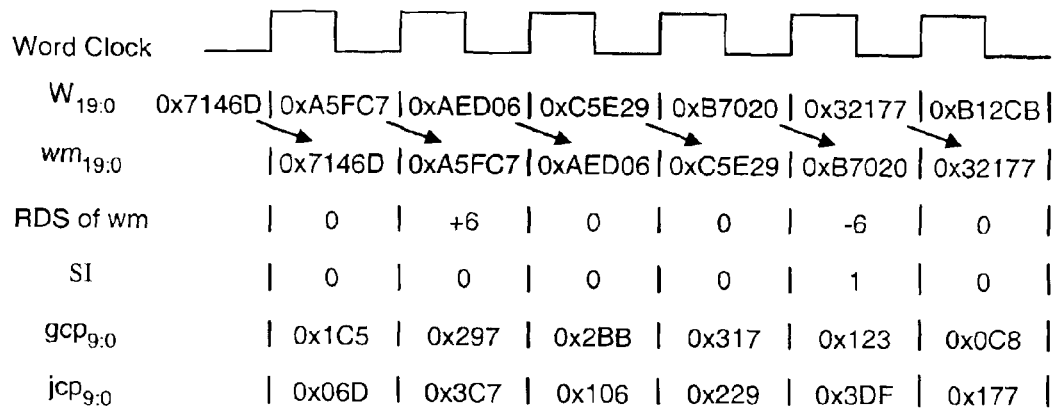
FIG._10A

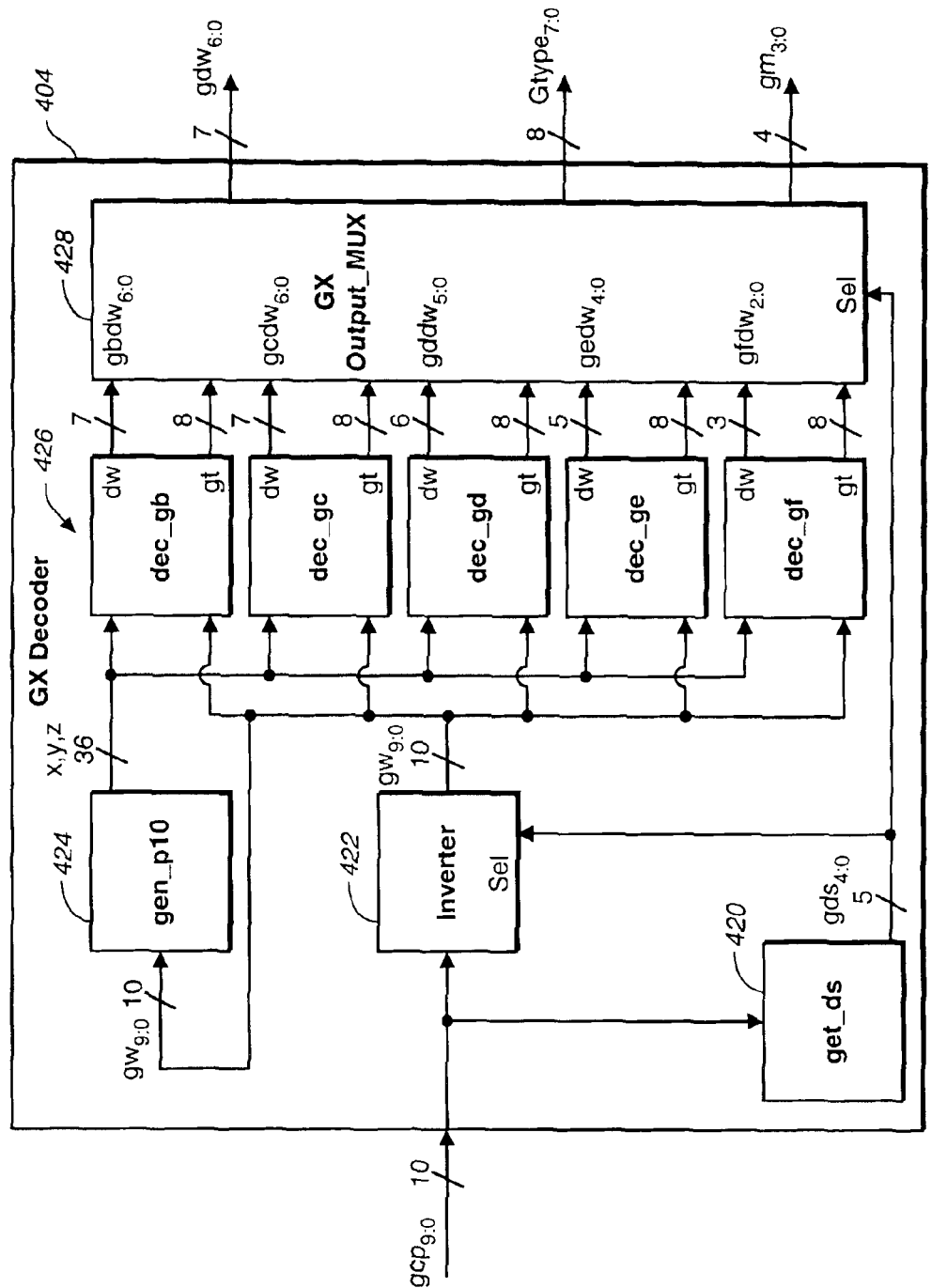
FIG._11

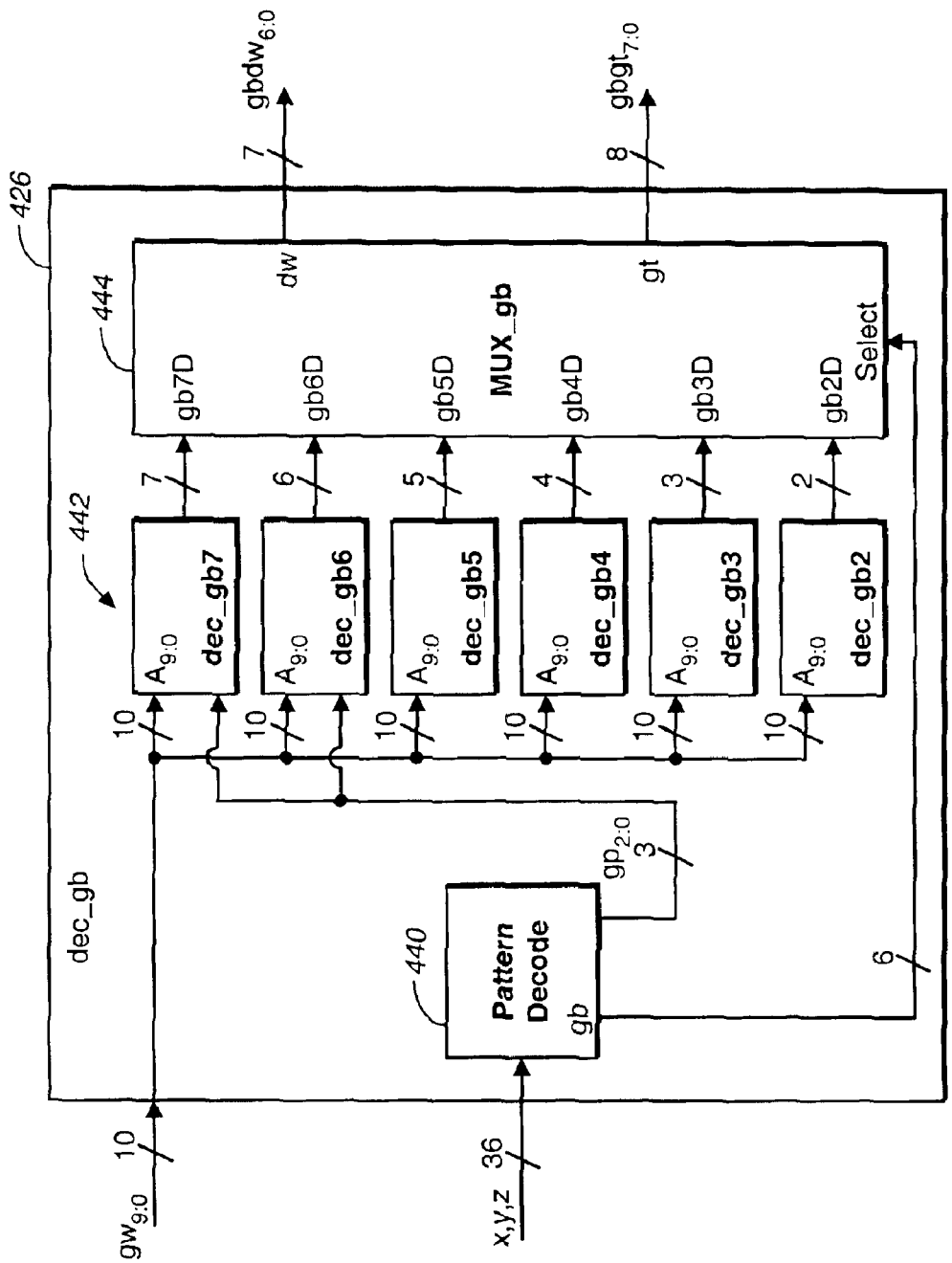
FIG._12

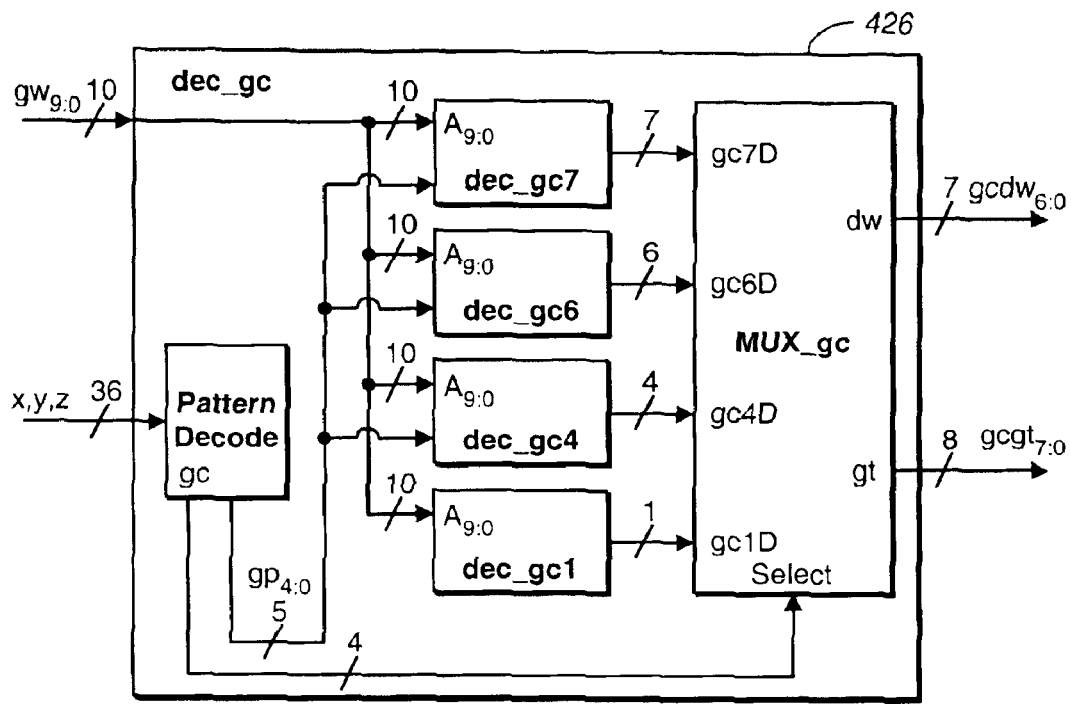
FIG._13
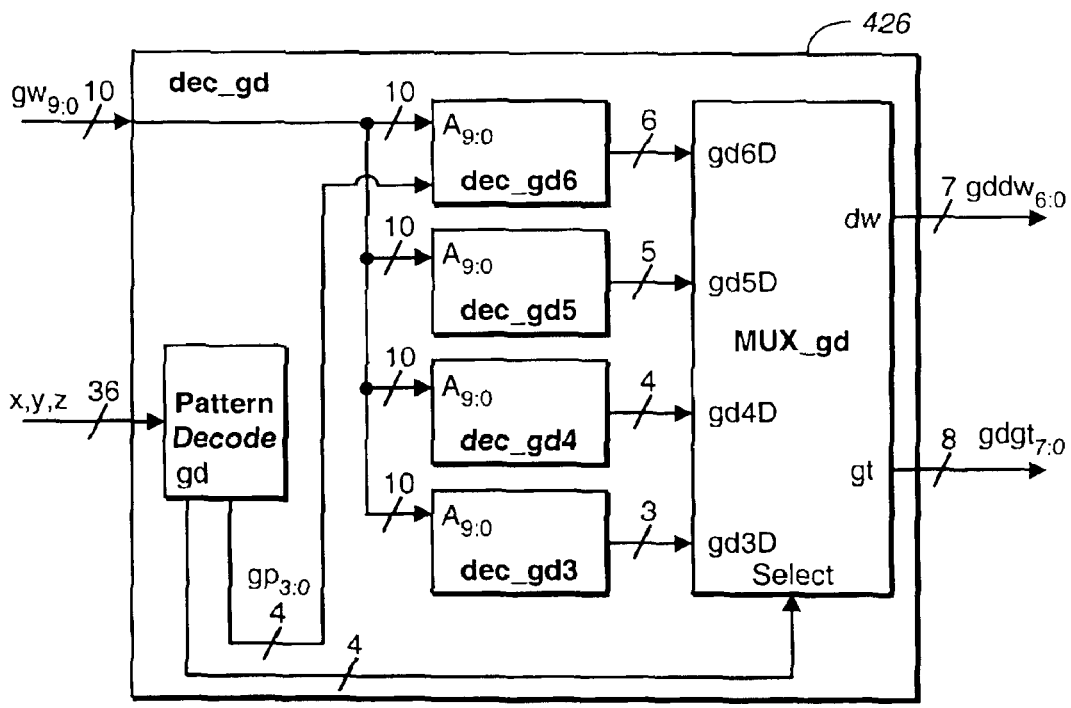
FIG._14

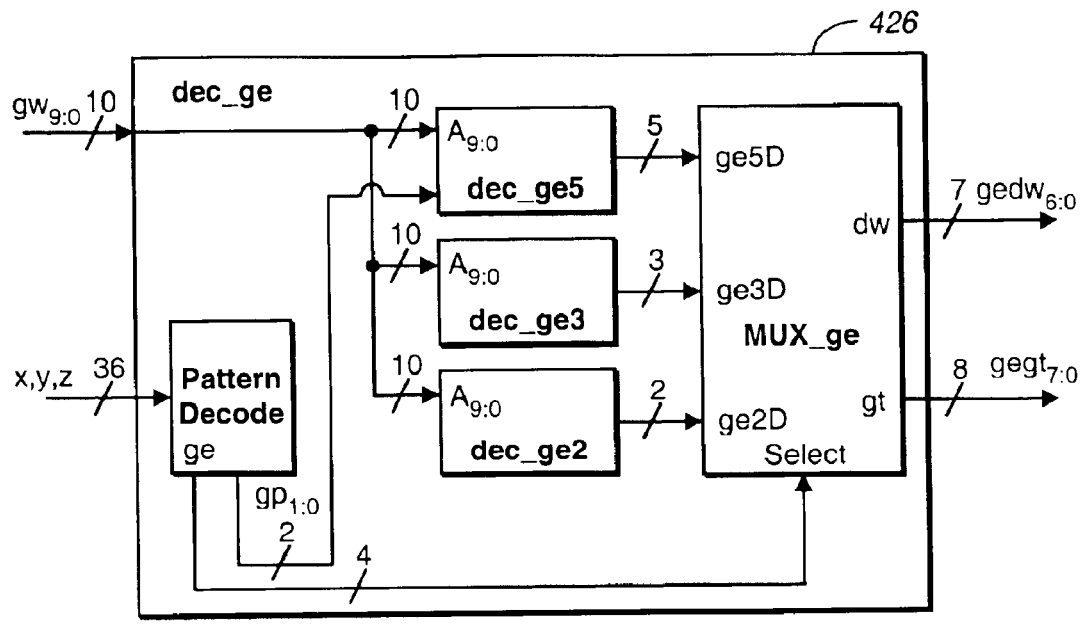
FIG._15
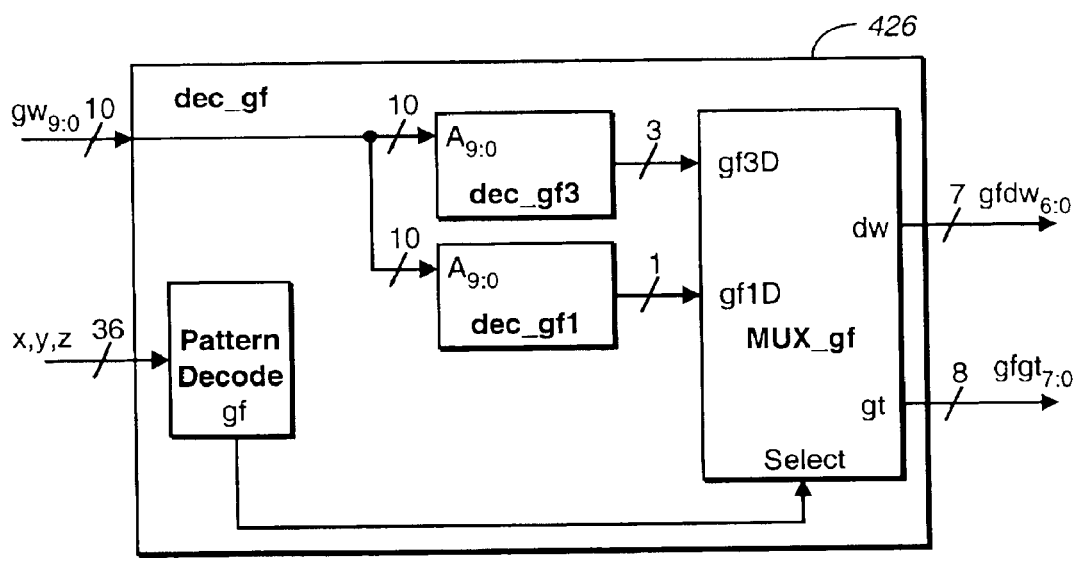
FIG._16

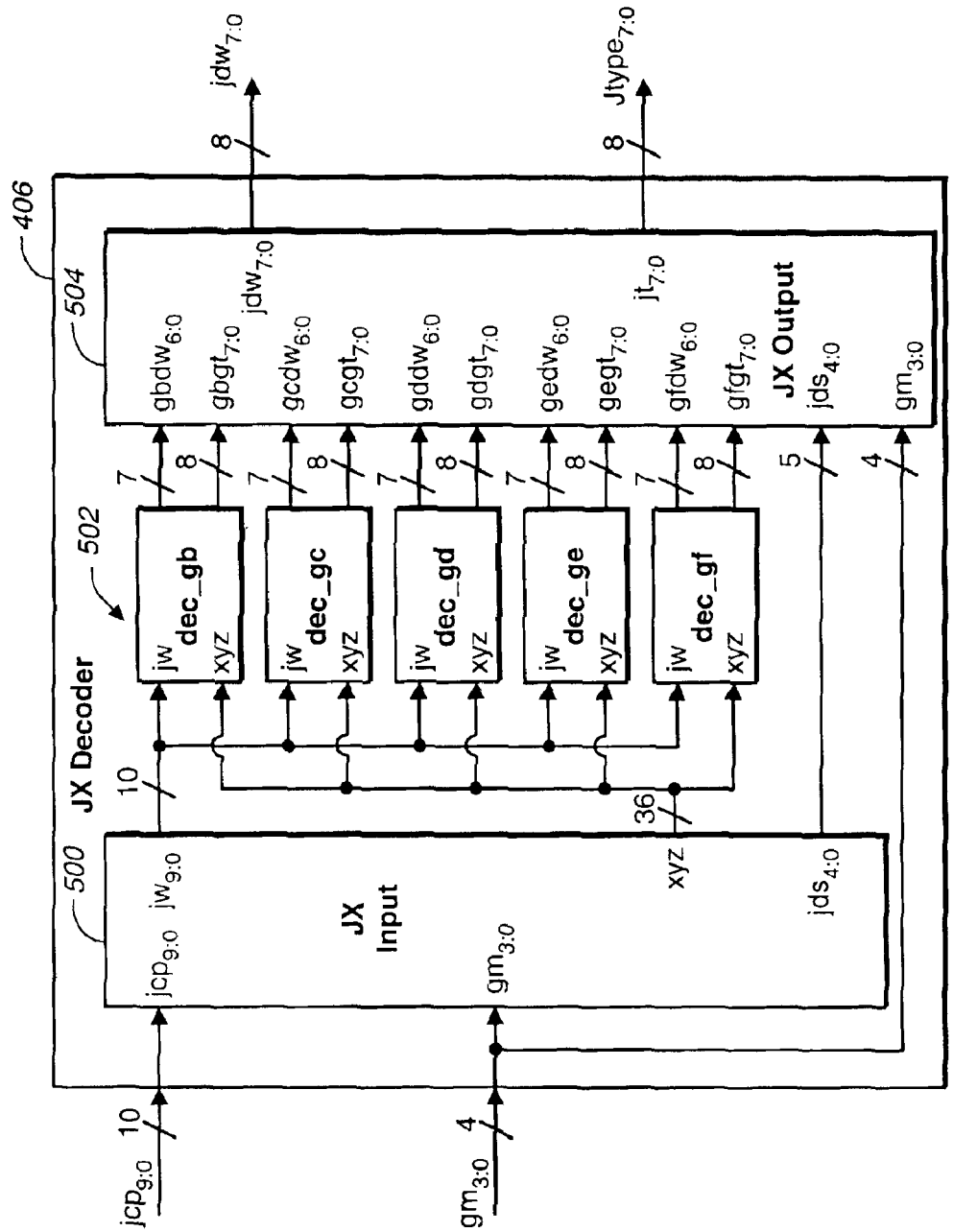
FIG._17

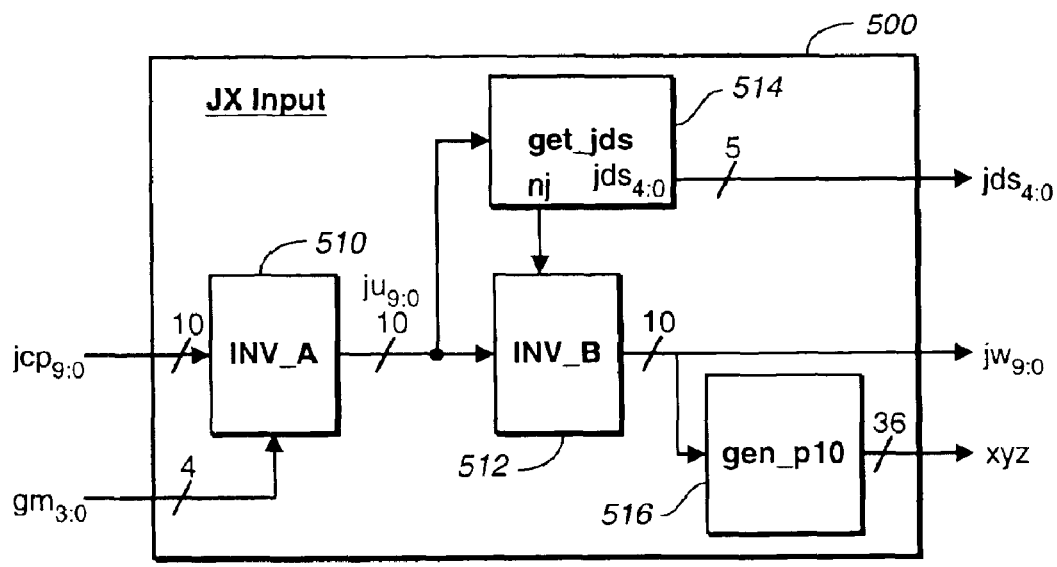
FIG._18
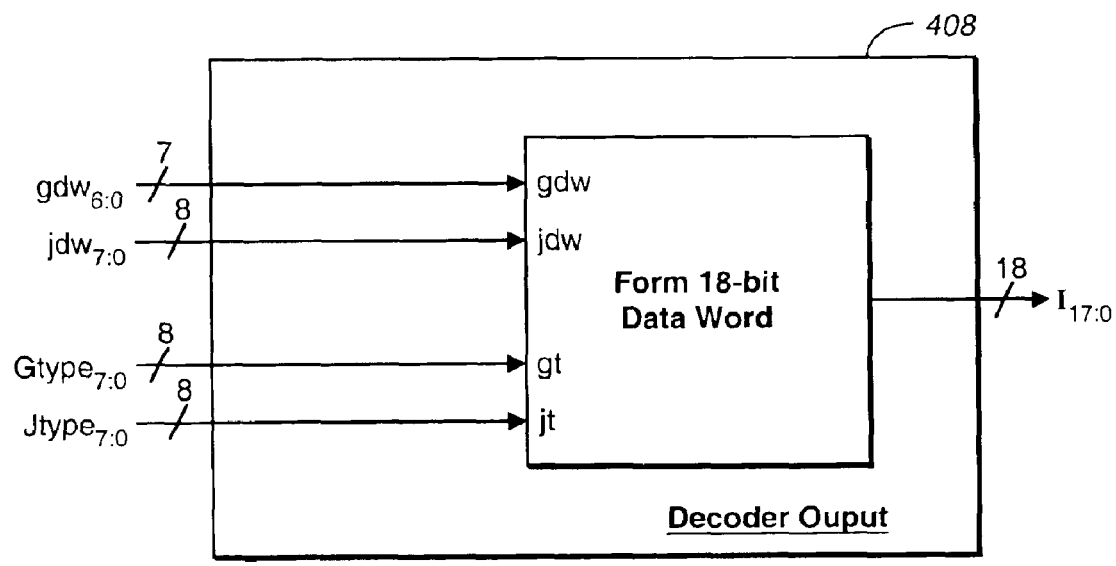
FIG._19

DC-FREE CODE DESIGN WITH INCREASED DISTANCE BETWEEN CODE WORDS

FIELD OF THE INVENTION

The present invention relates to communicating digital data through a communication channel. In particular, the present invention relates to encoding and decoding techniques for DC-free codes.

BACKGROUND OF THE INVENTION

In the field of digital communications, digital information is typically prepared for transmission through a channel by encoding it. The encoded data is then used to modulate a transmission to the channel. A transmission received from the channel is then typically demodulated and decoded to recover the original information.

The encoding of the digital data serves to improve communication performance so that the transmitted signals are less corrupted by noise, fading, or other interference associated with the channel. The term "channel" can include media such as transmission lines, wireless communication and information storage devices such as magnetic disc drives. In the case of information storage devices, the signal is stored in the channel for a period of time before it is accessed or received. Encoding can reduce the probability of noise being introduced into a recovered digital signal when the encoding is adapted to the known characteristics of the data and its interaction with known noise characteristics of a communication channel.

In typical encoding arrangements, data words of m data bits are encoded into larger code words of n code bits, and the ratio m/n is known as the code rate of the encoding arrangement. Decreasing the code rate reduces the complexity of the encoder/decoder and can also improve error correction capability, however, a decreased code rate also increases energy consumption and slows communication.

Further, it is often desirable for encoded channel sequences to have a spectral null at zero frequency. Such sequences are said to be DC-free and particularly found to enhance the performance in perpendicular magnetic recording. Given a sequence of binary digits, if each binary digit "1" is translated into a plus one (+1) and each binary digit "0" is translated into a minus one (−1), the sequence will be DC-free if a running digital sum of the bipolar sequence is bounded. The running digital sum is the sum of all values (+1 and −1) in a bipolar sequence. When the variation of the running digital sum is kept to a small value, the sequence is known to have a tight bound. A tighter bound can improve the performance of the channel.

There is a need to provide improved-DC free coding techniques that reduce the probability of noise being introduced to the system and have optimal code rates. Various embodiments of the present invention address these problems, and offer other advantages over the prior art.

SUMMARY OF THE INVENTION

One embodiment of the present invention is directed to a method of encoding digital information. According to the method, a sequence of successive data words are encoded into a sequence of successive code words according to a code, such that a running digital sum (RDS) of the sequence of successive code words is bounded and is constrained to predetermined, non-adjacent values at boundaries between the code words.

Another embodiment of the present invention is directed to an encoder for encoding digital information. The encoder encodes a sequence of successive data words into a sequence of successive code words according to a code, such that a running digital sum (RDS) of the sequence of successive code words is bounded and is constrained to predetermined, non-adjacent values at boundaries between the code words.

Another embodiment of the present invention is directed to a method of encoding digital information, wherein a sequence of successive data words are encoded into a sequence of successive code words such that a running digital sum (RDS) of the sequence of successive code words is bounded and is constrained at boundaries between the code words. At least some bits in each code word are interleaved with at least some bits in another, adjacent one of the code words in the sequence of successive code words.

Another embodiment of the present invention is directed to a method of decoding digital information, wherein a sequence of successive code words are decoded into a sequence of successive data words according to a code in which a running digital sum (RDS) of the sequence of successive code words is bounded and is constrained to predetermined, non-adjacent values at boundaries between the code words.

Other features and benefits that characterize embodiments of the present invention will be apparent upon reading the following detailed description and review of the associated drawings.

BRIEF DESCRIPTION OF THE DRAWINGS

FIG. 1 is an isometric view of a disc drive in which one embodiment of the present invention is useful.

FIG. 2 is a flow diagram of a method of encoding information according to one embodiment of the present invention.

FIG. 3 is a block diagram of an encoder for encoding information according to the method shown in FIG. 2.

FIG. 4 is a block diagram of an encoder input circuit of the encoder shown in FIG. 3.

FIG. 5 is a block diagram of a data fragment encoder circuit in the encoder shown in FIG. 3.

FIG. 6 is a block diagram of a "g" group encoder of the encoder shown in FIG. 3.

FIG. 8 is a block diagram of an encoder output circuit of the encoder shown in FIG. 3.

FIG. 9 is a block diagram of a decoder according to one embodiment of the present invention.

FIG. 10 is a block diagram of a decoder input circuit of the decoder shown in FIG. 9.

FIG. 10A is a waveform diagram illustrating an example operation of an input multiplexer in the decoder input circuit shown in FIG. 10.

FIG. 11 is a block diagram of a "g" group decoder in the decoder shown in FIG. 9.

FIG. 12 is a block diagram of a "gb" subgroup decoder in the "g" group decoder shown in FIG. 11.

FIG. 13 is a block diagram of a "gc" subgroup decoder in the "g" group decoder shown in FIG. 11.

FIG. 14 is a block diagram of a "gd" subgroup decoder in the "g" group decoder shown in FIG. 11.

FIG. 15 is a block diagram of a "ge" subgroup decoder in the "g" group decoder shown in FIG. 11.

FIG. 16 is a block diagram of a "gf" subgroup decoder in the "g" group decoder shown in FIG. 11.

FIG. 17 is a block diagram of a "j" group decoder in the decoder shown in FIG. 9.

FIG. 18 is a block diagram of a "j" group input circuit in the "j" group decoder shown in FIG. 17.

FIG. 19 is a block diagram of a decoder output circuit in the decoder shown in FIG. 9.

DETAILED DESCRIPTION OF ILLUSTRATIVE EMBODIMENTS

Figure 7:
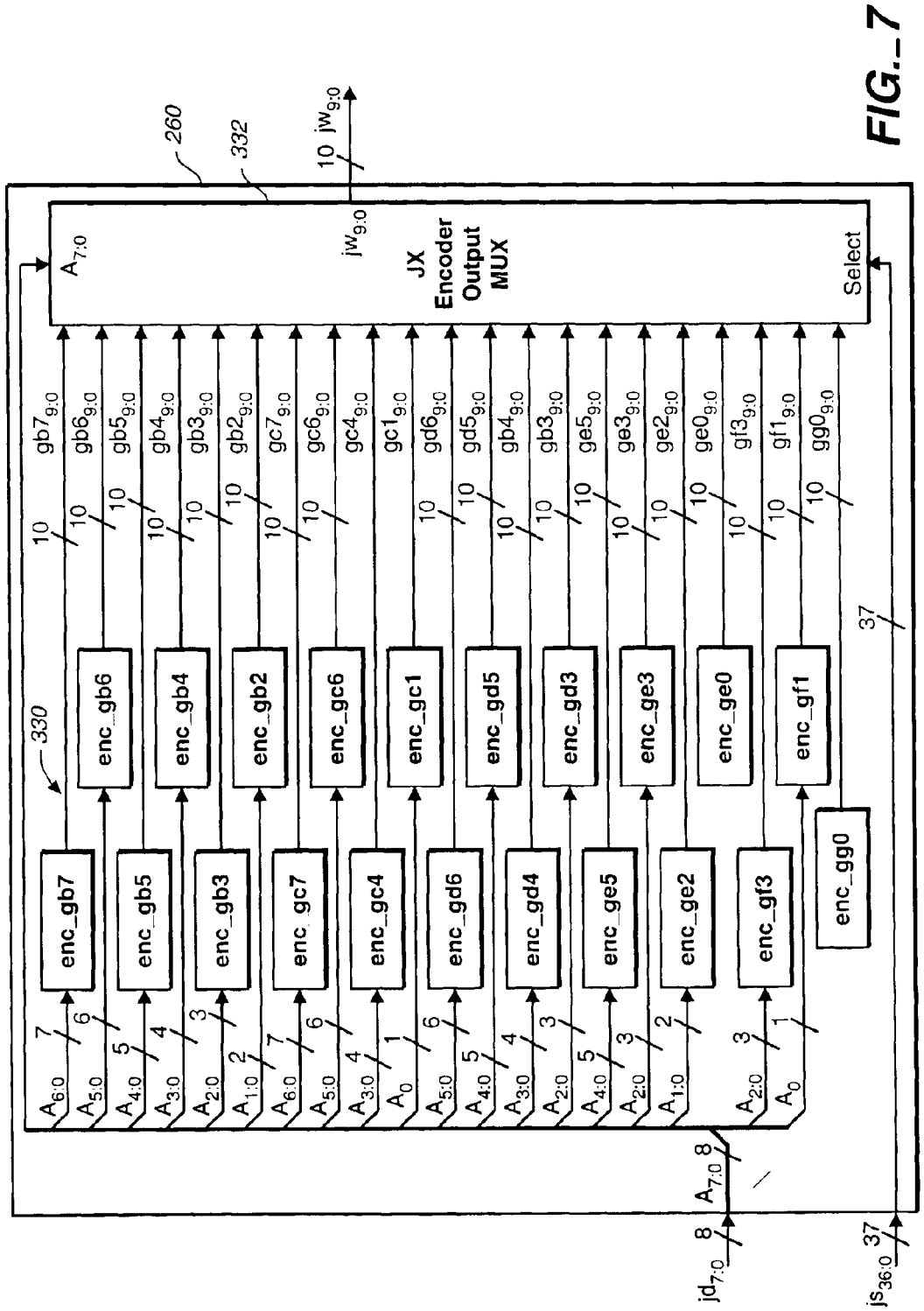
FIG. 7 is a block diagram of a "j" group encoder of the encoder shown in FIG. 3.

Embodiments of the present invention relate to a DC-free code for use in encoding and decoding digital data for transmission through communication channels. In one embodiment of the present invention, a method of encoding is provided, which encodes an unconstrained user data sequence into a DC-free code sequence in which the running digital sum of the code sequence is bounded. In addition to the DC-free property, the encoder constrains the code words in the code sequence such that the cumulative running digital sum in the sequence is restricted to predetermined, non-adjacent values at boundaries between the code words. This kind of restriction increases the minimum Euclidean distance between the code words. In addition, bit streams of such codes words are interleaved with one another to further increase the distances between the code words, thereby allowing many error events that can occur in the channel to be detected.

FIG. 1 is a perspective view of a magnetic disc drive 100, which forms a communications channel in which one embodiment of the present invention is useful. Disc drive 100 communicates with a host system 101 and includes a housing with a base 102 and a top cover (not shown). Disc drive 100 further includes a disc pack 106, which is mounted on a spindle motor (not shown), by a disc clamp 108. Disc pack 106 includes a plurality of individual discs, which are mounted for co-rotation about central axis 109. Each disc surface has an associated head, which is mounted to disc drive 100 for communication with the disc surface. In the example shown in FIG. 1, heads 110 are supported by suspensions 112 which are in turn attached to track accessing arms 114 of an actuator 116. The actuator shown in FIG. 1 is of the type known as a rotary moving coil actuator and includes a voice coil motor (VCM), shown generally at 118. Voice coil motor 118 rotates actuator 116 with its attached heads 110 about a pivot shaft 120 to position heads 110 over a desired data track along an arcuate patch 122 between a disc inner diameter 124 and a disc outer diameter 126. Voice coil motor 118 operates under control of internal circuitry 128.

The heads 110 and rotating disc pack 106 define a communications channel that can receive digital data and reproduce the digital data at a later time. Write circuitry within internal circuitry 128 receives unconstrained user data, typically from a digital computer, and then encodes the data into successive code words according to a selected code. The encoded data is then used to modulate a write current provided to a write transducer in the head 110. The write transducer causes the modulated code words to be encoded on a magnetic layer in disc pack 106. At a later time, a read transducer in the head 110 recovers the successive modulated code words from the magnetic layer as a serial modulated read signal. Read circuitry within internal circuitry 128 demodulates the read signal into successive parallel code words. The demodulated code words are then decoded by decoder circuitry within circuitry 128, which recovers the original user data for use by host system 101.

According to one embodiment of the present invention, each 18-bit word of the unconstrained user data is encoded into a 20-bit code word. This results in a code rate of 18/20. Other code rates can also be used in alternative embodiments of the present invention. In order to generate each 20-bit code word, the corresponding 18-bit user data word is broken down into smaller fragments. The fragments are rearranged and mapped into two 10-bit code word segments according to a lookup table and a mapping table. In one embodiment, the code selects the 10-bit code words such that the cumulative running digital sum of the resulting sequence of 20-bit code words is constrained to the values of 0 or 6 at the boundary of each 20-bit code word. The resulting 20-bit code words are then interleaved to various degrees to further increase the distance between the code words. As the modulated code words are read from the channel, the decoder applies the same coding rules as were used by the encoder, but in reverse order to render the original sequence of user data bits.

FIG. 2 illustrates a flow diagram of a method 200 of encoding information according to one embodiment of the present invention. According to method 200, an 18-bit data word is received at step 202. At step 204, method 200 accesses a current state value that has been calculated after each preceding code word is generated. In one example, the current state corresponds to the current, cumulative running digital sum of the sequence of code words as calculated at the end of the preceding code word in the sequence. For the first code word, the initial state is reset to zero. Depending on the current state, the 18-bit data word is broken up into three fragments according to a lookup table at step 206, which is discussed in more detail below. Next, at step 208, a 'g' group and a 'j' group are selected based on the first fragment determined in step 206. These groups are chosen in order to maintain the running digital sum at the end of the current code word at either 0 or 6. Once the respective groups are obtained, the second fragment is mapped into a 'g' group 10-bit segment at step 210. The mapping is performed according to a mapping table as discussed below. In step 212, the third fragment is mapped into a 'j' group 10-bit segment according to a mapping table. The 'g' group and 'j' group segments are then combined, at step 214, to form a 20-bit code word that constrains the running digital sum at the boundaries of the code words in the sequence at 0 or 6. At step 216, at least some of the bits in each 20-bit code word are interleaved with at least some of the bits in one or more adjacent 20-bit code words in the sequence. The code word is output, for example to a disc, at step 218.

The following description is divided into two sections. Section I is a general description of the design of a 18/20-rate DC-free code with RDS=0 or 6 at the code word boundaries. The description includes a process of how to simplify the coding procedure and choose the code word mappings that are used in steps 210 and 212 in FIG. 2. An example of encoding a data word into a code word is illustrated at the end of this section. Section II provides a description of an implementation of an encoder and decoder. Block diagrams are included to illustrate the data flow in a hardware setting. The function of each block is described by logical equations. The block descriptions are similar to a VHDL format with input and output signals listed. However, the logical equations describing the signals are similar to a C language program. Hence, they should be applied in sequence as they are listed.

I. Procedure of Code Construction

For user data words having 18 bits, there are $2^{18}$ possible data patterns to be encoded. Since $2^{18}$ is a large number exceeding a quarter of a million, it is very difficult to design an encoder by direct mapping. To simplify the design of a rate 18/20 DC-free code, the first step is to break the 20-bit code words into two segments of 10 bits each. A 10-bit pattern may have an RDS of −10, −8, −6, −4, −2, 0, 2, 4, 6, 8 or 10. Since the negative and positive RDS patterns are just the inverse of each other, the following description will focus on the positive RDS patterns, which can be selectively inverted as needed to obtain the negative RDS patterns. The 10-bit positive RDS patterns can be grouped together according to their respective running digital sums. Table 1 shows a plurality of "g" groups, labeled "gb" to "gg", wherein the patterns in each group have the same RDS. The patterns in each group are expressed in hexadecimal form, with the most significant hexadecimal symbol representing only two binary bits.

TABLE 1

Group gb:
There are 252 10-bit patterns with RDS = 0

| | | | | | | | | | | | | | | |
|---|---|---|---|---|---|---|---|---|---|---|---|---|---|---|
| 01F | 02F | 037 | 03B | 03D | 03E | 04F | 057 | 05B | 05D | 05E | 067 | 06B | 06D | 06E | 073 |
| 075 | 076 | 079 | 07A | 07C | 08F | 097 | 09B | 09D | 09E | 0A7 | 0AB | 0AD | 0AE | 0B3 | 0B5 |
| 0B6 | 0B9 | 0BA | 0BC | 0C7 | 0CB | 0CD | 0CE | 0D3 | 0D5 | 0D6 | 0D9 | 0DA | 0DC | 0E3 | 0E5 |
| 0E6 | 0E9 | 0EA | 0EC | 0F1 | 0F2 | 0F4 | 0F8 | 10F | 117 | 11B | 11D | 11E | 127 | 12B | 12D |
| 12E | 133 | 135 | 136 | 139 | 13A | 13C | 147 | 14B | 14D | 14E | 153 | 155 | 156 | 159 | 15A |
| 15C | 163 | 165 | 166 | 169 | 16A | 16C | 171 | 172 | 174 | 178 | 187 | 18B | 18D | 18E | 193 |
| 195 | 196 | 199 | 19A | 19C | 1A3 | 1A5 | 1A6 | 1A9 | 1AA | 1AC | 1B1 | 1B2 | 1B4 | 1B8 | 1C3 |
| 1C5 | 1C6 | 1C9 | 1CA | 1CC | 1D1 | 1D2 | 1D4 | 1D8 | 1E1 | 1E2 | 1E4 | 1E8 | 1F0 | 20F | 217 |
| 21B | 21D | 21E | 227 | 22B | 22D | 22E | 233 | 235 | 236 | 239 | 23A | 23C | 247 | 24B | 24D |
| 24E | 253 | 255 | 256 | 259 | 25A | 25C | 263 | 265 | 266 | 269 | 26A | 26C | 271 | 272 | 274 |
| 278 | 287 | 28B | 28D | 28E | 293 | 295 | 296 | 299 | 29A | 29C | 2A3 | 2A5 | 2A6 | 2A9 | 2AA |
| 2AC | 2B1 | 2B2 | 2B4 | 2B8 | 2C3 | 2C5 | 2C6 | 2C9 | 2CA | 2CC | 2D1 | 2D2 | 2D4 | 2D8 | 2E1 |
| 2E2 | 2E4 | 2E8 | 2F0 | 307 | 30B | 30D | 30E | 313 | 315 | 316 | 319 | 31A | 31C | 323 | 325 |
| 326 | 329 | 32A | 32C | 331 | 332 | 334 | 338 | 343 | 345 | 346 | 349 | 34A | 34C | 351 | 352 |
| 354 | 358 | 361 | 362 | 364 | 368 | 370 | 383 | 385 | 386 | 389 | 38A | 38C | 391 | 392 | 394 |
| 398 | 3A1 | 3A2 | 3A4 | 3A8 | 3B0 | 3C1 | 3C2 | 3C4 | 3C8 | 3D0 | 3E0 | | | | |

Group gc:
There are 210 10-bit patterns with RDS = +2

| | | | | | | | | | | | | | | |
|---|---|---|---|---|---|---|---|---|---|---|---|---|---|---|
| 03F | 05F | 06F | 077 | 07B | 07D | 07E | 09F | 0AF | 0B7 | 0BB | 0BD | 0BE | 0CF | 0D7 | 0DB |
| 0DD | 0DE | 0E7 | 0EB | 0ED | 0EE | 0F3 | 0F5 | 0F6 | 0F9 | 0FA | 0FC | 11F | 12F | 137 | 13B |
| 13D | 13E | 14F | 157 | 15B | 15D | 15E | 167 | 16B | 16D | 16E | 173 | 175 | 176 | 179 | 17A |
| 17C | 18F | 197 | 19B | 19D | 19E | 1A7 | 1AB | 1AD | 1AE | 1B3 | 1B5 | 1B6 | 1B9 | 1BA | 1BC |
| 1C7 | 1CB | 1CD | 1CE | 1D3 | 1D5 | 1D6 | 1D9 | 1DA | 1DC | 1E3 | 1E5 | 1E6 | 1E9 | 1EA | 1EC |
| 1F1 | 1F2 | 1F4 | 1F8 | 21F | 22F | 237 | 23B | 23D | 23E | 24F | 257 | 25B | 25D | 25E | 267 |
| 26B | 26D | 26E | 273 | 275 | 276 | 279 | 27A | 27C | 28F | 297 | 29B | 29D | 29E | 2A7 | 2AB |
| 2AD | 2AE | 2B3 | 2B5 | 2B6 | 2B9 | 2BA | 2BC | 2C7 | 2CB | 2CD | 2CE | 2D3 | 2D5 | 2D6 | 2D9 |
| 2DA | 2DC | 2E3 | 2E5 | 2E6 | 2E9 | 2EA | 2EC | 2F1 | 2F2 | 2F4 | 2F8 | 30F | 317 | 31B | 31D |
| 31E | 327 | 32B | 32D | 32E | 333 | 335 | 336 | 339 | 33A | 33C | 347 | 34B | 34D | 34E | 353 |
| 355 | 356 | 359 | 35A | 35C | 363 | 365 | 366 | 369 | 36A | 36C | 371 | 372 | 374 | 378 | 387 |
| 38B | 38D | 38E | 393 | 395 | 396 | 399 | 39A | 39C | 3A3 | 3A5 | 3A6 | 3A9 | 3AA | 3AC | 3B1 |
| 3B2 | 3B4 | 3B8 | 3C3 | 3C5 | 3C6 | 3C9 | 3CA | 3CC | 3D1 | 3D2 | 3D4 | 3D8 | 3E1 | 3E2 | 3E4 |
| 3E8 | 3F0 | | | | | | | | | | | | | | |

Group gd:
There are 120 10-bit patterns with RDS = +4

| | | | | | | | | | | | | | | |
|---|---|---|---|---|---|---|---|---|---|---|---|---|---|---|
| 07F | 0BF | 0DF | 0EF | 0F7 | 0FB | 0FD | 0FE | 13F | 15F | 16F | 177 | 17B | 17D | 17E | 19F |
| 1AF | 1B7 | 1BB | 1BD | 1BE | 1CF | 1D7 | 1DB | 1DD | 1DE | 1E7 | 1EB | 1ED | 1EE | 1F3 | 1F5 |
| 1F6 | 1F9 | 1FA | 1FC | 23F | 25F | 26F | 277 | 27B | 27D | 27E | 29F | 2AF | 2B7 | 2BB | 2BD |
| 2BE | 2CF | 2D7 | 2DB | 2DD | 2DE | 2E7 | 2EB | 2ED | 2EE | 2F3 | 2F5 | 2F6 | 2F9 | 2FA | 2FC |
| 31F | 32F | 337 | 33B | 33D | 33E | 34F | 357 | 35B | 35D | 35E | 367 | 36B | 36D | 36E | 373 |
| 375 | 376 | 379 | 37A | 37C | 38F | 397 | 39B | 39D | 39E | 3A7 | 3AB | 3AD | 3AE | 3B3 | 3B5 |
| 3B6 | 3B9 | 3BA | 3BC | 3C7 | 3CB | 3CD | 3CE | 3D3 | 3D5 | 3D6 | 3D9 | 3DA | 3DC | 3E3 | 3E5 |
| 3E6 | 3E9 | 3EA | 3EC | 3F1 | 3F2 | 3F4 | 3F8 | | | | | | | | |

Group ge:
There are 45 10-bit patterns with RDS = +6

| | | | | | | | | | | | | | | |
|---|---|---|---|---|---|---|---|---|---|---|---|---|---|---|
| 0FF | 17F | 1BF | 1DF | 1EF | 1F7 | 1FB | 1FD | 1FE | 27F | 2BF | 2DF | 2EF | 2F7 | 2FB | 2FD |
| 2FE | 33F | 35F | 36F | 377 | 37B | 37D | 37E | 39F | 3AF | 3B7 | 3BB | 3BD | 3BE | 3CF | 3D7 |
| 3DB | 3DD | 3DE | 3E7 | 3EB | 3ED | 3EE | 3F3 | 3F5 | 3F6 | 3F9 | 3FA | 3FC | | | |

Group gf:
There are 10 10-bit patterns with RDS = +8

| | | | | | | | | |
|---|---|---|---|---|---|---|---|---|
| 1FF | 2FF | 37F | 3BF | 3DF | 3EF | 3F7 | 3FB | 3FD | 3FE |

Group gg:
There is only 1 10-bit pattern with RDS = +10

| |
|---|
| 3FF |

Each of the groups in Table 1 is further divided into subgroups, where the number of patterns in each subgroup (i.e., the subgroup size) is a power of two. This allows groups of m-bit fragments of user data words to be mapped into code words from a subgroup of size $2^m$. The sizes of the second and third fragments of the user data words are determined by the first user data word fragment in step 206 according to look-up Table 4, which is discussed in more detail below.

Group gb is divided into subgroups gb7, gb6, gb5 gb4 gb3 and gb2 with sizes of $128=2^7$, $64=2^6$, $32=2^5$, $16=2^4$, $8=2^3$ and $4=2^2$, respectively.

Group gc is divided into subgroups gc7, gc6, gc4 and gc1 with sizes of $128=2^7$, $64=2^6$, $16=2^4$ and $2=2^1$, respectively.

Group gd is divided into subgroups gd6, gd5, gd4 and gd3 with sizes of $64=2^6$, $32=2^5$, $16=2^4$ and $8=2^3$, respectively.

Group ge is divided into subgroups ge5, ge3, ge2 and ge0 with sizes of $32=2^5$, $8=2^3$, $4=2^2$ and $1=2^0$, respectively.

Group gf is divided into subgroups gf3 and gf1 with sizes of $8=2^3$ and $2=2^1$, respectively.

Group gg has only one subgroup gg0 with a size of $1=2^0$.

Table 2 lists the mapping of each subgroup. The format of the list is "xxx:yyy", which means that data word fragment "xxx" is to be mapped into 10-bit code word "yyy". Both "xxx" and "yyy" are expressed in hexadecimal form. Table two is used to map the second fragment of the user data word into a corresponding 10-bit code word segment.

TABLE 2

Subgroup gb7: (mapping of 7-bit data word into 10-bit code word)

| | | | | | | | |
|---|---|---|---|---|---|---|---|
| 000:21B | 001:233 | 002:235 | 003:236 | 004:22B | 005:239 | 006:23A | 007:23C |
| 008:24B | 009:253 | 00A:255 | 00B:256 | 00C:28B | 00D:259 | 00E:25A | 00F:25C |
| 010:21D | 011:263 | 012:265 | 013:266 | 014:22D | 015:269 | 016:26A | 017:26C |
| 018:24D | 019:293 | 01A:295 | 01B:296 | 01C:28D | 01D:299 | 01E:29A | 01F:29C |
| 020:21E | 021:2A3 | 022:2A5 | 023:2A6 | 024:22E | 025:2A9 | 026:2AA | 027:2AC |
| 028:24E | 029:2C3 | 02A:2C5 | 02B:2C6 | 02C:28E | 02D:2C9 | 02E:2CA | 02F:2CC |
| 030:271 | 031:2B1 | 032:2D1 | 033:2E1 | 034:272 | 035:2B2 | 036:2D2 | 037:2E2 |
| 038:274 | 039:2B4 | 03A:2D4 | 03B:2E4 | 03C:278 | 03D:2B8 | 03E:2D8 | 03F:2E8 |
| 040:11B | 041:133 | 042:135 | 043:136 | 044:12B | 045:139 | 046:13A | 047:13C |
| 048:14B | 049:153 | 04A:155 | 04B:156 | 04C:18B | 04D:159 | 04E:15A | 04F:15C |
| 050:11D | 051:163 | 052:165 | 053:166 | 054:12D | 055:169 | 056:16A | 057:16C |
| 058:14D | 059:193 | 05A:195 | 05B:196 | 05C:18D | 05D:199 | 05E:19A | 05F:19C |
| 060:11E | 061:1A3 | 062:1A5 | 063:1A6 | 064:12E | 065:1A9 | 066:1AA | 067:1AC |
| 068:14E | 069:1C3 | 06A:1C5 | 06B:1C6 | 06C:18E | 06D:1C9 | 06E:1CA | 06F:1CC |
| 070:171 | 071:1B1 | 072:1D1 | 073:1E1 | 074:172 | 075:1B2 | 076:1D2 | 077:1E2 |
| 078:174 | 079:1B4 | 07A:1D4 | 07B:1E4 | 07C:178 | 07D:1B8 | 07E:1D8 | 07F:1E8 |

Subgroup gb6: (mapping of 6-bit data word into 10-bit code word)

| | | | | | | | |
|---|---|---|---|---|---|---|---|
| 000:331 | 001:313 | 002:315 | 003:316 | 004:332 | 005:319 | 006:31A | 007:31C |
| 008:334 | 009:323 | 00A:325 | 00B:326 | 00C:338 | 00D:329 | 00E:32A | 00F:32C |
| 010:3C1 | 011:343 | 012:345 | 013:346 | 014:3C2 | 015:349 | 016:34A | 017:34C |
| 018:3C4 | 019:383 | 01A:385 | 01B:386 | 01C:3C8 | 01D:389 | 01E:38A | 01F:38C |
| 020:0CE | 021:0EC | 022:0EA | 023:0E9 | 024:0CD | 025:0E6 | 026:0E5 | 027:0E3 |
| 028:0CB | 029:0DC | 02A:0DA | 02B:0D9 | 02C:0C7 | 02D:0D6 | 02E:0D5 | 02F:0D3 |
| 030:03E | 031:0BC | 032:0BA | 033:0B9 | 034:03D | 035:0B6 | 036:0B5 | 037:0B3 |
| 038:03B | 039:07C | 03A:07A | 03B:079 | 03C:037 | 03D:076 | 03E:075 | 03F:073 |

Subgroup gb5: (mapping of 5-bit data word into 10-bit code word)

| | | | | | | | |
|---|---|---|---|---|---|---|---|
| 000:351 | 001:352 | 002:354 | 003:358 | 004:361 | 005:362 | 006:364 | 007:368 |
| 008:391 | 009:392 | 00A:394 | 00B:398 | 00C:3A1 | 00D:3A2 | 00E:3A4 | 00F:3A8 |
| 010:0AE | 011:0AD | 012:0AB | 013:0A7 | 014:09E | 015:09D | 016:09B | 017:097 |
| 018:06E | 019:06D | 01A:06B | 01B:067 | 01C:05E | 01D:05D | 01E:05B | 01F:057 |

Subgroup gb4: (mapping of 4-bit data word into 10-bit code word)

| | | | | | | | |
|---|---|---|---|---|---|---|---|
| 000:307 | 001:30B | 002:30D | 003:30E | 004:370 | 005:3B0 | 006:3D0 | 007:3E0 |
| 008:0F8 | 009:0F4 | 00A:0F2 | 00B:0F1 | 00C:08F | 00D:04F | 00E:02F | 00F:01F |

Subgroup gb3: (mapping of 3-bit data word into 10-bit code word)

| | | | | | | | |
|---|---|---|---|---|---|---|---|
| 000:117 | 001:127 | 002:147 | 003:187 | 004:217 | 005:227 | 006:247 | 007:287 |

Subgroup gb2: (mapping of 2-bit data word into 10-bit code word)

| | | | |
|---|---|---|---|
| 000:10F | 001:20F | 002:1F0 | 003:2F0 |

Subgroup gc7: (mapping of 7-bit data word into 10-bit code word)

| | | | | | | | |
|---|---|---|---|---|---|---|---|
| 000:257 | 001:25B | 002:25D | 003:25E | 004:267 | 005:26B | 006:26D | 007:26E |
| 008:297 | 009:29B | 00A:29D | 00B:29E | 00C:2A7 | 00D:2AB | 00E:2AD | 00F:2AE |
| 010:237 | 011:23B | 012:23D | 013:23E | 014:2C7 | 015:2CB | 016:2CD | 017:2CE |
| 018:273 | 019:2B3 | 01A:2D3 | 01B:2E3 | 01C:27C | 01D:2BC | 01E:2DC | 01F:2EC |
| 020:275 | 021:2B5 | 022:2D5 | 023:2E5 | 024:276 | 025:2B6 | 026:2D6 | 027:2E6 |
| 028:279 | 029:2B9 | 02A:2D9 | 02B:2E9 | 02C:27A | 02D:2BA | 02E:2DA | 02F:2EA |
| 030:21F | 031:22F | 032:24F | 033:28F | 034:2F1 | 035:2F2 | 036:2F4 | 037:2F8 |
| 038:077 | 039:0B7 | 03A:0D7 | 03B:0E7 | 03C:07B | 03D:0BB | 03E:0DB | 03F:0EB |
| 040:157 | 041:15B | 042:15D | 043:15E | 044:167 | 045:16B | 046:16D | 047:16E |
| 048:197 | 049:19B | 04A:19D | 04B:19E | 04C:1A7 | 04D:1AB | 04E:1AD | 04F:1AE |
| 050:137 | 051:13B | 052:13D | 053:13E | 054:1C7 | 055:1CB | 056:1CD | 057:1CE |
| 058:173 | 059:1B3 | 05A:1D3 | 05B:1E3 | 05C:17C | 05D:1BC | 05E:1DC | 05F:1EC |
| 060:175 | 061:1B5 | 062:1D5 | 063:1E5 | 064:176 | 065:1B6 | 066:1D6 | 067:1E6 |
| 068:179 | 069:1B9 | 06A:1D9 | 06B:1E9 | 06C:17A | 06D:1BA | 06E:1DA | 06F:1EA |
| 070:11F | 071:12F | 072:14F | 073:18F | 074:1F1 | 075:1F2 | 076:1F4 | 077:1F8 |
| 078:07D | 079:0BD | 07A:0DD | 07B:0ED | 07C:07E | 07D:0BE | 07E:0DE | 07F:0EE |

Subgroup gc6: (mapping of 6-bit data word into 10-bit code word)

| | | | | | | | |
|---|---|---|---|---|---|---|---|
| 000:31B | 001:333 | 002:335 | 003:336 | 004:32B | 005:339 | 006:33A | 007:33C |
| 008:34B | 009:353 | 00A:355 | 00B:356 | 00C:38B | 00D:359 | 00E:35A | 00F:35C |
| 010:31D | 011:363 | 012:365 | 013:366 | 014:32D | 015:369 | 016:36A | 017:36C |

TABLE 2-continued

| | | | | | | | |
|---|---|---|---|---|---|---|---|
| 018:34D | 019:393 | 01A:395 | 01B:396 | 01C:38D | 01D:399 | 01E:39A | 01F:39C |
| 020:31E | 021:3A3 | 022:3A5 | 023:3A6 | 024:32E | 025:3A9 | 026:3AA | 027:3AC |
| 028:34E | 029:3C3 | 02A:3C5 | 02B:3C6 | 02C:38E | 02D:3C9 | 02E:3CA | 02F:3CC |
| 030:371 | 031:3B1 | 032:3D1 | 033:3E1 | 034:372 | 035:3B2 | 036:3D2 | 037:3E2 |
| 038:374 | 039:3B4 | 03A:3D4 | 03B:3E4 | 03C:378 | 03D:3B8 | 03E:3D8 | 03F:3E8 |

Subgroup gc4: (mapping of 4-bit data word into 10-bit code word)

| | | | | | | | |
|---|---|---|---|---|---|---|---|
| 000:317 | 001:03F | 002:05F | 003:06F | 004:327 | 005:09F | 006:0AF | 007:0CF |
| 008:347 | 009:0F3 | 00A:0F5 | 00B:0F6 | 00C:387 | 00D:0F9 | 00E:0FA | 00F:0FC |

Subgroup gc1: (mapping of 1-bit data word into 10-bit code word)

000:30F   001:3F0

Subgroup gd6: (mapping of 6-bit data word into 10-bit code word)

| | | | | | | | |
|---|---|---|---|---|---|---|---|
| 000:357 | 001:35B | 002:35D | 003:35E | 004:367 | 005:36B | 006:36D | 007:36E |
| 008:397 | 009:39B | 00A:39D | 00B:39E | 00C:3A7 | 00D:3AB | 00E:3AD | 00F:3AE |
| 010:337 | 011:33B | 012:33D | 013:33E | 014:3C7 | 015:3CB | 016:3CD | 017:3CE |
| 018:373 | 019:3B3 | 01A:3D3 | 01B:3E3 | 01C:37C | 01D:3BC | 01E:3DC | 01F:3EC |
| 020:375 | 021:3B5 | 022:3D5 | 023:3E5 | 024:376 | 025:3B6 | 026:3D6 | 027:3E6 |
| 028:379 | 029:3B9 | 02A:3D9 | 02B:3E9 | 02C:37A | 02D:3BA | 02E:3DA | 02F:3EA |
| 030:31F | 031:32F | 032:34F | 033:38F | 034:3F1 | 035:3F2 | 036:3F4 | 037:3F8 |
| 038:07F | 039:0BF | 03A:0DF | 03B:0EF | 03C:0F7 | 03D:0FB | 03E:0FD | 03F:0FE |

Subgroup gd5: (mapping of 5-bit data word into 10-bit code word)

| | | | | | | | |
|---|---|---|---|---|---|---|---|
| 000:277 | 001:2B7 | 002:2D7 | 003:2E7 | 004:27B | 005:2BB | 006:2DB | 007:2EB |
| 008:27D | 009:2BD | 00A:2DD | 00B:2ED | 00C:27E | 00D:2BE | 00E:2DE | 00F:2EE |
| 010:177 | 011:1B7 | 012:1D7 | 013:1E7 | 014:17B | 015:1BB | 016:1DB | 017:1EB |
| 018:17D | 019:1BD | 01A:1DD | 01B:1ED | 01C:17E | 01D:1BE | 01E:1DE | 01F:1EE |

Subgroup gd4: (mapping of 4-bit data word into 10-bit code word)

| | | | | | | | |
|---|---|---|---|---|---|---|---|
| 000:15F | 001:16F | 002:19F | 003:1AF | 004:25F | 005:26F | 006:29F | 007:2AF |
| 008:1F5 | 009:1F6 | 00A:1F9 | 00B:1FA | 00C:2F5 | 00D:2F6 | 00E:2F9 | 00F:2FA |

Subgroup gd3: (mapping of 3-bit data word into 10-bit code word)

| | | | | | | | |
|---|---|---|---|---|---|---|---|
| 000:13F | 001:1CF | 002:23F | 003:2CF | 004:1F3 | 005:1FC | 006:2F3 | 007:2FC |

Subgroup ge5: (mapping of 5-bit data word into 10-bit code word)

| | | | | | | | |
|---|---|---|---|---|---|---|---|
| 000:377 | 001:37B | 002:37D | 003:37E | 004:3B7 | 005:3BB | 006:3BD | 007:3BE |
| 008:3D7 | 009:3DB | 00A:3DD | 00B:3DE | 00C:3E7 | 00D:3EB | 00E:3ED | 00F:3EE |
| 010:17F | 011:1BF | 012:1DF | 013:1EF | 014:27F | 015:2BF | 016:2DF | 017:2EF |
| 018:1F7 | 019:1FB | 01A:1FD | 01B:1FE | 01C:2F7 | 01D:2FB | 01E:2FD | 01F:2FE |

Subgroup ge3: (mapping of 3-bit data word into 10-bit code word)

| | | | | | | | |
|---|---|---|---|---|---|---|---|
| 000:35F | 001:36F | 002:39F | 003:3AF | 004:3F5 | 005:3F6 | 006:3F9 | 007:3FA |

Subgroup ge2: (mapping of 2-bit data word into 10-bit code word)

000:33F   001:3CF   002:3F3   003:3FC

Subgroup ge0: (mapping of 0-bit data word into 10-bit code word)

000:0FF

Subgroup gf3: (mapping of 3-bit data word into 10-bit code word)

| | | | | | | | |
|---|---|---|---|---|---|---|---|
| 000:37F | 001:3BF | 002:3DF | 003:3EF | 004:3F7 | 005:3FB | 006:3FD | 007:3FE |

Subgroup gf1: (mapping of 1-bit data word into 10-bit code word)

000:1FF   001:2FF

Subgroup gg0: (mapping of 0-bit data word into 10-bit code word)

000:3FF

The third data fragment is then mapped into a "j" group code word segment to maintain the running digital sum at the boundaries of the 20-bit code words at 0 or 6. This mapping takes into account the current running digital sum of the 20 bit code word sequence and the running digital sum of the current 'g' group 10-bit code word segment.

Since the goal is to limit the total or cumulative RDS to 0 or 6 at the end of every 20-bit code word, the encoder keeps track of the total digital sum value of the sequence at the end of each 20-bit code word. In order to ensure that the RDS satisfies the desired constraints, the encoder operates in a plurality of states, wherein the current state corresponds to the cumulative RDS at the end of the previous code word. Depending on the current state, the encoder encodes the next user data word accordingly so that the cumulative RDS stays at 0 or 6.

The coding strategy can be described in two parts, Part 1 for the mapping of data word fragments into code word segments and Part 2 for determining the 20-bit code word output and the next state.

1. Part 1

The following possible combinations of two 10-bit segments exist such that the cumulative RDS at the end of a 20-bit code word stays at 0 or 6.

i) If RDS of the first 10-bit segment is 0, the RDS of the second 10-bit must be either 0 or 6 in order to make the RDS at the end of the 20-bit code word to be 0, or 6.

ii) If RDS of the first segment is +2, RDS of the second segment must be −2 or +4.

iii) If RDS of the first segment is +4, RDS of the second segment must be −4 or +2.

iv) If RDS of the first segment is +6, RDS of the second segment must be −6 or 0.

v) If RDS of the first segment is +8, RDS of the second segment must be −8 or −2.

vi) If RDS of the first segment is −2, RDS of the second segment must be +2 or +8.

vii) If RDS of the first segment is −4, RDS of the second segment must be +4 or +10.

viii) If RDS of the first segment is −6, RDS of the second segment must be +6.

ix) If RDS of the first segment is −8, RDS of the second segment must be +8.

According to the observations in (i) to (ix), the following "j" groups can be defined for mapping the second segment such that the cumulative RDS of the 20-bit code word stays at of 0 or 6.

TABLE 3

Let Group "jb" be the second segment for case (i) and constitute of the following subgroups:
Subgroup jb8 includes 256 patterns and they are from gb7, gb6, gb5, gb4, gb3, and gb2, which have RDS=0, and ge5, ge3, ge2 and ge0, which have RDS=6. Since $2^8$ = 256, these code word segments are exactly enough for the encoding of 8-bit data words. Mappings of 8-bit data word to these 10-bit code words are:
Data 00 to 7F : gb7(128 patterns, RDS= 0)
Data 80 to BF : gb6(64 patterns, RDS= 0)
Data C0 to DF : gb5(32 patterns, RDS= 0)
Data E0 to EF : gb4(16 patterns, RDS= 0)
Data F0 to F7 : gb3(8 patterns, RDS= 0)
Data F8 to FF : ge3(8 patterns, RDS=+6)
Subgroup jb5 includes 32 patterns and they are the same as ge5. Mappings of 5-bit data word to these 10-bit code words are:
Data 00 to 3F : ge5(32 patterns, RDS=+6)
Subgroup jb3 includes 32 patterns and they are from gb2 and ge2. Mappings of 3-bit data word to these 10-bit code words are:
Data 00 to 03 : gb2(4 patterns, RDS= 0)
Data 04 to 07 : ge2(4 patterns, RDS=+6)
Subgroup jb0 includes 1 pattern and the mapping of 0-bit data word to the 10-bit code word is:
Data 00          : ge0(1 pattern, RDS=+6)
All "jb" patterns have RDS of 0 or +6 satisfying the requirement of case (i) above.
*     *     *     *     *
Group "jc" is the second segment for case (ii) and constitute of the following subgroups:
Subgroup jc8 includes 256 patterns and they are from −gc7, −gc6 and gd6.
Mappings of 8-bit data word to these 10-bit code words are:
Data 00 to 7F : −gc7(128 patterns, RDS= −2)
Data 80 to BF : −gc6(64 patterns, RDS= −2)
Data C0 to FF : gd6(64 patterns, RDS= +4)
Subgroup jc6 includes 64 patterns and they are from gd5, −gc4 and gd4.
Mappings of 6-bit data word to these 10-bit code words are:
Data 00 to 1F : gd5(32 patterns, RDS= +4)
Data 20 to 2F : −gc4(16 patterns, RDS= −2)
Data 30 to 3F : gd4(16 patterns, RDS= +4)
Subgroup jc3 includes 8 patterns and they are from gd3. Mappings of 3-bit data word to these 10-bit code words are:
Data 00 to 07 : gd3(8 patterns, RDS= +4)
Subgroup jc1 includes 2 patterns and they are from −gc1. Mappings of 1-bit data word to these 10-bit code words are:
Data 00 to 01 : −gc1(2 patterns, RDS= −2)
All "jc" patterns have RDS of −2 or +4 satisfying the requirement of case (ii) above. Note that "−gcx" represents the group with patterns equivalent to the inverse of the patterns in group "gcx".
*     *     *     *     *
Group "jd" is the second segment for case (iii) and constitute of the following subgroups:
Subgroup jd8 includes 256 patterns and they are equivalent to the inverse of jc8. Mappings of 8-bit data word to these 10-bit code words are:
Data 00 to FF : −jc8(256 patterns, RDS= +2,−4)
Subgroup jd6 includes 64 patterns and they are equivalent to the inverse of jc6. Mappings of 6-bit data word to these 10-bit code words are:
Data 00 to 3F : −jc6(64 patterns, RDS= +2,−4)
Subgroup jd3 includes 8 patterns and they are equivalent to the inverse TABLE 3-continued of jc3. Mappings of 3-bit data word to these 10-bit code words are:
Data 00 to 07 : −jc3(8 patterns, RDS= −4)
Subgroup jd1 includes 2 patterns and they are equivalent to the inverse of jc1. Mappings of 1-bit data word to these 10-bit code words are:
Data 00 to 01 : −jc1(2 patterns, RDS= +2)
All "jd" patterns have RDS of −4 or +2 satisfying the requirement of case (iii) above.
*     *     *     *     *
Group "je" is the second segment for case (iv) and constitute of the following subgroups:
Subgroup je8 includes 256 patterns and they are equivalent to the inverse of jb8. Mappings of 8-bit data word to these 10-bit code words are:
Data 00 to FF : −jb8(256 patterns, RDS= −6,0)
Subgroup je5 includes 32 patterns and they are equivalent to the inverse of jb5. Mappings of 5-bit data word to these 10-bit code words are:
Data 00 to 1F : −jb5(32 patterns, RDS= −6)
Subgroup je3 includes 8 patterns and they are equivalent to the inverse of jb3. Mappings of 3-bit data word to these 10-bit code words are:
Data 00 to 07 : −jb3(8 patterns, RDS= −6,0)
Subgroup je0 includes 1 pattern and it is equivalent to the inverse of jb0. Mappings of 0-bit data word to the 10-bit code word is:
Data 00          : −jb0(1 pattern, RDS= −6)
All "je" patterns have RDS of −6, or 0 satisfying the requirement of case (iv) above.
*     *     *     *     *
Group "jf" is the second segment for case (v) and constitute of the following subgroups:
Subgroup jf7 includes 128 patterns and they are equivalent to the inverse of gc7. Mappings of 7-bit data word to these 10-bit code words are:
Data 00 to 7F : −gc7(128 patterns, RDS= −2)
Subgroup jf6 includes 64 patterns and they are equivalent to the inverse of gc6. Mappings of 6-bit data word to these 10-bit code words are:
Data 00 to 3F : −gc6(64 patterns, RDS= −2)
Subgroup jf4 includes 16 patterns and they are equivalent to the inverse of gc4. Mappings of 4-bit data word to these 10-bit code words are:
Data 00 to 0F : −gc4(16 patterns, RDS= −2)
Subgroup jf3 includes 8 patterns and they are equivalent to the inverse of gf3. Mappings of 3-bit data word to these 10-bit code words are:
Data 00 to 07 : −gf3(8 patterns, RDS= −8)
Subgroup jf2 includes 4 pattern and they are from −gc1 and −gf1.
Mappings of 2-bit data word to these 10-bit code words are:
Data 00 to 01 : −gc1(2 patterns, RDS= −2)
Data 02 to 03 : −gf1(2 patterns, RDS= −8)
All "jf" patterns have RDS of −8, or −2 satisfying the requirement of case (v) above.
*     *     *     *     *
Group "jj" is the second segment for case (vi) and constitute of the following subgroups:
Subgroup jj7 includes 128 patterns and they are equivalent to the inverse of jf7. Mappings of 7-bit data word to these 10-bit code words are:
Data 00 to 7F : −jf7(128 patterns, RDS= +2)
Subgroup jj6 includes 64 patterns and they are equivalent to the inverse of jf6. Mappings of 6-bit data word to these 10-bit code words are:
Data 00 to 3F : −jf6(64 patterns, RDS= +2)
Subgroup jj4 includes 16 patterns and they are equivalent to the inverse of jf4. Mappings of 4-bit data word to these 10-bit code words are:
Data 00 to 0F : −jf4(16 patterns, RDS= +2)
Subgroup jj3 includes 8 patterns and they are equivalent to the inverse of jf3. Mappings of 3-bit data word to these 10-bit code words are:
Data 00 to 07 : −jf3(8 patterns, RDS= +8)
Subgroup jj2 includes 4 patterns and they are equivalent to the inverse of jf2. Mappings of 2-bit data word to these 10-bit code words are:
Data 00 to 03 : −jf2(4 patterns, RDS= +2,+8)
All "jj" patterns have RDS of +8, or +2 satisfying the requirement of case (vi) above.
*     *     *     *     *
Group "jk" is the second segment for case (vii) and constitute of the following subgroups:
Subgroup jk6 includes 64 patterns and they are equivalent to gd6.
Mappings of 6-bit data word to these 10-bit code words are:
Data 00 to 3F : gd6(64 patterns, RDS= +4)
Subgroup jk5 includes 32 patterns and they are equivalent to gd5.
Mappings of 5-bit data word to these 10-bit code words are:
Data 00 to 1F : gd5(32 patterns, RDS= +4)
Subgroup jk4 includes 16 patterns and they are equivalent to gd4.
Mappings of 4-bit data word to these 10-bit code words are:

TABLE 3-continued

Data 00 to 0F : gd4(16 patterns, RDS= +4)
Subgroup jk3 includes 8 patterns and they are equivalent to gd3.
Mappings of 3-bit data word to these 10-bit code words are:
Data 00 to 07 : gd3(8 patterns, RDS= +4)
Subgroup jk0 includes 1 pattern and it is equivalent to gg0. Mappings of 0-bit data word to the 10-bit code word is:
Data 00         : gg0(1 pattern, RDS= +10)
All "jk" patterns have RDS of +4, or +10 satisfying the requirement of case (vii) above.
\*      \*      \*      \*      \*
Group "jl" is the second segment for case (viii) and constitute of the following subgroups:
Subgroup jl5 includes 32 patterns and they are equivalent to ge5.
Mappings of 5-bit data word to these 10-bit code words are:
Data 00 to 1F : ge5(32 patterns, RDS= +6)
Subgroup jl3 includes 8 patterns and they are equivalent to ge3.
Mappings of 3-bit data word to these 10-bit code words are:
Data 00 to 07 : ge3(8 patterns, RDS= +6)
Subgroup jl2 includes 4 patterns and they are equivalent to ge2.
Mappings of 2-bit data word to these 10-bit code words are:
Data 00 to 03 : ge2(4 patterns, RDS= +6)
Subgroup jl0 includes 1 pattern and it is equivalent to ge0. Mappings of 0-bit data word to the 10-bit code word is:
Data 00         : ge0(1 pattern, RDS= +6)
All "jl" patterns have RDS of +6 satisfying the requirement of case (viii) above.
\*      \*      \*      \*      \*
Group "jm" is the second segment for case (ix) and constitute of the following subgroups:
Subgroup jm3 includes 8 patterns and they are equivalent to gf3.
Mappings of 3-bit data word to these 10-bit code words are:
Data 00 to 07 : gf3(8 patterns, RDS= +8)
Subgroup jm1 includes 2 patterns and they are equivalent to gf1.
Mappings of 2-bit data word to these 10-bit code words are:
Data 00 to 01 : gf1(2 patterns, RDS= +8)
All "jm" patterns have RDS of +8 satisfying the requirement of case (ix) above.

2. Part 2 Determining 20-Bit Code Word Output and Next State

From Part I, all the 20-bit code words have RDS of 0 or 6. Depending on the current state of the encoder (cumulative RDS), the code word may have to be inverted so that the cumulative RDS stays at 0 or 6. The 20-bit code word output and the next state of the encoder can be determined according to the following rules:

i) If current state is 0 and RDS of code word is 0, next state stays at 0.

ii) If current state is 0 and RDS of code word is 6, next state will be 6.

iii) If current state is 6 and RDS of code word is 0, next state stays at 6.

ix) If current state is 6 and RDS of code word is 6, invert code word and let next state be 0.

For cases (i) to (iii), next state is just equal to current state plus the RDS of the current 20-bit code word. For case (iv), the code word must be inverted so that its RDS becomes −6. The next state is therefore equal to current state plus RDS of the modified code word, or Next State=−6+6=0.

Table 4 indicates how the 18-bit user data words are divided into three fragments and mapped into two 10-bit code word segments, with one segment selected from the "g" group and one segment selected from the "j" group. Concatenating the two segments accordingly forms the 20-bit code word. The columns in Table 4 that are labeled "17:0" represent the 18 bit positions in the user data word that is to be mapped. The first fragment is a bit pattern formed by the most significant bits of the data word. The first fragment can have various numbers of bits. The second and third fragments are mapped into the 'g' and 'j' segments, respectively. Those group names that are underlined in Table 4 represent patterns that are to be inverted. In the lookup table, "Pn" stands for the particular pattern number of the mapping performed. The values "G type" and "J type" correspond to which "g" and "j" subgroup is in the particular pattern.

TABLE 4

Code word mapping for 18/20 DC free code

| 17 | 16 | 15 | 14 | 13 | 12 | 11 | 10 | 9 | 8 | 7 | 6 | 5 | 4 | 3 | 2 | 1 | 0 | Pn | G Type | J Type |
|---|---|---|---|---|---|---|---|---|---|---|---|---|---|---|---|---|---|---|---|---|
| 0 | 0 | 0 | | | | gb7 | | | | | | | jb8 | | | | | 1 | 07 | 08 |
| 0 | 0 | 1 | | | | gc7 | | | | | | | jc8 | | | | | 2 | 17 | 18 |
| 0 | 1 | 0 | 0 | | | gb6 | | | | | | | jb8 | | | | | 3 | 06 | 08 |
| 0 | 1 | 0 | 1 | | | gc6 | | | | | | | jc8 | | | | | 4 | 16 | 18 |
| 0 | 1 | 1 | 0 | | | gd6 | | | | | | | jd8 | | | | | 5 | 26 | 28 |
| 0 | 1 | 1 | 1 | | | _gc7_ | | | | | | | _jj7_ | | | | | 6 | 97 | 57 |
| 1 | 0 | 0 | 0 | 0 | | gb5 | | | | | | | jb8 | | | | | 7 | 05 | 08 |
| 1 | 0 | 0 | 0 | 1 | | | gc7 | | | | | | | jc6 | | | | 8 | 17 | 16 |
| 1 | 0 | 0 | 1 | 0 | | gd5 | | | | | | | jd8 | | | | | 9 | 25 | 28 |
| 1 | 0 | 0 | 1 | 1 | | ge5 | | | | | | | je8 | | | | | 10 | 35 | 38 |
| 1 | 0 | 1 | 0 | 0 | | | _gc7_ | | | | | | | _jj6_ | | | | 11 | 97 | 96 |
| 1 | 0 | 1 | 0 | 1 | | | _gc6_ | | | | | | | _jj7_ | | | | 12 | 96 | 97 |
| 1 | 0 | 1 | 1 | 0 | 0 | | | gb7 | | | | | | _jb5_ | | | | 13 | 07 | 05 |
| 1 | 0 | 1 | 1 | 0 | 1 | gb4 | | | | | | | jb8 | | | | | 14 | 04 | 08 |
| 1 | 0 | 1 | 1 | 1 | 0 | | | gc6 | | | | | | jc6 | | | | 15 | 16 | 16 |
| 1 | 0 | 1 | 1 | 1 | 1 | gc4 | | | | | | | jc8 | | | | | 16 | 14 | 18 |
| 1 | 1 | 0 | 0 | 0 | 0 | | | gd6 | | | | | | jd6 | | | | 17 | 26 | 26 |
| 1 | 1 | 0 | 0 | 0 | 1 | gd4 | | | | | | | jd8 | | | | | 18 | 24 | 28 |
| 1 | 1 | 0 | 0 | 1 | 0 | | | _gc6_ | | | | | | _jj6_ | | | | 19 | 96 | 96 |
| 1 | 1 | 0 | 0 | 1 | 1 | | | _gd6_ | | | | | | jk6 | | | | 20 | A6 | A6 |
| 1 | 1 | 0 | 1 | 0 | 0 | 0 | | | gb6 | | | | | | _jb5_ | | | 21 | 06 | 05 |
| 1 | 1 | 0 | 1 | 0 | 0 | 1 | gb3 | | | | | | | jb8 | | | | 22 | 03 | 08 |
| 1 | 1 | 0 | 1 | 0 | 1 | 0 | | | gd5 | | | | | | jd6 | | | 23 | 25 | 26 |
| 1 | 1 | 0 | 1 | 0 | 1 | 1 | gd3 | | | | | | | jd8 | | | | 24 | 23 | 28 |

TABLE 4-continued

Code word mapping for 18/20 DC free code

| 17 | 16 | 15 | 14 | 13 | 12 | 11 | 10 | 9 | 8 | 7 | 6 | 5 | 4 | 3 | 2 | 1 | 0 | Pn | G Type | J Type |
|---|---|---|---|---|---|---|---|---|---|---|---|---|---|---|---|---|---|---|---|---|
| 1 | 1 | 0 | 1 | 1 | 0 | 0 | | ge3 | | | | | je8 | | | | | 25 | 33 | 38 |
| 1 | 1 | 0 | 1 | 1 | 0 | 1 | | | | gc7 | | | | | jj4 | | | 26 | 97 | 94 |
| 1 | 1 | 0 | 1 | 1 | 1 | 0 | | | gc4 | | | | | jj7 | | | | 27 | 94 | 97 |
| 1 | 1 | 0 | 1 | 1 | 1 | 1 | | | | gd6 | | | | | jk5 | | | 28 | A6 | A5 |
| 1 | 1 | 1 | 0 | 0 | 0 | 0 | | | gd5 | | | | | jk6 | | | | 29 | A5 | A6 |
| 1 | 1 | 1 | 0 | 0 | 0 | 1 | 0 | | | gb7 | | | | | | jb3 | | 30 | 07 | 03 |
| 1 | 1 | 1 | 0 | 0 | 0 | 1 | 1 | | gb5 | | | | | jb5 | | | | 31 | 05 | 05 |
| 1 | 1 | 1 | 0 | 0 | 1 | 0 | 0 | gb2 | | | | | jb8 | | | | | 32 | 02 | 08 |
| 1 | 1 | 1 | 0 | 0 | 1 | 0 | 1 | | | | gc7 | | | | | jc3 | | 33 | 17 | 13 |
| 1 | 1 | 1 | 0 | 0 | 1 | 1 | 0 | | gc4 | | | | | jc6 | | | | 34 | 14 | 16 |
| 1 | 1 | 1 | 0 | 0 | 1 | 1 | 1 | | gd4 | | | | | jd6 | | | | 35 | 24 | 26 |
| 1 | 1 | 1 | 0 | 1 | 0 | 0 | 0 | | | ge5 | | | | | je5 | | | 36 | 35 | 35 |
| 1 | 1 | 1 | 0 | 1 | 0 | 0 | 1 | ge2 | | | | | je8 | | | | | 37 | 32 | 38 |
| 1 | 1 | 1 | 0 | 1 | 0 | 1 | 0 | | gf3 | | | | | jf7 | | | | 38 | 43 | 47 |
| 1 | 1 | 1 | 0 | 1 | 0 | 1 | 1 | | | | gc7 | | | | | jj3 | | 39 | 97 | 93 |
| 1 | 1 | 1 | 0 | 1 | 1 | 0 | 0 | | | gc6 | | | | | jj4 | | | 40 | 96 | 94 |
| 1 | 1 | 1 | 0 | 1 | 1 | 0 | 1 | | gc4 | | | | | jj6 | | | | 41 | 94 | 96 |
| 1 | 1 | 1 | 0 | 1 | 1 | 1 | 0 | | | gd6 | | | | | jk4 | | | 42 | A6 | A4 |
| 1 | 1 | 1 | 0 | 1 | 1 | 1 | 1 | | gd5 | | | | | jk5 | | | | 43 | A5 | A5 |
| 1 | 1 | 1 | 1 | 0 | 0 | 0 | 0 | | gd4 | | | | | jk6 | | | | 44 | A4 | A6 |
| 1 | 1 | 1 | 1 | 0 | 0 | 0 | 1 | | ge5 | | | | | jl5 | | | | 45 | B5 | B5 |
| 1 | 1 | 1 | 1 | 0 | 0 | 1 | 0 | 0 | | gb6 | | | | | jb3 | | | 46 | 06 | 03 |
| 1 | 1 | 1 | 1 | 0 | 0 | 1 | 0 | 1 | gb4 | | | | | jb5 | | | | 47 | 04 | 05 |
| 1 | 1 | 1 | 1 | 0 | 0 | 1 | 1 | 0 | | gc6 | | | | | jc3 | | | 48 | 16 | 13 |
| 1 | 1 | 1 | 1 | 0 | 0 | 1 | 1 | 1 | gc1 | | | jc8 | | | | | | 49 | 11 | 18 |
| 1 | 1 | 1 | 1 | 0 | 1 | 0 | 0 | 0 | | | gd6 | | | | | jd3 | | 50 | 26 | 23 |
| 1 | 1 | 1 | 1 | 0 | 1 | 0 | 0 | 1 | gd3 | | | | jd6 | | | | | 51 | 23 | 26 |
| 1 | 1 | 1 | 1 | 0 | 1 | 0 | 1 | 0 | gf3 | | | | jf6 | | | | | 52 | 43 | 46 |
| 1 | 1 | 1 | 1 | 0 | 1 | 0 | 1 | 1 | | | gc7 | | | | | jj2 | | 53 | 97 | 92 |
| 1 | 1 | 1 | 1 | 0 | 1 | 1 | 0 | 0 | | gc6 | | | | | jj3 | | | 54 | 96 | 93 |
| 1 | 1 | 1 | 1 | 0 | 1 | 1 | 0 | 1 | | gd6 | | | | | jk3 | | | 55 | A6 | A3 |
| 1 | 1 | 1 | 1 | 0 | 1 | 1 | 1 | 0 | | gd5 | | | | | jk4 | | | 56 | A5 | A4 |
| 1 | 1 | 1 | 1 | 0 | 1 | 1 | 1 | 1 | | gd4 | | | | | jk5 | | | 57 | A4 | A5 |
| 1 | 1 | 1 | 1 | 1 | 0 | 0 | 0 | 0 | | gd3 | | | | | jk6 | | | 58 | A3 | A6 |
| 1 | 1 | 1 | 1 | 1 | 0 | 0 | 0 | 1 | 0 | | gb5 | | | | | jb3 | | 59 | 05 | 03 |
| 1 | 1 | 1 | 1 | 1 | 0 | 0 | 0 | 1 | 1 | gb3 | | | | jb5 | | | | 60 | 03 | 05 |
| 1 | 1 | 1 | 1 | 1 | 0 | 0 | 1 | 0 | 0 | | | gc7 | | | jd3 | | jc1 | 61 | 17 | 11 |
| 1 | 1 | 1 | 1 | 1 | 0 | 0 | 1 | 0 | 1 | | gd5 | | | | | jd3 | | 62 | 25 | 23 |
| 1 | 1 | 1 | 1 | 1 | 0 | 0 | 1 | 1 | 0 | | ge5 | | | | | je3 | | 63 | 35 | 33 |
| 1 | 1 | 1 | 1 | 1 | 0 | 0 | 1 | 1 | 1 | ge3 | | | | | je5 | | | 64 | 33 | 35 |
| 1 | 1 | 1 | 1 | 1 | 0 | 1 | 0 | 0 | 0 | | | | je8 | | | | | 65 | 30 | 38 |
| 1 | 1 | 1 | 1 | 1 | 0 | 1 | 0 | 0 | 1 | gf1 | | | | jf7 | | | | 66 | 41 | 47 |
| 1 | 1 | 1 | 1 | 1 | 0 | 1 | 0 | 1 | 0 | | | gc6 | | | | | jj2 | 67 | 96 | 92 |
| 1 | 1 | 1 | 1 | 1 | 0 | 1 | 0 | 1 | 1 | | gc4 | | | | | jj4 | | 68 | 94 | 94 |
| 1 | 1 | 1 | 1 | 1 | 0 | 1 | 1 | 0 | 0 | gc1 | | | | jj7 | | | | 69 | 91 | 97 |
| 1 | 1 | 1 | 1 | 1 | 0 | 1 | 1 | 0 | 1 | | gd5 | | | | | jk3 | | 70 | A5 | A3 |
| 1 | 1 | 1 | 1 | 1 | 0 | 1 | 1 | 1 | 0 | | gd4 | | | | | jk4 | | 71 | A4 | A4 |
| 1 | 1 | 1 | 1 | 1 | 0 | 1 | 1 | 1 | 1 | | gd3 | | | | | jk5 | | 72 | A3 | A5 |
| 1 | 1 | 1 | 1 | 1 | 1 | 0 | 0 | 0 | 0 | | ge5 | | | | | jl3 | | 73 | B5 | B3 |
| 1 | 1 | 1 | 1 | 1 | 1 | 0 | 0 | 0 | 1 | | ge3 | | | | | jl5 | | 74 | B3 | B5 |
| 1 | 1 | 1 | 1 | 1 | 1 | 0 | 0 | 1 | 0 | 0 | | | gb7 | | | | | 75 | 07 | 00 |
| 1 | 1 | 1 | 1 | 1 | 1 | 0 | 0 | 1 | 0 | 1 | | gb4 | | | | jb3 | | 76 | 04 | 03 |
| 1 | 1 | 1 | 1 | 1 | 1 | 0 | 0 | 1 | 1 | 0 | | gb2 | | | jb5 | | | 77 | 02 | 05 |
| 1 | 1 | 1 | 1 | 1 | 1 | 0 | 0 | 1 | 1 | 1 | | | gc6 | | | | jc1 | 78 | 16 | 11 |
| 1 | 1 | 1 | 1 | 1 | 1 | 0 | 1 | 0 | 0 | 0 | | gc4 | | | | jc3 | | 79 | 14 | 13 |
| 1 | 1 | 1 | 1 | 1 | 1 | 0 | 1 | 0 | 0 | 1 | gc1 | | | jc6 | | | | 80 | 11 | 16 |
| 1 | 1 | 1 | 1 | 1 | 1 | 0 | 1 | 0 | 1 | 0 | | | gd6 | | | | jd1 | 81 | 26 | 21 |
| 1 | 1 | 1 | 1 | 1 | 1 | 0 | 1 | 0 | 1 | 1 | | gd4 | | | | jd3 | | 82 | 24 | 23 |
| 1 | 1 | 1 | 1 | 1 | 1 | 0 | 1 | 1 | 0 | 0 | ge2 | | | | je5 | | | 83 | 32 | 35 |
| 1 | 1 | 1 | 1 | 1 | 1 | 0 | 1 | 1 | 0 | 1 | gf3 | | | | jf4 | | | 84 | 43 | 44 |
| 1 | 1 | 1 | 1 | 1 | 1 | 0 | 1 | 1 | 1 | 0 | gf1 | | | jf6 | | | | 85 | 41 | 46 |
| 1 | 1 | 1 | 1 | 1 | 1 | 0 | 1 | 1 | 1 | 1 | | gc4 | | | | jj3 | | 86 | 94 | 93 |
| 1 | 1 | 1 | 1 | 1 | 1 | 1 | 0 | 0 | 0 | 0 | gc1 | | | jj6 | | | | 87 | 91 | 96 |
| 1 | 1 | 1 | 1 | 1 | 1 | 1 | 0 | 0 | 0 | 1 | | gd4 | | | | jk3 | | 88 | A4 | A3 |
| 1 | 1 | 1 | 1 | 1 | 1 | 1 | 0 | 0 | 1 | 0 | gd3 | | | | jk4 | | | 89 | A3 | A4 |
| 1 | 1 | 1 | 1 | 1 | 1 | 1 | 0 | 0 | 1 | 1 | ge5 | | | | | jl2 | | 90 | B5 | B2 |
| 1 | 1 | 1 | 1 | 1 | 1 | 1 | 0 | 1 | 0 | 0 | ge2 | | | | jl5 | | | 91 | B2 | B5 |
| 1 | 1 | 1 | 1 | 1 | 1 | 1 | 0 | 1 | 0 | 1 | 0 | | | gb6 | | | | 92 | 06 | 00 |
| 1 | 1 | 1 | 1 | 1 | 1 | 1 | 0 | 1 | 0 | 1 | 1 | gb3 | | | | jb3 | | 93 | 03 | 03 |
| 1 | 1 | 1 | 1 | 1 | 1 | 1 | 0 | 1 | 1 | 0 | 0 | | | gd5 | | | jd1 | 94 | 25 | 21 |
| 1 | 1 | 1 | 1 | 1 | 1 | 1 | 0 | 1 | 1 | 0 | 1 | | gd3 | | | jd3 | | 95 | 23 | 23 |
| 1 | 1 | 1 | 1 | 1 | 1 | 1 | 0 | 1 | 1 | 1 | 0 | | ge3 | | | je3 | | 96 | 33 | 33 |
| 1 | 1 | 1 | 1 | 1 | 1 | 1 | 0 | 1 | 1 | 1 | 1 | | gf3 | | | jf3 | | 97 | 43 | 43 |
| 1 | 1 | 1 | 1 | 1 | 1 | 1 | 1 | 0 | 0 | 0 | 0 | | | gc4 | | | jj2 | 98 | 94 | 92 |
| 1 | 1 | 1 | 1 | 1 | 1 | 1 | 1 | 0 | 0 | 0 | 1 | | | gd6 | | | | 99 | A6 | A0 |

TABLE 4-continued

Code word mapping for 18/20 DC free code

| 17 | 16 | 15 | 14 | 13 | 12 | 11 | 10 | 9 | 8 | 7 | 6 | 5 | 4 | 3 | 2 | 1 | 0 | Pn | G Type | J Type |
|---|---|---|---|---|---|---|---|---|---|---|---|---|---|---|---|---|---|---|---|---|
| 1 | 1 | 1 | 1 | 1 | 1 | 1 | 1 | 0 | 0 | 1 | 0 |  | gd3 |  |  | jk3 |  | 100 | A3 | A3 |
| 1 | 1 | 1 | 1 | 1 | 1 | 1 | 1 | 0 | 0 | 1 | 1 |  | ge3 |  |  | jl3 |  | 101 | B3 | B3 |
| 1 | 1 | 1 | 1 | 1 | 1 | 1 | 1 | 0 | 1 | 0 | 0 |  | gf3 |  |  | jm3 |  | 102 | C3 | C3 |
| 1 | 1 | 1 | 1 | 1 | 1 | 1 | 1 | 0 | 1 | 0 | 1 | 0 |  |  | gb5 |  |  | 103 | 05 | 00 |
| 1 | 1 | 1 | 1 | 1 | 1 | 1 | 1 | 0 | 1 | 0 | 1 | 1 | gb2 |  |  | jb3 |  | 104 | 02 | 03 |
| 1 | 1 | 1 | 1 | 1 | 1 | 1 | 1 | 0 | 1 | 1 | 0 | 0 |  |  | gc4 |  | jc1 | 105 | 14 | 11 |
| 1 | 1 | 1 | 1 | 1 | 1 | 1 | 1 | 0 | 1 | 1 | 0 | 1 |  |  | gd4 |  | jd1 | 106 | 24 | 21 |
| 1 | 1 | 1 | 1 | 1 | 1 | 1 | 1 | 0 | 1 | 1 | 1 | 0 |  |  |  | ge5 |  | 107 | 35 | 30 |
| 1 | 1 | 1 | 1 | 1 | 1 | 1 | 1 | 0 | 1 | 1 | 1 | 1 | ge2 |  |  | je3 |  | 108 | 32 | 33 |
| 1 | 1 | 1 | 1 | 1 | 1 | 1 | 1 | 1 | 0 | 0 | 0 | 0 |  |  | je5 |  |  | 109 | 30 | 35 |
| 1 | 1 | 1 | 1 | 1 | 1 | 1 | 1 | 1 | 0 | 0 | 0 | 1 |  | gf3 |  |  | jf2 |  | 110 | 43 | 42 |
| 1 | 1 | 1 | 1 | 1 | 1 | 1 | 1 | 1 | 0 | 0 | 1 | 0 | gf1 |  | jf4 |  |  | 111 | 41 | 44 |
| 1 | 1 | 1 | 1 | 1 | 1 | 1 | 1 | 1 | 0 | 0 | 1 | 1 | gc1 |  | jj4 |  |  | 112 | 91 | 94 |
| 1 | 1 | 1 | 1 | 1 | 1 | 1 | 1 | 1 | 0 | 1 | 0 | 0 |  |  | gd5 |  |  | 113 | A5 | A0 |
| 1 | 1 | 1 | 1 | 1 | 1 | 1 | 1 | 1 | 0 | 1 | 0 | 1 |  |  | ge5 |  |  | 114 | B5 | B0 |
| 1 | 1 | 1 | 1 | 1 | 1 | 1 | 1 | 1 | 0 | 1 | 1 | 0 |  | ge3 |  | jl2 |  | 115 | B3 | B2 |
| 1 | 1 | 1 | 1 | 1 | 1 | 1 | 1 | 1 | 0 | 1 | 1 | 1 | ge2 |  |  | jl3 |  | 116 | B2 | B3 |
| 1 | 1 | 1 | 1 | 1 | 1 | 1 | 1 | 1 | 1 | 0 | 0 | 0 |  |  | jl5 |  |  | 117 | B0 | B5 |
| 1 | 1 | 1 | 1 | 1 | 1 | 1 | 1 | 1 | 1 | 0 | 0 | 1 | 0 |  | gb4 |  |  | 118 | 04 | 00 |
| 1 | 1 | 1 | 1 | 1 | 1 | 1 | 1 | 1 | 1 | 0 | 0 | 1 | 1 | gc1 |  | jc3 |  | 119 | 11 | 13 |
| 1 | 1 | 1 | 1 | 1 | 1 | 1 | 1 | 1 | 1 | 0 | 1 | 0 | 0 |  | gd3 |  | jd1 | 120 | 23 | 21 |
| 1 | 1 | 1 | 1 | 1 | 1 | 1 | 1 | 1 | 1 | 0 | 1 | 0 | 1 | gf1 |  | jf3 |  | 121 | 41 | 43 |
| 1 | 1 | 1 | 1 | 1 | 1 | 1 | 1 | 1 | 1 | 0 | 1 | 1 | 0 | gc1 |  | jj3 |  | 122 | 91 | 93 |
| 1 | 1 | 1 | 1 | 1 | 1 | 1 | 1 | 1 | 1 | 0 | 1 | 1 | 1 |  | gd4 |  |  | 123 | A4 | A0 |
| 1 | 1 | 1 | 1 | 1 | 1 | 1 | 1 | 1 | 1 | 1 | 0 | 0 | 0 |  | ge2 |  | jl2 | 124 | B2 | B2 |
| 1 | 1 | 1 | 1 | 1 | 1 | 1 | 1 | 1 | 1 | 1 | 0 | 0 | 1 |  | gf3 |  | jm1 | 125 | C3 | C1 |
| 1 | 1 | 1 | 1 | 1 | 1 | 1 | 1 | 1 | 1 | 1 | 0 | 1 | 0 | gf1 |  | jm3 |  | 126 | C1 | C3 |
| 1 | 1 | 1 | 1 | 1 | 1 | 1 | 1 | 1 | 1 | 1 | 0 | 1 | 1 | 0 |  | gb3 |  | 127 | 03 | 00 |
| 1 | 1 | 1 | 1 | 1 | 1 | 1 | 1 | 1 | 1 | 1 | 0 | 1 | 1 | 1 |  | ge3 |  | 128 | 33 | 30 |
| 1 | 1 | 1 | 1 | 1 | 1 | 1 | 1 | 1 | 1 | 1 | 1 | 0 | 0 | 0 |  | je3 |  | 129 | 30 | 33 |
| 1 | 1 | 1 | 1 | 1 | 1 | 1 | 1 | 1 | 1 | 1 | 1 | 0 | 0 | 1 | gf1 |  | jf2 |  | 130 | 41 | 42 |
| 1 | 1 | 1 | 1 | 1 | 1 | 1 | 1 | 1 | 1 | 1 | 1 | 0 | 1 | 0 | gc1 |  | jj2 |  | 131 | 91 | 92 |
| 1 | 1 | 1 | 1 | 1 | 1 | 1 | 1 | 1 | 1 | 1 | 1 | 0 | 1 | 1 |  | gd3 |  |  | 132 | A3 | A0 |
| 1 | 1 | 1 | 1 | 1 | 1 | 1 | 1 | 1 | 1 | 1 | 1 | 1 | 0 | 0 |  | ge3 |  |  | 133 | B3 | B0 |
| 1 | 1 | 1 | 1 | 1 | 1 | 1 | 1 | 1 | 1 | 1 | 1 | 1 | 0 | 1 |  |  | jl3 |  | 134 | B0 | B3 |
| 1 | 1 | 1 | 1 | 1 | 1 | 1 | 1 | 1 | 1 | 1 | 1 | 1 | 1 | 0 | 0 |  | gb2 |  | 135 | 02 | 00 |
| 1 | 1 | 1 | 1 | 1 | 1 | 1 | 1 | 1 | 1 | 1 | 1 | 1 | 1 | 0 | 1 | gc1 | jc1 | 136 | 11 | 11 |
| 1 | 1 | 1 | 1 | 1 | 1 | 1 | 1 | 1 | 1 | 1 | 1 | 1 | 1 | 1 | 0 |  | ge2 |  | 137 | 32 | 30 |
| 1 | 1 | 1 | 1 | 1 | 1 | 1 | 1 | 1 | 1 | 1 | 1 | 1 | 1 | 1 | 1 |  | ge2 |  | 138 | B2 | B0 |

3. Example

As an example, assume the 18-bit user data word is 0x2A3EC=10 1010 0011 1110 1100, where "0x" indicates a hexadecimal value. Assuming the leading bit is d17, then the bit values from most significant to least significant are: d17=1, d16=0, d15=1, d14=0, d13=1, d12=0, d11=0, d10=0, d9=1, d8=1, d7=1, d6=1, d5=1, d4=0, d3=1, d2=1, d1=0, and d0=0.

According to Table 4, when the first fragment d(17:13)= 10101 (pattern number Pn=12) the second fragment d(12:7) is mapped according to subgroup "gc6" to obtain the first 10-bit code segment and the third fragment d(6:0) is mapped according to subgroup "jj7" to obtain the second 10-bit code segment of the 20-bit code word. The bits of the second fragment d(12:7) are 000111=0x07 and, according to mapping for subgroup "gc6", shown in Table 2, the 10-bit segment should be mapped to 0x33C=1100111100. The underline "gc6" means the segment needs to be inverted. The first 10-bit code segment is therefore equal to 0x0C3= 0011000011.

The bits of the third fragment d(6:0)=1101100=0x6C. According to the mapping for subgroup "jj7", shown in Table 3, the patterns from "gc7" should be used. According to mapping for subgroup "gc7" in Table 2, 0x6C maps into 0x17A=0101111010. The first 10-bit code segment is therefore equal to 0x17A=0101111010.

Now, combining the first and second 10-bit code segments to obtain the 20-bit code word results in, 0011000011 0101111010=0x30D7A. Notice that the running digital sum of this code word is 0, the next state is therefore unchanged.

In order to avoid the unrestrained sequence of 101010 . . . , code words that can cause this error can be eliminated. Therefore, code words 0xAAAAA and 0x55555 are replaced by 0xC03F3 and 0xC03FC, respectively. These two substitutions are not used for any other mappings and have the same RDS as the replaced patterns.

4. Interleaving

To detect more error event types, the code words can be interleaved to higher degrees. Usually, the higher the degree, the more types of event can be detected. However, higher degrees increase the complexity of the encoder/decoder and can have other undesirable effects such as long run of a single polarity without transition. Therefore, an interleave of degree two to four can be applied, for example. There are many different ways to interleave the code words but a bit-wise interleave is the simplest choice and can be implemented easily. Any method of interleaving can be used with embodiments of the present invention that use interleaving.

In a bit-wise interleave of degree two, two adjacent 20-bit code words in a code word sequence can be interleaved into a single code word of 40 bits, as shown below:

Code Word 1=$A_{19}A_{18}A_{17}A_{16}A_{15}A_{14}A_{13}A_{12}A_{11}A_{10}A_9A_8A_7A_6A_5A_4A_3A_2A_1A_0$ Code Word
$2 = B_{19}B_{18}B_{17}B_{16}B_{15}B_{14}B_{13}B_{12}B_{11}B_{10}B_9B_8B_7B_6B_5B_4$
$B_3B_2B_1B_0$ The interleaved 40-bit word is therefore:
$A_{19}B_{19}A_{18}B_{18}A_{17}B_{17}A_{16}B_{16}A_{15}B_{15}A_{14}B_{14}A_{13}B_{13}A_{12}$
$B_{12}A_{11}B_{11}A_{10}B_{10}A_9B_9A_8B_8A_7B_7A_6B_6A_5B_5A_4B_4A_3$
$B_3A_2B_2A_1B_1A_0B_0$.

In other words, the code rate will be 36/40 when the code words are interleaved to degree two. Likewise, the code rate will be 54/60 and 72/80 when interleaved to degree three and four respectively. Notice that the code rate stays unchanged at 0.9 while the code word length increases accordingly when the degree of interleave is increased.

II. Descriptions of Encoder and Decoder

The following section provides example of an encoder and a decoder that can be used to implement the code discussed above. The details of the circuits and operations described below are examples only and can be performed in hardware, software, firmware and/or combinations thereof. Table 5 provides definitions for the symbols and logic operations used below to describe the functions of the encoder and decoder.

TABLE 7

Symbol definition:

| | |
|---|---|
| "\|" | Bitwise OR |
| "&" | Bitwise AND |
| "^" | Bitwise XOR |
| "!x" | Inverse of bit x |
| "!C(n:0)" | Inverse of all bits of word C |

1. Encoder

FIG. 3 is a block diagram of an encoder 250 for encoding an 18-bit user data word into a 20-bit code word for transmission through a communication channel 252, according to the method shown in FIG. 2. Encoder 250 has an initialization input INIT, an 18-bit user data input $I_{17:0}$, a word clock input WORD CLOCK, and a 20-bit code word output $W_{19:0}$. Encoder 250 further includes encoder input circuit 254, data fragment encoder 256, "g" group encoder 258, "j" group encoder 260, and encoder output circuit 262.

Encoder input circuit 254 receives each successive 18-bit user data word on input $I_{117:0}$ and latches each data word on data output $D_{17:0}$ on the rising edge of Word Clock. Encoder input circuit 254 also latches a next state value NEXT STATE received from encoder output circuit 262 as a current state on state output STATE with each received user data word. With the first user data word in a sequence, or on power up, initialization input INIT resets the current state value to zero. As mentioned in the above-example, the current state value can have one of two values, representing a zero or six cumulative running digital sum on code word output $W_{19:0}$, at the boundary of each code word.

Data fragment circuit 256 performs the function of the look-up table shown in Table 4 above. For each latched 18-bit user data word received from encoder input circuit 254, data fragment circuit 256 looks at the pattern formed by the most significant bits of the word (such as the "first fragment" discussed above) to determine which "g-" subgroup and "j-" subgroup should be used for encoding the data word and generates a corresponding g-group select signal $gs_{19:0}$ and j-group select signal $js_{36:0}$. Circuit 256 also routes the bits of the user data word to be encoded into a g-group code word to g-group data output $gd_{6:0}$ and routes the bits to be encoded into a j-group code word to j-group data output $jd_{7:0}$. Circuit 256 also generates a g-group invert signal g__inv, which is used to selectively invert the g-group code word according to Table 4.

G-group encoder 258 encodes the g-group data bits into a corresponding 10-bit code word segment $gw_{9:0}$ as a function of the select signal $gs_{19:0}$, the invert signal g__inv, and the current state STATE. Similarly, j-group encoder 260 encodes the j-group data bits $jd_{7:0}$ into a 10-bit code word segment $jw_{9:0}$ based on select signal $js_{36:0}$ and the current state STATE. Encoder output circuit 262 receives the two 10-bit code word segments and forms the 20-bit code word on code word output $W_{19:0}$. Encoder output circuit 262 also generates the next state value based on the current state STATE and the running digital sum of the current 20-bit code word.

FIGS. 4–8 illustrates circuits 254, 256, 258, 260 and 262 in greater detail. FIG. 4 shows the details of encoder input circuit 254. Encoder input circuit 254 includes 18-bit data word latch 300 and state latch 302. Data word latch 300 latches each data word received on input $I_{17:0}$ to data output $D_{18:0}$ on the rising edge of WORD CLOCK. Similarly, state latch 302 latches the next state received on the next state input as the current state on state output STATE on the rising edge of WORD CLOCK. Initialization input INIT is coupled to the reset input of state latch 302 for resetting state output STATE upon initialization. Before the first user data word is clocked into latch 300, the INIT signal initializes STATE to zero. In one embodiment, STATE is a one-bit value representing the current state ("0" for state zero and "1" for state six).

FIG. 5 is a block diagram illustrating data fragment circuit 256 in greater detail. Circuit 256 includes a pattern select circuit 310 and a fragment multiplexer 312. Pattern select circuit 310 receives the latched 18-bit data word $D_{17:0}$ and, based on the first fragment of the data word (the most significant bits shown in Table 4), identifies which of the 138 g-group and j-group pattern combinations in Table 4 shall be used. Pattern select circuit 310 generates a logic high value on a one of the 138 select outputs $S_{138:1}$, which corresponds to that pattern combination. Using the example discussed above, if D[17:13] equals "10101", then the pattern combination of gc6 and jj7 (Pn=12) is selected. Therefore S[12] would be active at the output of pattern select circuit 310 and the remaining bits would be inactive.

Based on the pattern formed by $S_{138:1}$, fragment multiplexer 312 routes the appropriate user data bits to g-group data output $gd_{6:0}$ and j-group data output $jd_{7:0}$ and generates the appropriate g-group select pattern $gs_{19:0}$ and j-group select pattern $js_{36:0}$. One of the g-group select bits $gs_{19:0}$ will be active, and all other bits will be inactive. Similarly, one of the j-group select bits $js_{36:0}$ will be active and all other bits will be inactive. Multiplexer 312 also generates the appropriate value on g-group invert output g__inv.

In one embodiment, data fragment encoder circuit 256 operates according to the logic definitions shown in Table 8. The logic operators used in Table 8 are defined in Table 7.

TABLE 8 enc_rds

Input: d17,d16,d15,d14,d13,d12,d11,d10,d9,d8,d7,d6,d5,d4,d3,d2,d1,d0
(18-bit Dataword)
  Output: gd(6:0), jd(7:0)
    gs(19:0), js(36:0)
Pattern Select of enc_rds

| | | | |
|---|---|---|---|
| TA0= !d17&!d16 | TA1= !d17& d16 | TA2= d17&!d16 | TA3= d17& d16 |
| TB07= !d15 | TB8f= d15 | | |
| TB03= TB07&!d14 | TB47= TB07& d14 | TB8b= TB8f&!d14 | TBcf= TB8f& d14 |
| TB01= TB03&!d13 | TB23= TB03& d13 | TB45= TB47&!d13 | TB67= TB47& d13 |
| TB89= TB8b&!d13 | TBab= TB8b& d13 | TBcd= TBcf&!d13 | TBef= TBcf& d13 |
| TB0 = TB01&!d12 | TB1 = TB01& d12 | TB2 = TB23&!d12 | TB3 = TB23& d12 |
| TB4 = TB45&!d12 | TB5 = TB45& d12 | TB6 = TB67&!d12 | TB7 = TB67& d12 |
| TB8 = TB89&!d12 | TB9 = TB89& d12 | TBa = TBab&!d12 | TBb = TBab& d12 |
| TBc = TBcd&!d12 | TBd = TBcd& d12 | TBe = TBef&!d12 | TBf = TBef& d12 |
| TC07= !d11 | TC8f= d11 | | |
| TC03= TC07&!d10 | TC47= TC07& d10 | TC8b= TC8f&!d10 | TCcf= TC8f& d10 |
| TC01= TC03&!d9 | TC23= TC03& d9 | TC45= TC47&!d9 | TC67= TC47& d9 |
| TC89= TC8b&!d9 | TCab= TC8b& d9 | TCcd= TCcf&!d9 | TCef= TCcf& d9 |
| TC0 = TC01&!d8 | TC1 = TC01& d8 | TC2 = TC23&!d8 | TC3 = TC23& d8 |
| TC4 = TC45&!d8 | TC5 = TC45& d8 | TC6 = TC67&!d8 | TC7 = TC67& d8 |
| TC8 = TC89&!d8 | TC9 = TC89& d8 | TCa = TCab&!d8 | TCb = TCab& d8 |
| TCc = TCcd&!d8 | TCd = TCcd& d8 | TCe = TCef&!d8 | TCf = TCef& d8 |
| TD07 = !d7 | TD8f= d7 | | |
| TD03= TD07&!d6 | TD47= TD07& d6 | TD8b= TD8f&!d6 | TDcf= TD8f& d6 |
| TD01= TD03&!d5 | TD23= TD03& d5 | TD45= TD47&!d5 | TD67= TD47& d5 |
| TD89= TD8b&!d5 | TDab= TD8b& d5 | TDcd= TDcf&!d5 | TDef= TDcf& d5 |
| TD2 = TD23&!d4 | TD3 = TD23& d4 | | |
| TD4 = TD45&!d4 | TD5 = TD45& d4 | TD6 = TD67&!d4 | TD7 = TD67& d4 |
| TD8 = TD89&!d4 | TD9 = TD89& d4 | TDa = TDab&!d4 | TDb = TDab& d4 |
| TDc = TDcd&!d4 | TDd = TDcd& d4 | TDe = TDef&!d4 | TDf = TDef& d4 |
| TE07= !d3 | TE8f= d3 | | |
| TE03= TE07&!d2 | TE47= TE07& d2 | TE8b= TE8f&!d2 | TEcf= TE8f& d2 |
| T30= TA3&TB0 | T31= TA3&TB1 | T32= TA3&TB2 | T33= TA3&TB3 |
| T34= TA3&TB4 | T35= TA3&TB5 | T36= TA3&TB6 | T37= TA3&TB7 |
| T38= TA3&TB8 | T39= TA3&TB9 | T3a= TA3&TBa | T3b= TA3&TBb |
| T3c= TA3&TBc | T3d= TA3&TBd | T3e= TA3&TBe | T3f= TA3&TBf |
| T3fc= T3f&TCc | T3fd= T3f&TCd | T3fe= T3f&TCe | T3ff= T3f&TCf |
| S1=TA0&TB07 | S2=TA0&TB8f | S3=TA1&TB03 | S4=TA1&TB47 |
| S5=TA1&TB8b | S6=TA1&TBcf | S7=TA2&TB01 | S8=TA2&TB23 |
| S9=TA2&TB45 | S10=TA2&TB67 | S11=TA2&TB89 | S12=TA2&TBab |
| S13=TA2&TBc | S14=TA2&TBd | S15=TA2&Tbe | S16=TA2&TBf |
| S17=T30 | S18=T31 | S19=T32 | S20=T33 |
| S21=T34&TC07 | S22=T34&TC8f | S23=T35&TC07 | S24=T35&TC8f |
| S25=T36&TC07 | S26=T36&TC8f | S27=T37&TC07 | S28=T37&TC8f |
| S29=T38&TC07 | S30=T38&TC8b | S31=T38&TCcf | S32=T39&TC03 |
| S33=T39&TC47 | S34=T39&TC8b | S35=T39&TCcf | S36=T3a&TC03 |
| S37=T3a&TC47 | S38=T3a&TC8b | S39=T3a&TCcf | S40=T3b&TC03 |
| S41=T3b&TC47 | S42=T3b&TC8b | S43=T3b&TCcf | S44=T3c&TC03 |
| S45=T3c&TC47 | S46=T3c&TC89 | S47=T3c&TCab | S48=T3c&TCcd |
| S49=T3c&TCef | S50=T3d&TC01 | S51=T3d&TC23 | S52=T3d&TC45 |
| S53=T3d&TC67 | S54=T3d&TC89 | S55=T3d&TCab | S56=T3d&TCcd |
| S57=T3d&TCef | S58=T3e&TC01 | S59=T3e&TC2 | S60=T3e&TC3 |
| S61=T3e&TC4 | S62=T3e&TC5 | S63=T3e&TC6 | S64=T3e&TC7 |
| S65=T3e&TC8 | S66=T3e&TC9 | S67=T3e&TCa | S68=T3e&TCb |
| S69=T3e&TCc | S70=T3e&TCd | S71=T3e&TCe | S72=T3e&TCf |
| S73=T3f&TC0 | S74=T3f&TC1 | S75=T3f&TC2&TD07 | S76=T3f&TC2&TD8f |
| S77=T3f&TC3&TD07 | S78=T3f&TC3&TD8f | S79=T3f&TC4&TD07 | S80=T3f&TC4&TD8f |
| S81=T3f&TC5&TD07 | S82=T3f&TC5&TD8f | S83=T3f&TC6&TD07 | S84=T3f&TC6&TD8f |
| S85=T3f&TC7&TD07 | S86=T3f&TC7&TD8f | S87=T3f&TC8&TD07 | S88=T3f&TC8&TD8f |
| S89=T3f&TC9&TD07 | S90=T3f&TC9&TD8f | S91=T3f&TCa&TD07 | S92=T3f&TCa&TD8b |
| S93=T3f&TCa&TDcf | S94=T3f&TCb&TD03 | S95=T3f&TCb&TD47 | S96=T3f&TCb&TD8b |
| S97=T3f&TCb&TDcf | S98=T3fc&TD03 | S99=T3fc&TD47 | S100=T3fc&TD8b |
| S101=T3fc&TDcf | S102=T3fd&TD03 | S103=T3fd&TD45 | S104=T3fd&TD67 |
| S105=T3fd&TD89 | S106=T3fd&TDab | S107=T3fd&TDcd | S108=T3fd&TDef |
| S109=T3fe&TD01 | S110=T3fe&TD23 | S111=T3fe&TD45 | S112=T3fe&TD67 |
| S113=T3fe&TD89 | S114=T3fe&TDab | S115=T3fe&TDcd | S116=T3fe&TDef |
| S117=T3ff&TD01 | S118=T3ff&TD2 | S119=T3ff&TD3 | |
| S120=T3ff&TD4 | S121=T3ff&TD5 | S122=T3ff&TD6 | |
| S123=T3ff&TD7 | S124=T3ff&TD8 | S125=T3ff&TD9 | |
| S126=T3ff&TDa | S127=T3ff&TDb&TE07 | S128=T3ff&TDb&TE8f | |
| S129=T3ff&TDc&TE07 | S130=T3ff&TDc&TE8f | S131=T3ff&TDd&TE07 | |
| S132=T3ff&TDd&TE8f | S133=T3ff&TDe&TE07 | S134=T3ff&TDe&TE8f | |
| S135=T3ff&TDf&TE03 | S136=T3ff&TDf&TE47 | S137=T3ff&TDf&TE8b | |
| S138=T3ff&TDf&Tecf | | | |

TABLE 8-continued

MUX for GX and JX Encoder of enc rds

For GX:
if(S1|S2|S3|S4|S5|S7|S9|S10|S14|S16|S18|S22|S24|S25|S32|S37|S49)
    { gd(6:0) = (d(14:8) }
if(S6|S12|S27|S38|S66|S69)
    { gd(6:0) = (d(13:7) }
if(S8|S11|S15|S17|S19|S20|S23|S29|S34|S35|S41|S44|S51|S52|S58|S80|
  S85|S87)
{ gd(6:0) = (d(12:6) }
if(S13|S21|S28|S31|S36|S43|S45|S47|S57|S60|S64|S72|S74|S77|S83|S91)
    { gd(6:0) = (d(11:5) }
if(S26|S40|S42|S56|S68|S71|S84|S89|S111|S112)
    { gd(6:0) = (d(10:4) }
if(S30|S33|S39|S46|S48|S50|S54|S55|S59|S62|S63|S70|S73|S76|S79|S82|S86|
  S88|S93|S95|S96|S97|S100|S101|S102|S104|S108|S116|S119|S121|S122|S126)
    { gd(6:0) = (d( 9:3) }
if(S53|S67|S90|S98|S110|S115|S124|S130|S131)
    { gd(6:0) = (d( 8:2) }
if(S61|S78|S81|S94|S105|S106|S120|S125|S136)
    { gd(6:0) = (d( 7:1) }
if(S75|S92|S99|S103|S107|S113|S114|S118|S123|S127|S128|S132|S133|S135|
  S137|S138)
    { gd(6:0) = (d( 6:0) }
if(S1|S13|S30|S75)                            {gs0 =1,all other gs=0}
if(S3|S21|S46|S92)                           {gs1 =1,all other gs=0}
if(S7|S31|S59|S103)                          {gs2 =1,all other gs=0}
if(S14|S47|S76|S118)                         {gs3 =1,all other gs=0}
if(S22|S60|S93|S127)                         {gs4 =1,all other gs=0}
if(S32|S77|S104|S135)                        {gs5 =1,all other gs=0}
if(S2|S6|S8|S11|S26|S33|S39|S53|S61)      {gs6 =1,all other gs=0}
if(S4|S12|S15|S19|S40|S48|S54|S67|S78)      {gs7 =1,all other gs=0}
if(S16|S27|S34|S41|S68|S79|S86|S98|S105)    {gs8 =1,all other gs=0}
if(S49|S69|S80|S87|S112|S119|S122|S131|S136)  {gs9 =1,all other gs=0}
if(S5|S17|S20|S28|S42|S50|S55|S81|S99)       {gs10=1,all other gs=0}
if(S9|S23|S29|S43|S56|S62|S70|S94|S113)     {gs11=1,all other gs=0}
if(S18|S35|S44|S57|S71|S82|S88|S106|S123)    {gs12=1,all other gs=0}
if(S24|S51|S58|S72|S89|S95|S100|S120|S132)   {gs13=1,all other gs=0}
if(S10|S36|S45|S63|S73|S90|S107|S114)        {gs14=1,all other gs=0}
if(S25|S64|S74|S96|S101|S115|S128|S133)     {gs15=1,all other gs=0}
if(S37|S83|S91|S108|S116|S124|S137|S138)    {gs16=1,all other gs=0}
if(S65|S109|S117|S129|S134)                    {gs17=1,all other gs=0}
if(S38|S52|S84|S97|S102|S110|S125)          {gs18=1,all other gs=0}
if(S66|S85|S111|S121|S126|S130)             {gs19=1,all other gs=0}
ci= S6|S11|S26|S39|S53|S12|S19|S40|S54|S67|S27|S41|S68|S86|S98|S69|S87
  |S112|S122|S131
di= S20|S28|S42|S55|S99|S29|S43|S56|S70|S113|S44|S57|S71|S88|S123
  |S58|S72|S89|S100|S132
ei= S45|S73|S90|S114|S74|S101|S115|S133|S91|S116|S124|S138|S117|S134
fi= S102|S125|S126
if(ci|di|ei|fi)    g_inv = 1
else             g_inv = 0
For JX:
jd(8:0) = d(8:0)
if(S1|S3|S7|S14|S22|S32)                   {js0 =1,all other js=0}
if(S13|S21|S31|S47|S60|S77)            {js1 =1,all other js=0}
if(S30|S46|S59|S76|S93|S104)           {js2 =1,all other js=0}
if(S75|S92|S103|S118|S127|S135)        {js3 =1,all other js=0}
if(S2|S4|S16|S49)                          {js4 =1,all other js=0}
if(S8|S15|S34|S80)                         {js5 =1,all other js=0}
if(S33|S48|S79|S119)                     {js6 =1,all other js=0}
if(S61|S78|S105|S136)                  {js7 =1,all other js=0}
if(S5|S9|S18|S24)                           {js8 =1,all other js=0}
if(S17|S23|S35|S51)                       {js9 =1,all other js=0}
if(S50|S62|S82|S95)                       {js10=1,all other js=0}
if(S81|S94|S106|S120)                  {js11=1,all other js=0}
if(S10|S25|S37|S65)                       {js12=1,all other js=0}
if(S36|S64|S83|S109)                     {js13=1,all other js=0}
if(S63|S96|S108|S129)                  {js14=1,all other js=0}
if(S107|S128|S137)                        {js15=1,all other js=0}
if(S38|S66)                                  {js16=1,all other js=0}
if(S52|S85)                                   {js17=1,all other js=0}
if(S84|S111)                                  {js18=1,all other js=0}
if(S97|S121)                                  {js19=1,all other js=0}
if(S110|S130)                               {js20=1,all other js=0}
if(S6|S12|S27|S69)                         {js21=1,all other js=0}
if(S11|S19|S41|S87)                       {js22=1,all other js=0}
if(S26|S40|S68|S112)                     {js23=1,all other js=0}
if(S39|S54|S86|S122)                     {js24=1,all other js=0}

TABLE 8-continued

| | |
|---|---|
| if(S53\|S67\|S98\|S131) | {js25=1,all other js=0} |
| if(S20\|S29\|S44\|S58) | {js26=1,all other js=0} |
| if(S28\|S43\|S57\|S72) | {js27=1,all other js=0} |
| if(S42\|S56\|S71\|S89) | {js28=1,all other js=0} |
| if(S55\|S70\|S88\|S100) | {js29=1,all other js=0} |
| if(S99\|S113\|S123\|S132) | {js30=1,all other js=0} |
| if(S45\|S74\|S91\|S117) | {js31–1,all other js=0} |
| if(S73\|S101\|S116\|S134) | {js32=1,all other js=0} |
| if(S90\|S115\|S124) | {js33=1,all other js=0} |
| if(S114\|S133\|S138) | {js34=1,all other js=0} |
| if(S102\|S126) | {js35=1,all other js=0} |
| if(S125) | {js36=1,all other js=0} |

FIG. 6 is a block diagram illustrating g-group encoder 258 in greater detail. The g-group data bits $gd_{6:0}$ are coupled to the inputs of g-subgroup encoders 320. There is one g-subgroup encoder group 320 for each of the g-subgroups defined in Table 2 above. Each g-subgroup encoder 320 receives the corresponding bits from $gd_{6:0}$ and encodes the bits into a respective 10-bit code word segment according to the mapping in Table 2. The respective g-subgroup code word segments are applied to the inputs of a g-subgroup encoder output multiplexer 322. Output multiplexer 322 has a select input, which is coupled to subgroup select pattern $gs_{19:0}$. Based on which g-subgroup is selected by pattern $gs_{19:0}$, multiplexer 322 passes the corresponding g-subgroup code word segment to output $gw_{9:0}$ as the g-group 10-bit group code word segment. This code word segment is selectively inverted as a function of g_inv.

In one embodiment, g-group encoder 258 operates according to the logic operations shown in Table 9.

TABLE 9 enc gb7

Input: A6, A5, A4, A3, A2, A1, A1
Output: C9, C8, C7, C6, C5, C4, C3, C2, C1, C0
gb7a= (!A5| !A4) &(A1 | A0);
gb7a9= gb7a&!A6;
gb7a8= gb7a& A6;
gb7a7= gb7a& ( A5 |( A4 & A3) );
gb7a6= gb7a & (A4 ^ A3 );
gb7a5= gb7a & !A3;
gb7a4= gb7a& (!A5 &( A3 | !A4) );
gb7a3= gb7a & A2;
gb7a2= gb7a&( A1 &( A0 | !A2) );
gb7a1= gb7a &( A2 A0 );
gb7a0= gb7a&(!A1 | ( !A2 & !A0);
gb7b= (!A5|!A4) & (!A1 &!A0);
gb7b9= gb7b & !A6;
gb7b8= gb7b & A6;
gb7b7= gb7b &( A3 & A2 );
gb7b6= gb7b &( A3 & !A2 );
gb7b5= gb7b &( A2 & !A3 );
gb7b4= gb7b &( !A3 & !A2 );
gb7b3= gb7b;
gb7b2= gb7b &( A5 | A4 );
gb7b1= gb7b & !A4;
gb7b0= gb7b & !A5;
gb7c = A5&A4;
gb7c9= gb7c &!A6;
gb7c8= gb7c & A6;
gb7c7= gb7c &( A1 | A0 );
gb7c6= gb7c &( A1 | !A0 );
gb7c5= gb7c &( A0 | !A1 );
gb7c4= gb7c &( !A1 | !A0 );
gb7c3= gb7c &( A3 & A2 );
gb7c2= gb7c &( A3 & !A2 );
gb7c1= gb7c &( A2 & !A3 );
gb7c0= gb7c &( !A3 & !A2 );
C9 = gb7a9 | gb7b9 | gb7c9;

TABLE 9-continued

C8 = gb7a8 | jgb7b8 | jgb7c8;
C7 = gb7a7 | gb7b7 | gb7c7;
C6 = gb7a6 | gb7b6 | gb7c6;
C5 = gb7a5 | gb7b5 | gb7c5;
C4 = gb7a4 | gb7b4 | gb7c4;
C3 = gb7a3 | gb7b3 | gb7c3;
C2 = gb7a2 | gb7b2 | gb7c2;
C1 = gb7a1 | gb7b1 | gb7c1;
C0 = gb7a0 | gb7b0 | gb7c0;
enc gb6

Input:    A5, A4, A3, A2, A1, A0
Output: C9, C8, C7, C6, C5, C4, C3, C2, C1, C0
gb6a = (!A1&!A0);
gb6a9= gb6a;
gb6a8= gb6a;
gb6a7= gb6a & A4;
gb6a6= gb6a & A4;
gb6a5= gb6a & !A4;
gb6a4= gb6a & !A4;
gb6a3= gb6a &( A3 & A2 );
gb6a2= gb6a &( A3 & !A2 );
gb6a1= gb6a &( A2 & !A3 );
gb6a0= gb6a &( !A3 & !A2 );
gb6b = (A1|A0);
gb6b9= gb6b;
gb6b8= gb6b;
gb6b7= gb6b &( A4 & A3 );
gb6b6= gb6b &( A4 & !A3 );
gb6b5= gb6b &( A3 & !!A4 );
gb6b4= gb6b &( !A4 & !A3 );
gb6b3= gb6b & A2;
gb6b2= gb6b &( A1 &( A0 | !A2) );
gb6b1= gb6b &( A2 ^ A0 );
gb6b0= gb6b&(!A1 | ( !A2 & !A0) );
C9 = gb6a9 |gb6b9;
C8 = gb6a8 |gb6b8;
C7 = gb6a7 |gb6b7;
C6 = gb6a6 |gb6b6;
C5 = gb6a5 |gb6b5;
C4 = gb6a4 |gb6b4;
C3 = gb6a3 |gb6b3;
C2 = gb6a2 |gb6b2;
C1 = gb6a1 |gb6b1;
C0 = gb6a1 |gb6b0;
if (A5) { C9=!C9; C8=!C8; C7=!C7; C6=!C6; C5 =!C5;
          C4=!C4; C3=!C3; C2=!C2; C1=!C1; C0=!C0; }
enc gb5

Input:     A4, A3, A2, A1, A0
Output:   C9, C8, C7, C6, C5, C4, C3, C2, C1, C0
C9= 1;
C8= 1;
C7= A3;
C6= !A3;
C5= A2;
C4= !A2;
C3= ( A1 & A0);
C2= ( A1 & !A0 );
C1= ( A0 & !A1 );

TABLE 9-continued

```
C0= ( !A1 & !A0 );
if (A4)   { C9=!C9; C8=!C8; C7=!C7; C6=!C6; C5=!C5;
           C4=!C4; C3=!C3; C2=!C2; C1=!C1; C0=!C0; }
enc gb4

Input: A3, A2, A1, A0
Output: C9, C8, C7, C6, C5, C4, C3, C2, C1, C0
C9= 1;
C8= 1;
C7= ( A2 &( A1 | A0) );
C6= ( A2 &( A1 | !A0) );
C5= ( A2 &( A0 | !A1) );
C4= ( A2 &( !A1 | !A0) );
C3= (!A2 &( A1 | A0) );
C2= (!A2 &( A1 | !A0) );
C1= (!A2 &( A0 | !A1) );
C0= (!A2 &( !A1 | !A0) );
if (A3)   { C9=!C9; C8=!C8; C7=!C7; C6=!C6; C5=!C5;
           C4=!C4; C3=!C3; C2=!C2; C1=!C1; C0=!C0; }
enc gb3

Input: A2, A1, A0
Output: C9, C8, C7, C6, C5, C4, C3, C2, C1, C0
C9= A2;
C8= !A2;
C7= ( A1 & A0 );
C6= ( A1 & !A0 );
C5= ( A0 & !A1 );
C4= ( !A1 & !A0 );
C3= 0;
C2= 1;
C1= 1;
C0= 1;
enc gb2

Input: A1, A0
Output: C9, C8, C7, C6, C5, C4, C3, C2, C1, C0
C9= A0;
C8= !A0;
C7= A1;
C6= A1;
C5= A1;
C4= A1;
C3= !A1;
C2= !A1;
C1= !A1;
C0= !A1;
enc gc7

Input: A6, A5, A4, A3, A2, A1, A0
Output: C9, C8, C7, C6, C5, C4, C3, C2, C1, C0
gc7a= (!A5) & ( ( !A4) 51 (A4 &!A3) );
gc7a9= gc7a&!A6;
gc7a8= gc7a& A6;
gc7a7= gc7a&( A3 | ( A4 & A2) );
gc7a6= gc7a&(!A3 & ( A2 | !A4) );
gc7a5= gc7a &( A4 ^ A2 );
gc7a4= gc7a & !A2;
gc7a3= gc7a &( A1 | A0 );
gc7a2= gc7a & ( A1 | !A0 );
gc7a1= gc7a & ( A0 | !A1 );
gc7a0= gc7a & ( !A1 | !A0 );
gc7b= (!A5&A4&A3) | (A5&!A4);
gc7b9= gc7b&!A6;
gc7b8= gc7b& A6;
gc7b7= gc7b & ( A1 | A0 );
gc7b6= gc7b & ( A1 | !A0 );
gc7b5= gc7b & ( A0 | !A1 );
gc7b4= gc7b & ( !A1 | !A0 );
gc7b3= gc7b & ( A3 &( A5 | A2) );
gc7b2= ge7b& (!A3 | ( A4 & A2) );
gc7b1= gc7b & ( A5 ^ !A2 );
gc7b0= gc7b & !A2,
gc7cd= A5&A4&!A3;
gc7cd9= gc7cd& !A6;
gc7cd8= gc7cd& A6;
gc7cd7= gc7cd& ( A2 | ( A1 & A0) );
gc7cd6= gc7cd& ( A2 | ( A1 & !A0) );
gc7cd5= gc7cd& ( A2 | ( A0 & !A1) );
gc7cd4= gc7cd& ( A2 | ( !A1 & !A0) );
gc7cd3= gc7cd& (!A2 | ( A1 & A0) );
gc7cd2= gc7cd& (!A2 | ( A1 & !A0) );
gc7cd1= gc7cd& (!A2 | ( A0 & !A1) );
gc7cd0= gc7cd& (!A2 | ( !A1 & !A0) );
gc7e = A5&A4&A3;
gc7e9= 0;
gc7e8= 0;
gc7e7= gc7e & ( A1 | A0 );
gc7e6= gc7e & ( A1 | !A0 );
gc7e5= gc7e & ( A0 | !A1 );
gc7e4= gc7e & ( !A1 | !A0 );
gc7e3= gc7e & ( A6 | A2 );
gc7e2= gc7e & ( A6 | !A2 );
gc7e1= gc7e & ( A2 | !A6 );
gc7e0= gc7e & ( !A6 | !A2 );
C9 = gc7a9 |gc7b9 |gc7cd9 |gc7e9;
C8 = gc7a8 |gc7b8 |gc7cd8 |gc7e8;
C7 = gc7a7 |gc7b7 |gc7cd7 |gc7e7;
C6 = gc7a6 |gc7b6 |gc7cd6 |gc7e6;
C5 = gc7a5 |gc7b5 |gc7cd5 |gc7e5;
C4 = gc7a4 |gc7b4 |gc7cd4 |gc7e4;
C3 = gc7a3 |gc7b3 |gc7cd3 |gc7e5;
C2 = gc7a2 |gc7b2 |gc7cd2 |gc7e2;
C1 = gc7a1 |gc7b1 |gc7cd1 |gc7e1;
C0 = gc7a0 |gc7b0 |gc7cd0 |gc7e0;
enc gc6

Input:    A5, A4, A3, A2, A1, A0
Output: C9, C8, C7, C6, C5, C4, C3, C2, C1, C0
gc6a= (!A5 | !A4) & (A1 | A0);
gc6a9= gc6a;
gc6a8= gc6a;
gc6a7= gc6a& ( A5 | ( A4 & A3) );
gc6a6= gc6a & ( A4 ^ A3 );
gc6a5= gc6a & !A3;
gc6a4= gc6a & (!A5 & ( A3 | A4) );
gc6a3= gc6a & A2;
gc6a2= gc6a & ( A1 & ( A0 | !A2) );
gc6a1= gc6a & ( A2 ^ A0 );
gc6a0= gc6a& (A1 | ( !A2 & !A0) );
gc6b = (!A5 | !A4) & (!A1 & !A0);
gc6b9= gc6b;
gc6b8= gc6b;
gc6b7= gc6b & ( A3 & A2 );
gc6b6= gc6b & ( A3 & !A2 );
gc6b5= gc6b & ( A2 & !A3 );
gc6b4= gc6b & ( !A3 & !A2 );
gc6b3= gc6b;
gc6b2= gc6b & ( A5 | A4 );
gc6b1= gc6b & !A4;
gc6b0= gc6b & !A5;
gc6c= (A5&A4);
gc6c9= gc6c;
gc6c8= gc6c;
gc6c7= gc6c & ( A1 | A0 );
gc6c6= gc6c & ( A1 | !A0 );
gc6c5= gc6c & ( A0 | !A1 );
gc6c4= gc6c & ( !A1 | !A0 );
gc6c3= gc6c & ( A3 & A2 );
gc6c2= gc6c & ( A3 & !A2 );
gc6c1= gc6c & ( A2 & !A3 );
gc6c0= gc6c & ( !A3 & !A2 );
C9 = gc6a9 |gc6b9 |gc6c9;
C8 = gc6a8 |gc6b8 |gc6c8;
C7 = gc6a7 |gc6b7 |gc6c7;
C6 = gc6a6 |gc6b6 |gc6c6;
C5 = gc6a5 |gc6b5 |gc6c5;
C4 = gc6a4 |gc6b4 |gc6c4;
C3 = gc6a3 |gc6b3 |gc6c3;
C2 = gc6a2 |gc6b2 |gc6c2;
C1 = gc6a1 |gc6b1 |gc6c1;
C0 = gc6a0 |gc6b0 |gc6c0;
enc gc4

Input:    A3, A2, A1, A0
Output: C9, C8, C7, C6, C5, C4, C3, C2, C1, C0
gc4ab = A1 | A0;
gc4ab9= 0;
```

TABLE 9-continued

```
gc4ab8= 0;
gc4ab7= gc4ab & ( A3 | A2 );
gc4ab6= gc4ab& ( A3 | ( A1 &( A0 | !A2) ));
gc4ab5= gc4ab& ( A3 | ( A2 ^ A0) );
gc4ab4= gc4ab& ( A3 |(!A1 | ( !A2 & !A0) ));
gc4ab3= gc4ab & ( A2 | !A3 );
gc4ab2= gc4ab& (!A3 | ( A1 &( A0 | !A2) ));
gc4ab1= gc4ab& (!A3 | ( A2 ^ A0) );
gc4ab0= gc4ab& (!A3 |(!A1 | ( !A2 & !A0) ));
gc4c = (!A1&!A0);
gc4c9= gc4c;
gc4c8= gc4c;
gc4c7= gc4c &( A3 & A2 );
gc4c6= gc4c &( A3 & !A2 );
gc4c5= gc4c &( A2 & !A3 );
gc4c4= gc4c &( !A3 & !A2 );
gc4c3= 0;
gc4c2= gc4c;
gc4c1= gc4c;
gc4c0= gc4c;
C9 = gc4ab9 |gc4c9;
C8 = gc4ab8 |gc4c8;
C7 = gc4ab7 |gc4c7;
C6 = gc4ab6 |gc4c6;
C5 = gc4ab5 |gc4c5;
C4 = gc4ab4 |gc4c4;
C3 = gc4ab3 |gc4c3;
C2 = gc4ab2 |gc4c2;
C1 = gc4ab1 |gc4c1;
C0 = gc4ab0 |gc4c0;
enc gc1

Input:    A0
Output: C9, C8, C7, C6, C5, C4, C3, C2, C1, C0
C9= 1;
C8= 1;
C7= A0;
C6= A0;
C5= A0;
C4= A0;
C3= !A0;
C2= !A0;
C1= !A0;
C0= !A0;
enc gd6

Input:    A5, A4, A3, A2, A1, A0
Output: C9, C8, C7, C6, C5, C4, C3, C2, C1, C0
gd6a = (!A5) & ( (!A4) | (A4&!A3) );
gd6a9= gd6a;
gd6a8= gd6a;
gd6a7= gd6a& ( A3 | ( A4 & A2) );
gd6a6= gd6a& (!A3 &( A2 | !A4) );
gd6a5= gd6a & ( A4 ^ A2 );
gd6a4= gd6a & !A2;
gd6a3= gd6a & ( A1 | A0 );
gd6a2= gd6a & ( A1 | !A0 );
gd6a1= gd6a & ( A0 | !A1 );
gd6a0= gd6a & ( !A1 | !A0 );
gd6b= (!A5&A4&A3) | (A5&!A4);
gd6b9= gd6b;
gd6b8= gd6b;
gd6b7= gd6b & ( A1 | A0 );
gd6b6= gd6b & ( A1 | !A0 );
gd6b5= gd6b & ( A0 | !A1 );
gd6b4= gd6b & ( !A1 | !A0 );
gd6b3= gd6b& ( A3 & ( A5 | A2) );
gd6b2= gd6b&(!A3 | ( A4 & A2) );
gd6b1= gd6b & ( A5 ^ !A2 );
gd6b0= gd6b & !A2;
gd6cd = A5&A4&!A3;
gd6cd9= gd6cd;
gd6cd8= gd6cd;
gd6cd7= gd6cd& ( A2 | ( A1 & A0) );
gd6cd6= gd6cd& ( A2 | ( A1 & !A0) );
gd6cd5= gd6cd& ( A2 | ( A0 & !A1) );
gd6cd4= gd6cd& ( A2 | ( !A1 & !A0) );
gd6cd3= gd6cd& (!A2 | ( A1 & A0) );
gd6cd2= gd6cd& (!A2 | ( A1 & !A0) );
gd6cd1= gd6cd& (!A2 | ( A0 & !A1) );
gd6cd0= gd6cd& (!A2 | ( !A1 & !A0) );
gd6ef = A5&A4&A3;
gd6ef9= 0;
gd6ef8= 0;
gd6ef7= gd6ef &( A2 | A1 | A0 );
gd6ef6= gd6ef &( A2 | A1 | !A0 );
gd6ef5= gd6ef &( A2 | A0 | !A1 );
gd6ef4= gd6ef &( A2 | !A1 | !A0 );
gd6ef3= gd6ef &( A1 | A0 | !A2 );
gd6ef2= gd6ef &( A1 | !A2 | !A0 );
gd6ef1= gd6ef &( A0 | !A2 | !A1 );
gd6ef0= gd6ef &( !A2 | !A1 | !A0 );
C9 = gd6a9 |gd6b9 |gd6cd9 |gd6ef9;
C8 = gd6a8 |gd6b8 |gd6cd8 |gd6ef8;
C7 = gd6a7 |gd6b7 |gd6cd7 |gd6ef7;
C6 = gd6a6 |gd6b6 |gd6cd6 |gd6ef6;
C5 = gd6a5 |gd6b5 |gd6cd5 |gd6ef5;
C4 = gd6a4 |gd6b4 |gd6cd4 |gdEef4;
C3 = gd6a3 |gd6b3 |gd6cd3 |gd6ef3;
C2 = gd6a2 |gd6b2 |gd6cd2 |gd6ef2;
C1 = gd6a1 |gd6b1 |gd6cd1 |gd6ef1;
C0 = gd6a0 |gd6b0 |gd6cd0 |gd6ef0;
enc gd5

Input:    A4, A3, A2, A1, A0
Output: C9, C8, C7, C6, C5, C4, C3, C2, C1, C0
C9= !A4;
C8= A4;
C7= ( A1 | A0 );
C6= ( A1 | !A0 );
C5= ( A0 | !A1 );
C4= ( !A1 | !A0 );
C3= ( A3 | A2 );
C2= ( A3 | !A2 );
C1= ( A2 | !A3 );
C0= ( !A3 | !A2 );
enc gd4

Input:    A3, A2, A1, A0
Output: C9, C8, C7, C6, C5, C4, C3, C2, C1, C0
C9= A2;
C8= !A2;
C7= ( A3 | A1 );
C6= ( A3 | !A1 );
C5= ( A3 | A0 );
C4= ( A3 | !A0 );
C3= ( A1 | !A3 );
C2= ( !A3 | !A1 );
C1= ( A0 | !A3 );
C0= ( !A3 | !A0 );
enc gd3

Input:    A2, A1, A0
Output: C9, C8, C7, C6, C5, C4, C3, C2, C1, C0
C9 = A1;
C8 = !A1;
C7 = ( A2 | A0 );
C6 = ( A2 | A0 );
C5 = ( A2 | !A0 );
C4 = ( A2 | !A0 );
C3 = ( A0 | !A2 );
C2 = ( A0 | !A2 );
C1 = ( !A2 | !A0 );
C0 = ( !A2 | !A0 );
enc ge5

Input:    A4, A3, A2, A1, A0
Output: C9, C8, C7, C6, C5, C4, C3, C2, C1, C0
ge5a = !A4;
ge5a9= ge5a;
ge5a8= ge5a;
ge5a7= gesa &( A3 | A2 );
ge5a6= ge5a &( A3 | !A2 );
ge5a5= ge5a &( A2 | !A3 );
ge5a4= ge5a &( !A3 | !A2 );
ge5a3= ge5a &( A1 | A0 );
ge5a2= ge5a &( A1 | !A0 );
ge5a1= ge5a &( A0 | !A1 );
```

TABLE 9-continued

```
ge5a0= ge5a &( !A1 | !A0 );
ge5bc = A4;
ge5bc9= ge5bc & A2;
ge5bc8= ge5bc & !A2;
ge5bc7= ge5bc &( A3 | A1 A0 );
ge5bc6= ge5bc &( A3 | A1 | !A0 );
ge5bc5= ge5bc &( A3 | A0 | !A1 );
ge5bc4= ge5bc &( A3 | !A1 | !A0 );
ge5bc3= ge5bc &( A1 | A0 | !A3 );
ge5bc2= ge5bc &( A1 | !A3 | !A0 );
ge5bc1= ge5bc &( A0 | !A3 | !A1 );
ge5bc0= ge5bc &( !A3 | !A1 | !A0 );
C9 = ge5a9 |ge5bc9;
C8 = ge5a8 |ge5bc8;
C7 = ge5a7 |ge5bc7;
C6 = ge5a6 |ge5bc6;
C5 = ge5a5 |ge5bc5;
C4 = ge5a4 |ge5bc4;
C3 = ge5a3 |ge5bc3;
C2 = ge5a2 |ge5bc2;
C1 = ge5a1 |ge5bc1;
C0 = ge5a0 |ge5bc0;
enc ge3

Input:     A2, A1, A0
Output: C9, C8, C7, C6, C5, C4, C3, C2, C1, C0
C9= 1;
C8= 1;
C7= ( A2 | A1 );
C6= ( A2 | !A1 );
C5= ( A2 | A0 );
C4= ( A2 | !A0 );
C3= ( A1 | !A2 );
C2= ( !A2 | !A1);
C1= ( A0 | !A2 );
C0= ( !A2 | !A0 );
enc ge2

Input:     A1, A0
Output: C9, C8, C7, C6, C5, C4, C3, C2, C1, C0
C9= 1;
C8= 1;
C7= ( A1 | A0 );
C6= ( A1 | A0 );
C5= ( A1 | !A0 );
C4= ( A1 | !A0 );
C3= ( A0 | !A1 );
C2= ( A0 | !A1 );
C1= ( !A1 | !A0 );
C0= ( !A1 | !A0 );
enc ge0

Output: C9, C8, C7, C6, C5, C4, C3, C2, C1, C0
C9= 0;
C8= 0;
C7= 1;
C6= 1;
C5= 1;
C4= 1;
C3= 1;
C2= 1;
C1= 1;
C0= 1;
enc gf3

Input:     A2, A1, A0
Output: C9, C8, C7, C6, C5, C4, C3, C2, C1, C0
C9= 1;
C8= 1;
C7= ( A2 | A1 | A0 );
C6= ( A2 | A1 | !A0 );
C5= ( A2 | A0 | !A1 );
C4= ( A2 | !A1 | !A0 );
C3= ( A1 | A0 | !A2 );
C2= ( A1 | !A2 | !A0 );
C1= ( A0 | !A2 |0 !A1 );
C0= ( !A2 | !A1 | !A0 );
```

TABLE 9-continued

```
enc gf1

Input:     A0
Output: C9, C8, C7, C6, C5, C4, C3, C2, C1, C0
C9= A0;
C8= !A0;
C7= 1;
C6= 1;
C5= 1;
C4= 1;
C3= 1;
C2= 1;
C1= 1;
C0= 1;
enc gg0

Output: C9, C8, C7, C6, C5, C4, C3, C2, C1, C0
C9= 1;
C8= 1;
C7= 1;
C6= 1;
C5= 1;
C4= 1;
C3= 1;
C2= 1;
C1= 1;
C0= 1;
Note: gg0 is only used in JX Encoder but not in GX Encoder
GX Encoder Output Mux Input: gb7(9:0), gb6(9:0), gb5(9:0), gb4(9:0), gb3(9:0), gb2(9:0),
       gc7(9:0), gc6(9:0), gc4(9:0), gc1(9:0),
       gd6(9:0), gd5(9:0), gd4(9:0), gd3(9:0), ge5(9:0), ge3(9:0), ge2(9:0),
       ge0(9:0), gf3(9;0), gf1(9:0), g_sel(19:0)
Output: gw(9:0)
If(g_sel0)     {gw(9:0) = gb7(9:0)}
If(g_sel1)     {gw(9:0) = gb6(9:0)}
If(g_sel2)     {gw(9:0) = gb5(9:0)}
If(g_sel3)     {gw(9:0) = gb4(9:0)}
If(g_sel4)     {gw(9:0) = gb3(9:0)}
If(g_sel5)     {gw(9:0) = gb2(9:0)}
If(g_sel6)     {gw(9:0) = gc7(9:0)}
If(g_sel7)     {gw(9:0) = gc6(9:0)}
If(g_sel8)     {gw(9:0) = gc4(9:0)}
If(g_sel9)     {gw(9:0) = gc1(9:0)}
If(g_sel10)    {gw(9:0) = gd6(9:0)}
If(g_sel11)    {gw(9:0) = gd5(9:0)}
If(g_sel12)    {gw(9:0) = gd4(9:0)}
If(g_sel13)    {gw(9:0) = gd3(9:0)}
If(g_sel14)    {gw(9:0) = ge5(9:0)}
If(g_sel15)    {gw(9:0) = ge3(9:0)}
If(g_sel16)    {gw(9:0) = ge2(9:0)}
If(g_sel17)    {gw(9:0) = ge0(9:0)}
If(g_sel18)    {gw(9:0) = gf3(9:0)}
If(g_sel19)    {gw(9:0) = gf1(9:0)}
```

J-group encoder 260 (shown in FIG. 3) operates in a similar fashion as g-group encoder 258. FIG. 7 is a block diagram illustrating j-group encoder 260 in greater detail. J-group encoder 260 includes a plurality of j-subgroup encoders 330 and a j-group encoder output multiplexer 332. All of the j-subgroup encoders 330 are identical to the g-subgroup encoders 320 shown in FIG. 6. Each subgroup encoder 330 receives the respective bits of $jd_{7:0}$ and encodes those bits into a corresponding j-group 10-bit code word segment for selection by multiplexer 322. Multiplexer 332 selects the appropriate code word segment based on the j-group select pattern $js_{36:0}$. The selected code word segment is applied to j-group code word output $jw_{9:0}$.

Table 10 illustrates the logical operations performed by j-group encoder 260 according to one embodiment of the present invention.

TABLE 10

JX Encoder Output Mux

Input: gb7(9:0), gb6(9:0), gb5(9:0), gb4(9:0), gb3(9:0), gb2(9:0), gc7(9:0), gc6(9:0), gc4(9:0), gc1(9:0), gd6(9:0), gd5(9:0), gd4(9:0), gd3(9:0), ge5(9:0), ge3(9:0), ge2(9:0), ge0(9:0), gf3(9:0), gf1(9:0), gg0(9:0), A(7:0), js(36:0)
Output: jw(9:0)
ub7 = (js0 | js12) & !A7
ub6 = (js0 | js12) & A7 & !A6
ub5 = (js0 | js12) & A7 & A6 & !A5
ub4 = (js0 | js12) & A7 & A6 & A5 & !A4
ub3 = (js0 | js12) & A7 & A6 & A5 & A4 & !A3
ub2 = (js2 | js14) & !A2
uc7 = (js8 & !A7) | js21
uc6 = (js8 & A7 & !A6) | js22
uc4 = (js9 & A5 & !A4) | js23
uc1 = js11 | (js25 & !A1)
ud6 = (js4 & A7 & A6) | js26
ud5 = (js5 & !A5) | js27
ud4 = (js5 & A5 & A4) | js28
ud3 = js6 | js29
ue5 = js1 | js31
ue3 = (js0 & A7 & A6 & A5 & A4 & A3) | js32
ue2 = (js2 & A2) | js33
ue0 = js3 | js34
uf3 = js24 | js35
uf1 = (js25 & A1) | js36
ug0 = js30
vc7 = (js4 & !A7) | js16
vc6 = (js4 & A7 & !A6) | js17
vc4 = (js5 & A5 & !A4) | js18
vc1 = js7 | (js20 & !A1)
vd6 = (js8 & A7 & A6)
vd5 = (js9 & !A5)
vd4 = (js9 & A5 & A4)
vd3 = js10
ve5 = js13
ve3 = (js12 & A7 & A6 & A5 & A4 & A3)
ve2 = (js14 & A2)
ve0 = js15
vf3 = js19
vf1 = (js20 & A1)
if(ud7)  jw(9:0)= gb7(9:0)
if(ud6)  jw(9:0)= gb6(9:0)
if(ud5)  jw(9:0)= gb5(9:0)
if(ud4)  jw(9:0)= gb4(9:0)
if(ud3)  jw(9:0)= gb3(9:0)
if(ud2)  jw(9:0)= gb2(9:0)
if(uc7)  jw(9:0)= gc7(9:0)
if(uc6)  jw(9:0)= gc6(9:0)
if(uc4)  jw(9:0)= gc4(9:0)
if(uc1)  jw(9:0)= gc1(9:0)
if(ud6)  jw(9:0)= gd6(9:0)
if(ud5)  jw(9:0)= gd5(9:0)
if(ud4)  jw(9:0)= gd4(9:0)
if(ud3)  jw(9:0)= gd3(9:0)
if(ue5)  jw(9:0)= ge5(9:0)
if(ue3)  jw(9:0)= ge3(9:0)
if(ue2)  jw(9:0)= ge2(9:0)
if(ue0)  jw(9:0)= ge0(9:0)
if(uf3)  jw(9:0)= gf3(9:0)
if(uf1)  jw(9:0)= gf1(9:0)
if(ug0)  jw(9:0)= gg0(9:0)

TABLE 10-continued

JX Encoder Output Mux if(vc7)  jw(9:0)= gc7(9:0)
if(vc6)  jw(9:0)= gc6(9:0)
if(vc4)  jw(9:0)= gc4(9:0)
if(vc1)  jw(9:0)= gc1(9:0)
if(vd6)  jw(9:0)= gd6(9:0)
if(vd5)  jw(9:0)= gd5(9:0)
if(vd4)  jw(9:0)= gd4(9:0)
if(vd3)  jw(9:0)= gd3(9:0)
if(ve5)  jw(9:0)= ge5(9:0)
if(ve3)  jw(9:0)= ge3(9:0)
if(ve2)  jw(9:0)= ge2(9:0)
if(ve0)  jw(9:0)= ge0(9:0)
if(vf3)  jw(9:0)= gf3(9:0)
if(vf1)  jw(9:0)= gf1(9:0)

FIG. 8 is a block diagram, which illustrates encoder output circuit 262 (shown in FIG. 3) in greater detail. Encoder output circuit 262 includes code word generator 350 and RDS calculator 352. In one embodiment, code word generator 350 concatenates the g-group 10-bit code word segment $gw_{9:0}$ with the j-group 10-bit code word segment $jw_{9:0}$ to form a 20-bit code word on output $Y_{19:0}$.

RDW calculator 352 calculates the next state based on the current state and the running digital sum of the current 20-bit code word provided on code word output $Y_{19:0}$. However if the current state is "1" (current RDS equals six) and the RDS of $Y_{19:0}$ is six, then RDS calculator 352 inverts the 20-bit code word such that the cumulative RDS and the next state become "0". The resulting 20-bit code word is output to code word output $W_{19:0}$. An interleave circuit 354 can be used if desired, to interleave adjacent 20-bit code words as discussed above.

Table 11 illustrates the logical operations performed by encoder output circuit 262 according to one embodiment of the present invention.

TABLE 11

Form Code Word

Y(19:10) = gw(9:0);
Y( 9: 0) = jw(9:0);
if( Y(19:0)==0xAAAAA )   Y(19:0) = 0xC03F3;
if( Y(19:0)==0x55555 )   Y(19:0) = 0xC03FC;
RDS Calculator HW=Y19+Y18+Y17+Y16+Y15+Y14+Y13+Y12+Y11+Y10+Y9+Y8+Y7+Y6+Y5+Y4+Y3+Y2+Y1+Y0
RDS = (2*HW)–20

TABLE 11-continued

Note that Hamming weight (HW) of the code word Y(19:0) is the sum of the 20 code bits. The running digital sum (RDS) of the code word is calculated by subtracting the number of "0" by the number of "1" in the code word. For example, if there are 13 "1"(HW=13) and number of "0" is (20−HW), the RDS is HW−(20−HW)= (2*HW)−20.
In a sequence of code words, the cumulative RDS is the RDS of all bits from the beginning of the first code word to the end of the current code word. Note that the cumulative RDS in this design must be equal to either 0, or 6. This number determines the state of the encoder (state=0 when cumulative RDS is 0, state=1 when cumulative RDS is 6.
if(state==0 && RDS==0)  { next state=0;   W(19:0) = Y(19:0); }
if(state==0 && RDS==6)  { next state=1;   W(19:0) = Y(19:0); }
if(state==1 && RDS==0)  { next state=1;   W(19:0) = Y(19:0); }
if(state==1 && RDS==6)  { next state=0;   W(19:0) = !Y(19:0); }

2. Decoder

FIG. 9 is a block diagram of a decoder 400 for decoding 20-bit code words $W_{19:0}$ into corresponding 18-bit user data words $I_{17:0}$ with each cycle of WORD CLOCK. Decoder 400 includes decoder input circuit 402, g-group decoder 404, j-group decoder 406 and decoder output circuit 408, which are shown in more detail in FIGS. 10–19.

Decoder input circuit 402 receives a 20-bit code word $W_{19:0}$ with each rising edge of WORD CLOCK. Decoder input circuit 402 generates a corresponding g-group 10-bit code segment $gcp_{9:0}$ and a corresponding j-group 10-bit code segment $jcp_{9:0}$. The g-group code segments are selectively inverted, based on the running digital sum of the code word $W_{19:0}$.

G-group decoder 404 decodes the g-group 10-bit segment $gcp_{9:0}$ into a corresponding g-group data word $gdw_{6:0}$ and a corresponding G-type according to Tables 2 and 4 above. The G-type corresponds to the pattern listed in the G-type column of Table 4.

Similarly, j-group decoder 406 decodes the j-group 10-bit code segment $jcp_{9:0}$ into a corresponding j-group data word $jdw_{7:0}$ and a corresponding J-type. Again, the J-type pattern corresponds to the pattern provided in the corresponding J-type column in Table 4.

Decoder output circuit 408 regenerates the first, second and third user data word fragments from the g-group and j-group data words and the corresponding G- and J-types and outputs the resulting 18-bit user data word onto output $I_{17:0}$.

FIG. 10 is a block diagram, which illustrates decoder input circuit 402 in greater detail. Decoder input circuit 402 includes 20-bit code word register 410, RDS evaluator 412 and input multiplexer 414. The rising edge of WORD CLOCK is used to clock the 20-bit code word $W_{19:0}$ into register 410. RDS evaluator 412 calculates the running digital sum of the latched code word $WM_{19:0}$ and generates a selective inversion signal SI if the running digital sum is less than zero. The RDS of code word $wm_{19:0}$ is:

RDS = (2*HW) − 20, where HW is the Hamming weight of $wm_{19:0}$.
If (RDS<0), then SI = 1;
else, SI = 0.

Input multiplexer 414 selectively inverts the code word $wm_{19:0}$ as a function of signal SI, and separates the bits into the g-group code segment $gcp_{9:0}$ and the j-group code segment $jcp_{9:0}$. Input multiplexer 414 also substitutes the pattern 0xAAAAA for 0xC03F3 and the pattern 0x55555 for the pattern 0xC03FC, which where eliminated during encoding to avoid undesirable strings of code words. An example of the input multiplexer operation is shown in FIG. 10A.

Table 12 illustrates the logical operations performed by input multiplexer 414, according to one embodiment of the present invention.

TABLE 12

| INPUT MUX |
|---|
| if( wm(19:0)==0xC03F3)           wm(19:0) = 0xAAAAA; |
| if( wm(19:0)==0xC03FC)           wm(19:0) = 0x55555; |
| if(SI=0)      { gcp(9:0)= wm(19:10);   jcp(9:0)= wm(9:0); } |
| else          { gcp(9:0)=!wm(19:10);   jcp(9:0)=!wm(9:0); } |

FIG. 11 is a block diagram, which illustrates g-group decoder 404 in greater detail. G-group decoder 404 includes a digital sum circuit 420, which generates a five-bit signed value $gds_{4:0}$ representing the digital sum of $gcp_{9:0}$. The possible values of $gds_{4:0}$ are 8, 6, 4, 2, 0, −2, −4, −6 and −8. If the digital sum is less than 0, inverter circuit 422 inverts $gcp_{9:0}$ to generate $gw_{9:0}$.

Pattern generator 424 generates a 36-bit pattern that identifies one of the 36 possible g-subgroups with which $gw_{9:0}$ can belong, as defined by Table 2 above. G-subgroup decoders 426 receive g-group code segment $gw_{9:0}$ and decodes the segment according to the 36-bit subgroup select pattern and generates a corresponding g-subgroup data word fragment and G-type for output multiplexer 428. Output multiplexer 428 selects the data word fragment and the G-type from the appropriate g-subgroup decoder 426 based on the g-subgroup select signal $gds_{4:0}$.

Table 13 illustrates the logical operation performed by some of the elements in g-group decoder 404, according to one embodiment of the present invention.

TABLE 13

GX Decoder

Input:     gcp(9:0)
Output:    gdw(6:0), Gtype(7:0), gm(3:0)
get ds

Input:     gcp(9:0)
Output:    gds(4:0)
gds(4:0) is a 5-bit signed value representing the digital sum of gcp(9:0). The possible values of gds(4:0) are 8, 6, 4, 2, 0, −2, −4, −6, and −8.
Let HW be the Hamming weight of gcp(9:0), then gds(4:0)= (2*HW)−10
Inverter Input:     gcp(9:0), gds(4:0)
Output:    gw(9:0)
If (gds>= 0)     {gw(9:0) = gcp(9:0)    }
else             {gw(9:0) = !gcp(9:0)   }

TABLE 13-continued gen p10

```
Input:      A(9:0)
Output:     x(3:0), y(15:0), z(15:0)
x[3]=A9&A8;     x[2]=A9&!A8;    x[1]=!A9&A8;    x[0]=!A9&!A8;
  y[15]= A7& A6& A5& A4;              z[15]= A3& A2& A1& A0;
  y[14]= A7& A6& A5&!A4;              z[14]= A3& A2& A1&!A0;
  y[13]= A7& A6&!A5& A4;              z[13]= A3& A2&!A1& A0;
  y[12]= A7& A6&!A5&!A4;              z[12]= A3& A2&!A1&!A0;
  y[11]= A7&!A6& A5& A4;              z[11]= A3&!A2& A1& A0;
  y[10]= A7&!A6& A5&!A4;              z[10]= A3&!A2& A1&!A0;
  y[ 9]= A7&!A6&!A5& A4;              z[ 9]= A3&!A2&!A1& A0;
  y[ 8]= A7&!A6&!A5&!A4;              z[ 8]= A3&!A2&!A1&!A0;
  y[ 7]=!A7& A6& A5& A4;              z[ 7]=!A3& A2& A1& A0;
  y[ 6]=!A7& A6& A5&!A4;              z[ 6]=!A3& A2& A1&!A0;
  y[ 5]=!A7& A6&!A5& A4;              z[ 5]=!A3& A2&!A1& A0;
  y[ 4]=!A7& A6&!A5&!A4;              z[ 4]=!A3& A2&!A1&!A0;
  y[ 3]=!A7&!A6& A5& A4;              z[ 3]=!A3&!A2& A1& A0;
  y[ 2]=!A7&!A6& A5&!A4;              z[ 2]=!A3&!A2& A1&!A0;
  y[ 1]=!A7&!A6&!A5& A4;              z[ 1]=!A3&!A2&!A1& A0;
  y[ 0]=!A7&!A6&!A5&!A4;              z[ 0]=!A3&!A2&!A1&!A0;
```

FIG. 12 is a block diagram, which illustrates "gb-" subgroup decoder 426 in greater detail. The gb-subgroup decoder 426 includes pattern decode circuit 440, gb-subgroup decoders 442 and multiplexer 444. Pattern decode circuit 440 generates a 6-bit select signal gb, which identifies the gb-subgroup (e.g., gb6) to which the g-group code segment $gw_{9:0}$ belongs. Pattern decode circuit 440 also generates a three-bit signal $gp_{2:0}$, which helps decode subgroups gb6 and gb7.

The gb-subgroup decoders 442 decode $gw_{9:0}$ into corresponding data word fragments according to Table 2. Multiplexer 444 selects the appropriate data word fragment from the appropriate gb-subgroup based on the select signal gb provided by pattern decode circuit 440. Multiplexer 444 also generates a gb-type output $GBGT_{7:0}$, which identifies the corresponding G-type that is selected by multiplexer 428 in FIG. 11.

Table 14 illustrates the logical operations performed by gb-subgroup decoder 426.

TABLE 14 dec gb

```
Input:      gw(9:0), x(3:0), y(15:0), z(15:0)
Output:     gbdw(6:0),  gbgt(7:0)
Pattern Decode Input:      x(3:0), y(15:0), z(15:0)
Output:     gb7,gb6,gb5,gb4,gb3,gb2, gp(2:0)
  gb7= (x[2]|x[1])& !(y[0]|y[15]|z[7]);
  gb5= (x[3]|x[0])& (y[10]|y[9]|y[6]|y[5]);
  gb4= (x[3]|x[0])& (y[15]|y[0]|z[15]|z[0]);
  gb6= (x[3]|x[0])& !(gb5|gb4);
  gb3= (x[2]|x[1])& (z[7]);
  gb2= (x[2]|x[1])& (y[15]|y[0]);
  if( gb7 )
  {
     gp[1]= y[1]|y[2]|y[4]|y[8];
     gp[2]= z[1]|z[2]|z[4]|z[8];
     gp[0]= !(gp[1]|gp[2]);
  }
  if( gb6 )
  {
     gp[0]= z[1]|z[2]|z[4]|z[8];
     gp[1]= z[14]|z[13]|z[11]|z[7];
  }
dec gb7

Input:      A9,A8,A7,A6,A5,A4,A3,A2,A1,A0,  gp(2:0)
Output:     D6,D5,D4,D3,D2,D1,D0
  gb7a= gp[0];
  gb7b= gp[1];
  gb7c= gp[2];
  gb7a5= gb7a &( A7 & !A4 );
  gb7a4= gb7a &( A7 ^ !A4 );
  gb7a3= gb7a & !A5;
  gb7a2= gb7a & A3;
  gb7a1= gb7a &( A2 | !A0 );
  gb7a0= gb7a &( A3 ^ A1 );
  gb7b5= gb7b & !A0;
  gb7b4= gb7b & !A1;
  gb7b3= gb7b &( A7 | A6 );
  gb7b2= gb7b &( A7 | A5 );
  gb7b1= 0;
  gb7b0= 0;
  gb7c5= gb7c;
  gb7c4= gb7c;
  gb7c3= gb7c &( A3 | A2 );
  gb7c2= gb7c &( A3 | A1 );
  gb7c1= gb7c &( !A5 | !A4 );
  gb7c0= gb7c &( !A6 | !A4 );
  D6 = A8;
  D5 = gb7a5 |gb7b5 |gb7c5;
  D4 = gb7a4 |gb7b4 |gb7c4;
  D3 = gb7a3 |gb7b3 |gb7c3;
  D2 = gb7a2 |gb7b2 |gb7c2;
  D1 = gb7a1 |gb7b1 |gb7c1;
  D0 = gb7a0 |gb7b0 |gb7c0;
dec gb6

Input:      A9,A8,A7,A6,A5,A4,A3,A2,A1,A0,  gp(1:0)
Output:     D5,D4,D3,D2,D1,D0
  gb6a= gp[0];
  gb6b= !gb6a;
  if(!A9)
  {   A7=!A7;       A6=!A6;      A5=!A5;
      A3=!A3;       A2=!A2;      A1=!A1;      A0=!A0;
      gb6a= gp[1];
      gb6b= !gb6a;
  }
  gb6a4= gb6a & A7;
  gb6a3= gb6a &( A3 | A2 );
  gb6a2= gb6a &( A3 | A1 );
  gb6a1= 0;
  gb6a0= 0;
  gb6b4= gb6b &( A7 | A6 );
  gb6b3= gb6b &( A7 | A5 );
  gb6b2= gb6b & A3;
  gb6b1= gb6b &( A2 | !A0 );
  gb6b0= gb6b &( A3 ^ A1 );
  D5 = !A9;
  D4 = gb6a4 |gb6b4;
  D3 = gb6a3 |gb6b3;
  D2 = gb6a2 |gb6b2;
  D1 = gb6a1 |gb6b1;
  D0 = gb6a0 |gb6b0;
dec gb5

Input:      A9,A8,A7,A6,A5,A4,A3,A2,A1,A0
Output:     D4,D3,D2,D1,D0
  if(!A9)
  {   A7=!A7;       A5=!A5;
      A3=!A3;       A2=!A2;      A1=!A1;
  }
  D4= !A9;
  D3= A7;
  D2= A5;
  D1= ( A3 | A2 );
  D0= ( A3 | A1 );
dec gb4

Input:      A9,A8,A7,A6,A5,A4,A3,A2,A1,A0
Output:     D3,D2,D1,D0
  if(!A8)
  {   A9=!A9;       A7=!A7;      A6=!A6;      A5=!A5;
      A4=!A4;       A2=!A2;      A1=!A1;      A0=!A0;
  }
  D3= !A8;
  D2= ( A7 | A6 );
  D1= ( A9 & ((A5 ^ A4) | (A1 ^ A0)) );
  D0= ( A9 & ((A6 ^ A4) | (A2 ^ A0)) );
```

TABLE 14-continued

```
dec gb3

Input:   A9,A8,A7,A6,A5,A4,A3,A2,A1,A0
    Output:  D2,D1,D0
    D2= A9;
    D1= ( A7 | A6 );
    D0= ( A7 | A5 );
dec gb2

Input:   A9,A8,A7,A6,A5,A4,A3,A2,A1,A0
    Output:  D1,D0
    D1= A7;
    D0= A9;
Mux gb Input:   gb7D(6:0),gb6D(5:0),gb5D(4:0),gb4D(3:0),gb3D(2:0),
             gb2D(1:0)
             gb7,gb6,gb5,gb4,gb3,gb2
    Output:  gbdw(6:0), gbgt(7:0)
    if(gb7)  {gbdw(6:0)= gb7D(6:0),
              gbgt(7:0)=[0,0,0,0,0,1,1,1]                      }
    if(gb6)  {gbdw(5:0)= gb6D(5:0), gbdw(6)= 0,
              gbgt(7:0)=[0,0,0,0,0,1,1,0]                      }
    if(gb5)  {gbdw(4:0)= gb5D(4:0), gbdw(6:5)=[0,0],
              gbgt(7:0)=[0,0,0,0,0,1,0,1]                      }
    if(gb4)  {gbdw(3:0)= gb4D(3:0), gbdw(6:4)=[0,0,0],
              gbgt(7:0)=[0,0,0,0,0,1,0,0]                      }
    if(gb3)  {gbdw(2:0)= gb3D(2:0), gbdw(6:3)=[0,0,0,0],
              gbgt(7:0)=[0,0,0,0,0,0,1,1]                      }
    if(gb2)  {gbdw(1:0)= gb2D(1:0), gbdw(6:2)=[0,0,0,0,0],
              gbgt(7:0)=[0,0,0,0,0,0,1,0]                      }
```

Note:
In gbgt(7:0)=[0,0,0,0,0,1,1,1], the leading bit or leftmost bit is bit 7 and the trailing bit or rightmost bit is bit 0.

FIGS. 13–16 illustrate gc-, gd-, ge-, and gf-subgroup decoders 426, respectively, in greater detail. These subgroup decoders operate similar to the gb-subgroup decoder shown and described with respect to FIG. 12. The logical operations performed by the gc-, gd-, ge-, and gf-subgroup decoders shown in FIGS. 13–16 are illustrated in Tables 15–18, respectively.

TABLE 15

```
dec gc

Input:   gw(9:0), x(3:0), y(15:0), z(15:0)
Output:  gcdw(6:0), gcgt(7:0)
Pattern Decode
Input:   x(3:0), y(15:0), z(15:0)
Output:  gc7,gc6,gc4,gc1, gp(5:0)
    gc7= x[2]|x[1]|(x[0]&(!y[15]&!z[15]));
    gc6= x[3]&(!z[0]&!z[7]&!z[15]);
    gc4= (x[0]&(y[15]|z[15])) | (x[3]&z[7]);
    gc1= x[3]&(z[0]|z[15]);
    if( gc7 )
    {   gp[0]= (x[2]|x[1])&(z[14]|z[13]|z[11]|z[7]);
        gp[1]= (x[2]|x[1])&(y[14]|y[13]|y[11]|y[7]);
        gp[2]= (x[2]|x[1])&z[15];
        gp[3]= x[0]&(!y[15]|!z[15]);
        gp[4]= (x[0]&(z[13]|z[14]));
    }
    if( gc6 )
    {   gp[0]= x[3]&(z[3]|z[5]|z[6]|z[9]|z[10]|z[12]);
        gp[1]= x[3]&(z[11]|z[13]|z[14]);
        gp[2]= x[3]&(z[1]|z[2]|z[4]|z[8]);
    }
    if( gc4 )
    {   gp[0]=   x[0]&z[15];
        gp[1]=   x[3]&z[7];
    }
dec gc7

Input:   A9,A8,A7,A6,A5,A4,A3,A2,A1,A0,  gp(4:0)
Output:  D6,D5,D4,D3,D2,D1,D0
```

TABLE 15-continued

```
    gc7a  = gp[0];
    gc7b  = gp[1];
    gc7cd = gp[2];
    gc7e  = gp[3];
    gc7a5 = 0;
    gc7a4 = gc7a &( A7 ^ !A6 );
    gc7a3 = gc7a &( A7 & !A6 );
    gc7a2 = gc7a & !A4;
    gc7a1 = gc7a &( !A1 | !A0 );
    gc7a0 = gc7a &( !A2 | !A0 );
    gc7b5 = gc7b &( A3 ^ A2 );
    gc7b4 = gc7b &( A3 ^ !A2 );
    gc7b3 = gc7b &( A3 | !A2 );
    gc7b2 = gc7b & !A0;
    gc7b1 = gc7b &( !A5 | !A4 );
    gc7b0 = gc7b &( !A6 | !A4 );
    gc7cd5= gc7cd;
    gc7cd4= gc7cd;
    gc7cd3= 0;
    gc7cd2= gc7cd &( !A3 | !A2 );
    gc7cd1= gc7cd&((!A7 & (A7 ^ A6)) | ( A7 & (A1 ^ !A0)));
    gc7cd0= gc7cd&(( A7 & (A7 ^ A6)) | ( A5 & (A2 ^ !A0)));
    gc7e5 = gc7e;
    gc7e4 = gc7e;
    gc7e3 = gc7e;
    gc7e2 = gc7e &( !A2 | !A0 );
    gc7e1 = gc7e &( !A5 | !A4 );
    gc7e0 = gc7e &( !A6 | !A4 );
    D6 = A8|gp[4];
    D5 = gc7a5 |gc7b5 |gc7cd5 |gc7e5;
    D4 = gc7a4 |gc7b4 |gc7cd4 |gc7e4;
    D3 = gc7a3 |gc7b3 |gc7cd3 |gc7e3;
    D2 = gc7a2 |gc7b2 |gc7cd2 |gc7e2;
    D1 = gc7a1 |gc7b1 |gc7cd1 |gc7e1;
    D0 = gc7a0 |gc7b0 |gc7cd0 |gc7e0;
dec gc6

Input:   A9,A8,A7,A6,A5,A4,A3,A2,A1,A0, gp(4:0)
Output:  D5,D4,D3,D2,D1,D0
    gc6a = gp[0];
    gc6b = gp[1];
    gc6c = gp[2];
    gc6a5 = gc6a &( A7 & !A4 );
    gc6a4 = gc6a &( A7 ^ !A4 );
    gc6a3 = gc6a & !A5;
    gc6a2 = gc6a & A3;
    gc6a1 = gc6a &( A2 | !A0 );
    gc6a0 = gc6a &( A3 ^ A1 );
    gc6b5 = gc6b & !A0;
    gc6b4 = gc6b & !A1;
    gc6b3 = gc6b &( A7 | A6 );
    gc6b2 = gc6b &( A7 | A5 );
    gc6b1 = 0;
    gc6b0 = 0;
    gc6c5 = gc6c;
    gc6c4 = gc6c;
    gc6c3 = gc6c &( A3 | A2 );
    gc6c2 = gc6c &( A3 | A1 );
    gc6c1 = gc6c &( !A5 | !A4 );
    gc6c0 = gc6c &( !A6 | !A4 );
    D5 = gc6a5 |gc6b5 |gc6c5;
    D4 = gc6a4 |gc6b4 |gc6c4;
    D3 = gc6a3 |gc6b3 |gc6c3;
    D2 = gc6a2 |gc6b2 |gc6c2;
    D1 = gc6a1 |gc6b1 |gc6c1;
    D0 = gc6a0 |gc6b0 |gc6c0;
dec gc4

Input:   A9,A8,A7,A6,A5,A4,A3,A2,A1,A0, gp(4:0)
Output:  D3,D2,D1,D0
    gc4ab = gp[0];
    gc4c  = gb[1];
    gc4ab3= gc4ab &( !A3 | !A2 | !A1 );
    gc4ab2= gc4ab &( A7 & A3 );
    gc4ab1= gc4ab&(!A4 | (!A0 | ( A6 & A2 )));
    gc4ab0= gc4ab&(!A9 & ((A7 ^ A5) | (A3 ^ A1)) );
    gc4c3 = gc4c &( A7 | A6 );
    gc4c2 = gc4c &( A7 | A5 );
    gc4c1 = 0;
```

TABLE 15-continued

```
    gc4c0=  0;
    D3 = gc4ab3 |gc4c3;
    D2 = gc4ab2 |gc4c2;
    D1 = gc4ab1 |gc4c1;
    D0 = gc4ab0 |gc4c0;
dec gc1

Input:   A9,A8,A7,A6,A5,A4,A3,A2,A1,A0
Output:  D0
    D0= A7;
Mux gc

Input:   gc7D(6:0),gc6D(5:0), gc4D(3:0),gc1D(0)
             gc7,gc6,gc4,gc1
    Output:  gcdw(6:0), gcgt(7:0)
    if(gc7)  {gcdw(6:0)= gc7D(6:0),
              gcgt(7:0)=[0,0,0,1,0,1,1,1] }
    if(gc6)  {gcdw(5:0)= gc6D(5:0), gcdw(6)=0,
              gcgt(7:0)=[0,0,0,1,0,1,1,0]         }
    if(gc4)  {gcdw(3:0)= gc4D(3:0), gcdw(6:4)=[0,0,0]
              gcgt(7:0)=[0,0,0,1,0,1,0,0]         }
    if(gc1)  {gcdw(0)= gc1D(0),     gcdw(6:1)=[0,0,0,0,0,0]
              gcgt(7:0)=[0,0,0,1,0,0,0,1]         }
```

TABLE 16

```
dec gd

Input:   gw(9:0), x(3:0), y(15:0), z(15:0)
Output:  gddw(6:0),  gdgt(7:0)
Pattern Decode Input:   x(3:0), y(15:0), z(15:0)
Output:  gd6,gd5,gd4,gd3, gp(3:0)
    gd6= x[3]|x[0];
    gd5= (x[2]|x[1]) &(!y[15]&!z[15]);
    gd4= (x[2]|x[1]) &( (y[15]&(!z[3]&!z[12]))|(z[15]&(!y[3]&!y[12])) );
    gd3= (x[2]|x[1]) &( (y[15]&( z[3]| z[12]))|(z[15]&( y[3]| y[12])) );
    if( gd6 )
    {   gp[0] = z[7]|z[11]|z[13]|z[14];
        gb[1] = y[7]|y[11]|y[13]|y[14];
        gp[2] = x[3]&(y[15]|z[15]);
        gp[3] = x[0]&(y[15]|z[15]);
    }
dec gd6

Input:   A9,A8,A7,A6,A5,A4,A3,A2,A1,A0,  gp(3:0)
Output:  D5,D4,D3,D2,D1,D0
    gd6a = gp[0];
    gd6b = gp[1];
    gd6cd= gp[2];
    gd6ef= gp[3];
    gd6a5=  0;
    gd6a4=  gd6a &(  A7 ^ !A6 );
    gd6a3=  gd6a &(  A7 & !A6 );
    gd6a2=  gd6a & !A4;
    gd6a1=  gd6a &(  !A1 | !A0 );
    gd6a0=  gd6a &(  !A2 | !A0 );
    gd6b5=  gd6b &(  A3 ^  A2 );
    gd6b4=  gd6b &(  A3 ^ !A2 );
    gd6b3=  gd6b &(  A3 | !A2 );
    gd6b2=  gd6b & !A0;
    gd6b1=  gd6b &(  !A5 | !A4 );
    gd6b0=  gd6b &(  !A6 | !A4 );
    gd6cd5= gd6cd;
    gd6cd4= gd6cd;
    gd6cd3= 0;
    gd6cd2= gd6cd &( !A3 | !A2 );
    gd6cd1= gd6cd&( A9 & ((A7 ^ A6) | (A3 ^ A2)) );
    gd6cd0= gd6cd&( A9 & ((A7 ^ A5) | (A3 ^ A1)) );
    gd6ef5= gd6ef;
    gd6ef4= gd6ef;
    gd6ef3= gd6ef;
    gd6ef2= gd6ef &( !A3 | !A2 | !A1 | !A0 );
    gd6ef1= gd6ef &( !A5 | !A4 | !A1 | !A0 );
    gd6ef0= gd6ef &( !A6 | !A4 | !A2 | !A0 );
```

TABLE 16-continued

```
    D5 = gd6a5 |gd6b5 |gd6cd5 |gd6ef5;
    D4 = gd6a4 |gd6b4 |gd6cd4 |gd6ef4;
    D3 = gd6a3 |gd6b3 |gd6cd3 |gd6ef3;
    D2 = gd6a2 |gd6b2 |gd6cd2 |gd6ef2;
    D1 = gd6a1 |gd6b1 |gd6cd1 |gd6ef1;
    D0 = gd6a0 |gd6b0 |gd6cd0 |gd6ef0;
dec gd5

Input:   A9,A8,A7,A6,A5,A4,A3,A2,A1,A0
Output:  D4,D3,D2,D1,D0
    D4=  !A9;
    D3= ( !A1 | !A0 );
    D2= ( !A2 | !A0 );
    D1= ( !A5 | !A4 );
    D0= ( !A6 | !A4 );
dec gd4

Input:   A9,A8,A7,A6,A5,A4,A3,A2,A1,A0
Output:  D3,D2,D1,D0
    D3= ( !A3 | !A2 );
    D2=  A9;
    D1= ( !A6 !A2 );
    D0= ( !A4 !A0 );
dec gd3

Input:   A9,A8,A7,A6,A5,A4,A3,A2,A1,A0
Output:  D2,D1,D0
    D2 = ( !A3 | !A1 );
    D1 =  A9;
    D0 = ( !A5 | !A1 );
Mux gd Input:   gd6D(5:0),gd5D(4:0),gd4D(3:0),gd3D(2:0)
             gd6,gd5,gd4,gd3
    Output:  gddw(6:0), gdgt(7:0)
    if(gd6)  {gddw(5:0)= gd6D(5:0),  gddw(6)= 0,
              gdgt(7:0)=[0,0,1,0,0,1,1,0]         }
    if(gd5)  {gddw(4:0)= gd5D(4:0), gcdw(6:5)=[0,0],
              gdgt(7:0)=[0,0,1,0,0,1,0,1]         }
    if(gd4)  {gddw(3:0)= gd4D(3:0), gcdw(6:4)=[0,0,0],
              gdgt(7:0)=[0,0,1,0,0,1,0,0]         }
    if(gd3)  {gddw(2:0)= gd3D(2:0), gcdw(6:3)=[0,0,0,0],
              gdgt(7:0)=[0,0,1,0,0,0,1,1]         }
```

TABLE 17

```
dec ge

Input:   gw(9:0), x(3:0), y(15:0), z(15:0)
Output:  gedw(6:0), gegt(7:0)
Pattern Decode Input:   x(3:0), y(15:0), z(15:0)
Output:  ge5,ge3, gp(1:0)
    ge5= x[2]|x[1]|(x[3]&(!y[15]&!z[15]));
    ge3= x[3]&(y[15]|z[15])&(!(y[3]|y[12]|z[3]|z[12]));
    ge2= x[3]&(y[15]|z[15])&((y[3]|y[12]|z[3]|z[12]));
    ge0= x[0];
    if( ge5 )
    {       gp[0] = x[3];
            gp[1] = y[15]|z[15];
    }
dec ge5

Input:   A9,A8,A7,A6,A5,A4,A3,A2,A1,A0,  gp(1:0)
Output:  D4,D3,D2,D1,D0
    ge5a =  gp[0];
    ge5bc=  gp[1];
    ge5a4=  0;
    ge5a3=  ge5a &( !A5 | !A4 );
    ge5a2=  ge5a &( !A6 | !A4 );
    ge5a1=  ge5a &( !A1 | !A0 );
    ge5a0=  ge5a &( !A2 | !A0 );
    ge5bc4= ge5bc;
    ge5bc3= ge5bc &( !A3 | !A2 | !A1 | !A0 );
    ge5bc2= ge5bc & A9;
```

TABLE 17-continued

```
    ge5bc1=  ge5bc &( !A5 | !A4 | !A1 | !A0 );
    ge5bc0=  ge5bc &( !A6 | !A4 | !A2 | !A0 );
    D4 = ge5a4 |ge5bc4;
    D3 = ge5a3 |ge5bc3;
    D2 = ge5a2 |ge5bc2;
    D1 = ge5a1 |ge5bc1;
    D0 = ge5a0 |ge5bc0;
dec ge3

Input:    A9,A8,A7,A6,A5,A4,A3,A2,A1,A0
Output:   D2,D1,D0
    D2=  ( !A3 | !A2 );
    D1=  ( !A6 | !A2 );
    D0=  ( !A4 | !A0 );
dec ge2

Input:    A9,A8,A7,A6,A5,A4,A3,A2,A1,A0
Output:   D1,D0
    D1=  ( !A3 | !A1 );
    D0=  ( !A5 | !A1 );
Mux ge Input:   ge5D(4:0) ,ge3D(2:0) ,ge2D(1:0)
             ge5,ge3,ge2,ge0
    Output:  gedw(6:0), gegt(7:0)
    if(ge5)  {gedw(4:0)= ge5D(4:0), gedw(6:5)=[0,0],
             gegt(7:0)=[0,0,1,1,0,1,0,1]         }
    if(ge3)  {gedw(2:0)= ge3D(2:0), gedw(6:3)=[0,0,0,0],
             gegt(7:0)=[0,0,1,1,0,0,1,1]         }
    if(ge2)  {gedw(1:0)= ge2D(1:0), gedw(6:2)=[0,0,0,0,0],
             gegt(7:0)=[0,0,1,1,0,0,1,0]         }
    if(ge0)  {gedw(6:0)=[0,0,0,0,0,0,0],
             gegt(7:0)=[0,0,1,1,0,0,0,0]         }
```

TABLE 18

```
dec gf

Input:     gw(9:0), x(3:0), y(15:0), z(15:0)
Output:    gfdw(6:0), gfgt(7:0)
Pattern Decode Input:     x(3:0), y(15:0), z(15:0)
Output:    gp(1:0)
    gf3= x[3];
    gf1= !x[3];
dec gf3

Input:    A9,A8,A7,A6,A5,A4,A3,A2,A1,A0,   gp(1:0)
Output:   D2,D1,D0
    D2=  ( !A3 | !A2 | !A1 | !A0 );
    D1=  ( !A5 | !A4 | !A1 | !A0 );
    D0=  ( !A6 | !A4 | !A2 | !A0 );
dec gf1

Input:    A9,A8,A7,A6,A5,A4,A3,A2,A1,A0
Output:   D0
    D0= A9;
Mux gf

Input:   gf3D(2:0), gf1D(0)
             gf3,gf1
    Output:  gfdw(6:0), gfgt(7:0)
    if(gf3)  {gfdw(2:0)= gf3D(2:0),  gfdw(6:3)=[0,0,0,0],
             gfgt(7:0)=[0,1,0,0,0,0,1,1]         }
    if(gf1)  {gfdw(0)= gf1D(0),      gfdw(6:1)=[0,0,0,0,0,0],
             gfgt(7:0)=[0,1,0,0,0,0,0,1]         }
GX Output Mux Input:   gbdw(6:0), gcdw(6,0), gddw(6,0), gedw(6,0), gfdw(6,0),
             gbgt(7:0), gcgt(7,0), gdgt (7,0), gegt(7,0), gfgt(7,0),
             gds(4:0)
    Output:  gdw(6:0), Gtype(7:0), gm(3:0)
    if(gds==0)  {gdw(6:0)=gbdw(6:0);    Gtype(7:0)=gbgt(7:0);   }
    if(gds==2)  {gdw(6:0)=gcdw(6:0);    Gtype(7:0)=gcgt(7:0);   }
    if(gds==4)  {gdw(6:0)=gddw(6:0);    Gtype(7:0)=gdgt(7:0);   }
    if(gds==6)  {gdw(6:0)=gedw(6:0);    Gtype(7:0)=gegt(7:0);   }
    if(gds==8)  {gdw(6:0)=gfdw(6:0);    Gtype(7:0)=gfgt(7:0);   }
    if(gds==-2) {gdw(6:0)=gcdw(6:0);    Gtype(7:0)=gcgt(7:0)|0x80;  }
    if(gds==-4) {gdw(6:0)=gddw(6:0);    Gtype(7:0)=gdgt(7:0)|0x80;  }
    if(gds==-6) {gdw(6:0)=gedw(6:0);    Gtype(7:0)=gegt(7:0)|0x80;  }
    if(gds==-8) {gdw(6:0)=gfdw(6:0);    Gtype(7:0)=gfgt(7:0)|0x80;  }
    gm(3:0)=Gtype(7:4);
```

FIG. 17 is a block diagram, which illustrates j-group decoder 406 (shown in FIG. 9) in greater detail. J-group decoder 406 includes input circuit 500, j-subgroup decoders 502 and output multiplexer 504. Input circuit 500 receives the j-group 10-bit code segment $jcp_{9:0}$ and the most significant four bits $gm_{3:0}$ of the G-type from g-group decoder 404 (shown in FIG. 9). Input circuit 500 generates a 10-bit j-group word segment $jw_{9:0}$, which is selectively inverted, and generates a five-bit digital sum value $jds_{4:0}$ for the segment and a 36-bit subgroup select signal XYZ. J-subgroup decoders 502 decode the j-group code segment $jw_{9:0}$ based on the XYZ select signal and the definitions provided in Table 2. J-subgroup decoders 502 are identical to g-subgroup decoders 426 shown in FIG. 11. Output circuit 504 selects the appropriate output from j-subgroup decoders 502 to form the j-group user data word fragment $jdw_{7:0}$ and the corresponding J-type$_{7:0}$.

FIG. 18 is a block diagram, which illustrates input circuit 500 in greater detail. Input circuit 500 includes inverters 510 and 512, digital sum calculator 514 and pattern generator 516. Inverter 500 selectively inverts the j-group code segment $jcp_{9:0}$ as a function of the G-type bits $gm_{3:0}$ and produces a selectively inverted output $ju_{9:10}$. Digital sum calculator 514 calculates the digital sum, $jds_{4:0}$, of $ju_{9:0}$, wherein the possible values of $jds_{4:0}$ are 10, 8, 6, 4, 2, 0, −2, −4, −6 and −8. If $jds_{4:0}$ is less than zero, $ju_{9:0}$ must be inverted again, and invert select signal nj is activated. Inverter 512 selectively inverts $ju_{9:0}$ as a function of the signal nj and produces the j-group code segment $jw_{9:0}$ for decoding. Pattern generator 516 generates a 36-bit select pattern XYZ based on the pattern formed by $jw_{9:0}$.

Table 19 illustrates the logical operations performed by input circuit 500, according to one embodiment of the present invention.

TABLE 19

```
INV A

Input:    jcp(9:0), gm(3:0)
Output:   ju(9:0)
    ju(9:0) = jcp(9:0);
    if (gm(3:0) == 0x2)   { ju(9:0) = ! jcp(9:0); }
    if (gm(3:0) == 0x3)   { ju(9:0) = ! jcp(9:0); }
    if (gm(3:0) == 0x9)   { ju(9:0) = ! jcp(9:0); }
get jds Input:    ju(9:0)
Output:   nj, jds(5,0)
get_jds calculates the digital sum of ju(9:0)
Let HW be the Hamming weight of ju(9:0), then its digital sum, jds =
(2*HW)-10
The possible values of jds(4:0) are 10, 8, 6, 4, 2, 0, -2, -4, -6, and -8.
    if ( jds < 0 )    nj=1;
    else              nj=0;
INV B Input:    ju(9:0), nj
Output:   jw(9:0)
    if (nj == 1)    { jw(9:0) = !ju(9:0); }
    else            { jw(9:0) = ju(9:0); }
gen p10 is the same as that in GX Decoder.
```

Table 20 illustrates the logical operations performed by j-group output circuit 504 shown in FIG. 17.

TABLE 20

JX Output

```
Input:    gbdw(6:0), gcdw(6:0), gddw(6:0), gedw(6:0), gfdw(6:0),
          gbgt(7:0), gcgt(7:0), gdgt(7:0), gegt(7:0), gfgt(7:0),
          gm(3:0), jds(4:0)
Output:   jdw(7:0), jt(7,0)
if (gm(3:0) = 0x0) or (gm(3:0) = 0x3)
{   if (jds= 0)
    {   if (gbgt == 0x07) { jdw(7:0)=(gbdw(6:0)&0x7F);        jt=0x08; }
        if (gbgt == 0x06) { jdw(7:0)=(gbdw(6:0)&0x3F)|0x80;   jt=0x08; }
        if (gbgt == 0x05) { jdw(7:0)=(gbdw(6:0)&0x1F)|0xC0;   jt=0x08; }
        if (gbgt == 0x04) { jdw(7:0)=(gbdw(6:0)&0x0F)|0xE0;   jt=0x08; }
        if (gbgt == 0x03) { jdw(7:0)=(gbdw(6:0)&0x07)|0xF0;   jt=0x08; }
        if (gbgt == 0x02) { jdw(7:0)=(gbdw(6:0)&0x03);        jt=0x03; }
    }
    if (jds= 6)
    {   if (gegt == 0x35) { jdw(7:0)=(gedw(6:0)&0x1F);        jt=0x05; }
        if (gegt == 0x33) { jdw(7:0)=(gedw(6:0)&0x07)|0xF8;   jt=0x08; }
        if (gegt == 0x32) { jdw(7:0)=(gedw(6:0)&0x03)|0x04;   jt=0x03; }
        if (gegt == 0x30) { jdw(7:0)=(0x00);                  jt=0x00; }
    }
    if (gm(3:0) = 0x3)      { jt = (jt&0x0F)|0x30; }
}
if (gm(3:0) = 0x1) or (gm(3:0) = 0x2)
{   if (jds= -2)
    {   if (gcgt == 0x17) { jdw(7:0)=(gcdw(6:0)&0x7F);        jt=0x18; }
        if (gcgt == 0x16) { jdw(7:0)=(gcdw(6:0)&0x3F)|0x80;   jt=0x18; }
        if (gcgt == 0x14) { jdw(7:0)=(gcdw(6:0)&0x0F)|0x20;   jt=0x16; }
        if (gcgt == 0x11) { jdw(7:0)=(gcdw(6:0)&0x01);        jt=0x11; }
    }
    if (jds= 4)
    {   if (gdgt == 0x26) { jdw(7:0)=(gddw(6:0)&0x3F)|0xC0;   jt=0x18; }
        if (gdgt == 0x25) { jdw(7:0)=(gddw(6:0)&0x1F);        jt=0x16; }
        if (gdgt == 0x24) { jdw(7:0)=(gddw(6:0)&0x0F)|0x30;   jt=0x16; }
        if (gdgt == 0x23) { jdw(7:0)=(gddw(6:0)&0x07);        jt=0x13; }
    }
    if (gm(3:0) = 0x2)      { jt = (jt&0x0F)|0x20; }
}
if (gm(3:0) == 0x4) or (gm(3:0) = 0x9)
{   if (jds= -2)
    {   if (gcgt == 0x17) { jdw(7:0)=(gcdw(6:0)&0x7F);        jt=0x47; }
        if (gcgt == 0x16) { jdw(7:0)=(gcdw(6:0)&0x3F);        jt=0x46; }
        if (gcgt == 0x14) { jdw(7:0)=(gcdw(6:0)&0x0F);        jt=0x44; }
        if (gcgt == 0x11) { jdw(7:0)=(gcdw(6:0)&0x01);        jt=0x42; }
    }
    if (jds= -8)
    {   if (gfgt == 0x43) { jdw(7:0)=(gfdw(6:0)&0x07);        jt=0x43; }
        if (gfgt == 0x41) { jdw(7:0)=(gfdw(6:0)&0x01)|0x02;   jt=0x42; }
    }
    if (gm(3:0) = 0x9)      { jt = (jt&0x0F)|0x90; }
}
if (gm(3:0) = 0xA)
{   if (jds= 4)
    { if (gdgt = 0x26)    { jdw(7:0)=(gddw(6:0)&0x3F);
      jt=0xA6; }
        if (gdgt = 0x25)    { jdw(7:0)=(gddw(6:0)&0x1F);
      jt=0xA5; }
        if (gdgt = 0x24)    { jdw(7:0)=(gddw(6:0)&0x0F);
      jt=0xA4; }
        if (gdgt = 0x23)    { jdw(7:0)=(gddw(6:0)&0x07);
      jt=0xA3; }
    }
    if (jds= 10)
    {     jdw(7:0)=(0x00); jt=0xA0;
    }
}
if (gm(3:0) = 0xB)
{   if (gegt = 0x35)      { jdw(7:0)=(gedw(6:0)&0x1F);        jt=0xB5; }
    if (gegt = 0x33)      { jdw(7:0)=(gedw(6:0)&0x07);        jt=0xB3; }
    if (gegt = 0x32)      { jdw(7:0)=(gedw(6:0)&0x03);        jt=0xB2; }
    if (gegt = 0x30)      { jdw(7:0)=(0x00);                  jt=0xB0; }
}
if (gm(3:0) = 0xC)
{   if (gfgt = 0x43)      { jdw(7:0)=(gfdw(6:0)&0x07);        jt=0xC3; }
    if (gfgt = 0x41)      { jdw(7:0)=(gfdw(6:0)&0x01);        jt=0xC1; }
}
```

FIG. 19 is a block diagram, which illustrates decoder output circuit 408 (shown in FIG. 9) in greater detail. Decoder output circuit 408 combines the appropriate bits of g-group data word fragment $dgw_{6:0}$ and j-group data wprd fragment $jdw_{7:0}$ according to Table 4 and the values of the $G\text{-type}_{7:0}$ and $J\text{-type}_{7:0}$ to produce the original 18-bit user data word $I_{17:0}$.

Table 21 illustrates the logical operations performed by decoder output circuit 408, according to one embodiment of the present invention.

TABLE 21

Decoder Output

```
Input:   gdw(6:0), jdw(7:0), Gtype(7:0), Jtype(7:0)
Output:  I(18:0)
if( (gt==0x07)&&(jt==0x08) )  { I (17:15)=[0,0,0];
   I(14:8)=gdw(6:0);            I(7:0)=jdw(7:0);     }
if( (gt==0x17)&&(jt==0x18) )  { I (17:15)=[0,0,1];
   I(14:8)=gdw(6:0);            I(7:0)=jdw(7:0);     }
if( (gt==0x06)&&(jt==0x08) )  { I (17:14)=[0,1,0,0];
   I(13:8)=gdw(5:0);            I(7:0)=jdw(7:0);     }
if( (gt==0x16)&&(jt==0x18) )  { I (17:14)=[0,1,0,1];
   I(13:8)=gdw(5:0);            I(7:0)=jdw(7:0);     }
if( (gt==0x26)&&(jt==0x28) )  { I (17:14)=[0,1,1,0];
   I(13:8)=gdw(5:0);            I(7:0)=jdw(7:0);     }
if( (gt==0x97)&&(jt==0x97) )  { I (17:14)=[0,1,1,1];
   I(13:7)=gdw(6:0);            I(6:0)=jdw(6:0);     }
if( (gt==0x05)&&(jt==0x08) )  { I (17:13)=[1,0,0,0,0];
   I(12:8)=gdw(4:0);            I(7:0)=jdw(7:0);     }
if( (gt==0x17)&&(jt==0x16) )  { I (17:13)=[1,0,0,0,1];
   I(12:6)=gdw(6:0);            I(5:0)=jdw(5:0);     }
if( (gt==0x25)&&(jt==0x28) )  { I (17:13)=[1,0,0,1,0];
   I(12:8)=gdw(4:0);            I(7:0)=jdw(7:0);     }
if( (gt==0x35)&&(jt==0x38) )  { I (17:13)=[1,0,0,1,1];
   I(12:8)=gdw(4:0);            I(7:0)=jdw(7:0);     }
if( (gt==0x97)&&(jt==0x96) )  { I (17:13)=[1,0,1,0,0];
   I(12:6)=gdw(6:0);            I(5:0)=jdw(5:0);     }
if( (gt==0x96)&&(jt==0x97) )  { I (17:13)=[1,0,1,0,1];
   I(12:7)=gdw(6:0);            I(6:0)=jdw(6:0);     }
if( (gt==0x07)&&(jt==0x05) )  { I (17:12)=[1,0,1,1,0,0];
   I(11:5)=gdw(6:0);            I(4:0)=jdw(4:0);     }
if( (gt==0x04)&&(jt==0x08) )  { I (17:12)=[1,0,1,1,0,1];
   I(11:8)=gdw(3:0);            I(7:0)=jdw(7:0);     }
if( (gt==0x16)&&(jt==0x16) )  { I (17:12)=[1,0,1,1,1,0];
   I(11:6)=gdw(5:0);            I(5:0)=jdw(5:0);     }
if( (gt==0x14)&&(jt==0x18) )  { I (17:12)=[1,0,1,1,1,1];
   I(11:8)=gdw(3:0);            I(7:0)=jdw(7:0);     }
if( (gt==0x26)&&(jt==0x26) )  { I (17:12)=[1,1,0,0,0,0];
   I(11:6)=gdw(5:0);            I(5:0)=jdw(5:0);     }
if( (gt==0x24)&&(jt==0x28) )  { I (17:12)=[1,1,0,0,0,1];
   I(11:8)=gdw(3:0);            I(7:0)=jdw(7:0);     }
if( (gt==0x96)&&(jt==0x96) )  { I (17:12)=[1,1,0,0,1,0];
   I(11:6)=gdw(5:0);            I(5:0)=jdw(5:0);     }
if( (gt==0xA6)&&(jt==0xA6) )  { I (17:12)=[1,1,0,0,1,1];
   I(11:6)=gdw(5:0);            I(5:0)=jdw(5:0);     }
if( (gt==0x06)&&(jt==0x05) )  { I (17:11)=[1,1,0,1,0,0,0];
   I(10:5)=gdw(5:0);            I(4:0)=jdw(4:0);     }
if( (gt==0x03)&&(jt==0x08) )  { I (17:11)=[1,1,0,1,0,0,1];
   I(10:8)=gdw(2:0);            I(7:0)=jdw(7:0);     }
if( (gt==0x25)&&(jt==0x26) )  { I (17:11)=[1,1,0,1,0,1,0];
   I(10:6)=gdw(4:0);            I(5:0)=jdw(5:0);     }
if( (gt==0x23)&&(jt==0x28) )  { I (17:11)=[1,1,0,1,0,1,1];
   I(10:8)=gdw(2:0);            I(7:0)=jdw(7:0);     }
if( (gt==0x33)&&(jt==0x38) )  { I (17:11)=[1,1,0,1,1,0,0];
   I(10:8)=gdw(2:0);            I(7:0)=jdw(7:0);     }
if( (gt==0x97)&&(jt==0x94) )  { I (17:11)=[1,1,0,1,1,0,1];
   I(10:4)=gdw(6:0);            I(3:0)=jdw(3:0);     }
if( (gt==0x94)&&(jt==0x97) )  { I (17:11)=[1,1,0,1,1,1,0];
   I(10:7)=gdw(3:0);            I(6:0)=jdw(6:0);     }
if( (gt==0xA6)&&(jt==0xA5) )  { I (17:11)=[1,1,0,1,1,1,1];
   I(10:5)=gdw(5:0);            I(4:0)=jdw(4:0);     }
if( (gt==0xA5)&&(jt==0xA6) )  { I (17:11)=[1,1,1,0,0,0,0];
   I(10:6)=gdw(4:0);            I(5:0)=jdw(5:0);     }
if( (gt==0X07)&&(jt==0X03) )  { I (17:10)=[1,1,1,0,0,0,1,0];
   I(9:3)=gdw(6:0);             I(2:0)=jdw(2:0);     }
if( (gt==0X05)&&(jt==0X05) )  { I (17:10)=[1,1,1,0,0,0,1,1];
   I(9:5)=gdw(4:0);             I(4:0)=jdw(4:0);     }
```

TABLE 21-continued

```
if( (gt==0X02)&&(jt==0X08) )  { I (17:10)=[1,1,1,0,0,1,0,0];
   I(9:8)=gdw(3:0);             I(7:0)=jdw(7:0);     }
if( (gt==0X17)&&(jt==0X13) )  { I (17:10)=[1,1,1,0,0,1,0,1];
   I(9:3)=gdw(6:0);             I(2:0)=jdw(2:0);     }
if( (gt==0X14)&&(jt==0X16) )  { I (17:10)=[1,1,1,0,0,1,1,0];
   I(9:6)=gdw(3:0);             I(5:0)=jdw(5:0);     }
if( (gt==0X24)&&(jt==0X26) )  { I (17:10)=[1,1,1,0,0,1,1,1];
   I(9:6)=gdw(3:0);             I(5:0)=jdw(5:0);     }
if( (gt==0X35)&&(jt==0X35) )  { I (17:10)=[1,1,1,0,1,0,0,0];
   I(9:5)=gdw(4:0);             I(4:0)=jdw(4:0);     }
if( (gt==0X32)&&(jt==0X38) )  { I (17:10)=[1,1,1,0,1,0,0,1];
   I(9:8)=gdw(1:0);             I(7:0)=jdw(7:0);     }
if( (gt==0X43)&&(jt==0X47) )  { I (17:10)=[1,1,1,0,1,0,1,0];
   I(9:7)=gdw(2:0);             I(6:0)=jdw(6:0);     }
if( (gt==0X97)&&(jt==0X93) )  { I (17:10)=[1,1,1,0,1,0,1,1];
   I(9:3)=gdw(6:0);             I(2:0)=jdw(2:0);     }
if( (gt==0X96)&&(jt==0X94) )  { I (17:10)=[1,1,1,0,1,1,0,0];
   I(9:4)=gdw(5:0);             I(3:0)=jdw(3:0);     }
if( (gt==0X94)&&(jt==0X96) )  { I (17:10)=[1,1,1,0,1,1,0,1];
   I(9:6)=gdw(3:0);             I(5:0)=jdw(5:0);     }
if( (gt==0XA6)&&(jt==0XA4) )  { I (17:10)=[1,1,1,0,1,1,1,0];
   I(9:4)=gdw(5:0);             I(3:0)=jdw(3:0);     }
if( (gt==0XA5)&&(jt==0XA5) )  { I (17:10)=[1,1,1,0,1,1,1,1];
   I(9:5)=gdw(4:0);             I(4:0)=jdw(4:0);     }
if( (gt==0XA4)&&(jt==0XA6) )  { I (17:10)=[1,1,1,1,0,0,0,0];
   I(9:6)=gdw(3:0);             I(5:0)=jdw(5:0);     }
if( (gt==0XB5)&&(jt==0XB5) )  { I (17:10)=[1,1,1,1,0,0,0,1];
   I(9:5)=gdw(4:0);             I(4:0)=jdw(4:0);     }
if( (gt==0X06)&&(jt==0X03) )  { I (17: 9)=[1,1,1,1,0,0,1,0,0];
   I(8:3)=gdw(5:0);             I(2:0)=jdw(2:0);     }
if( (gt==0X04)&&(jt==0X05) )  { I (17: 9)=[1,1,1,1,0,0,1,0,1];
   I(8:5)=gdw(3:0);             I(4:0)=jdw(4:0);     }
if( (gt==0X16)&&(jt==0X13) )  { I (17: 9)=[1,1,1,1,0,0,1,1,0];
   I(8:3)=gdw(5:0);             I(2:0)=jdw(2:0);     }
if( (gt==0X11)&&(jt==0X18) )  { I (17: 9)=[1,1,1,1,0,0,1,1,1];
   I(8)=gdw(0);                 I(7:0)=jdw(7:0);     }
if( (gt==0X26)&&(jt==0X23) )  { I (17: 9)=[1,1,1,1,0,1,0,0,0];
   I(8:3)=gdw(5:0);             I(2:0)=jdw(2:0);     }
if( (gt==0X23)&&(jt==0X26) )  { I (17: 9)=[1,1,1,1,0,1,0,0,1];
   I(8:6)=gdw(2:0);             I(5:0)=jdw(5:0);     }
if( (gt==0X43)&&(jt==0X46) )  { I (17: 9)=[1,1,1,1,0,1,0,1,0];
   I(8:6)=gdw(2:0);             I(5:0)=jdw(5:0);     }
if( (gt==0X97)&&(jt==0X92) )  { I (17: 9)=[1,1,1,1,0,1,0,1,1];
   I(8:2)=gdw(6:0);             I(1:0)=jdw(1:0);     }
if( (gt==0X96)&&(jt==0X93) )  { I (17: 9)=[1,1,1,1,0,1,1,0,0];
   I(8:3)=gdw(5:0);             I(2:0)=jdw(2:0);     }
if( (gt==0XA6)&&(jt==0XA3) )  { I (17: 9)=[1,1,1,1,0,1,1,0,1];
   I(8:3)=gdw(5:0);             I(2:0)=jdw(2:0);     }
if( (gt==0XA5)&&(jt==0XA4) )  { I (17: 9)=[1,1,1,1,0,1,1,1,0];
   I(8:4)=gdw(4:0);             I(3:0)=jdw(3:0);     }
if( (gt==0XA4)&&(jt==0XA5) )  { I (17: 9)=[1,1,1,1,0,1,1,1,1];
   I(8:5)=gdw(3:0);             I(4:0)=jdw(4:0);     }
if( (gt==0XA3)&&(jt==0XA6) )  { I (17: 9)=[1,1,1,1,1,0,0,0,0];
   I(8:6)=gdw(2:0);             I(5:0)=jdw(5:0);     }
if( (gt==0X05)&&(jt==0X03) )  { I (17: 8)=[1,1,1,1,1,0,0,0,1,0];
   I(7:3)=gdw(4:0);             I(2:0)=jdw(2:0);     }
if( (gt==0X03)&&(jt==0X05) )  { I (17: 8)=[1,1,1,1,1,0,0,0,1,1];
   I(7:5)=gdw(2:0);             I(4:0)=jdw(4:0);     }
if( (gt==0X17)&&(jt==0X11) )  { I (17: 8)=[1,1,1,1,1,0,0,1,0,0];
   I(7:1)=gdw(6:0);             I(0)=jdw(0);         }
if( (gt==0X25)&&(jt==0X23) )  { I (17: 8)=[1,1,1,1,1,0,0,1,0,1];
   I(7:3)=gdw(4:0);             I(2:0)=jdw(2:0);     }
if( (gt==0X35)&&(jt==0X33) )  { I (17: 8)=[1,1,1,1,1,0,0,1,1,0];
   I(7:3)=gdw(4:0);             I(2:0)=jdw(2:0);     }
if( (gt==0X33)&&(jt==0X35) )  { I (17: 8)=[1,1,1,1,1,0,0,1,1,1];
   I(7:5)=gdw(2:0);             I(4:0)=jdw(4:0);     }
if( (gt==0X30)&&(jt==0X38) )  { I (17: 8)=[1,1,1,1,1,0,1,0,0,0];
   I(7:0)=jdw(7:0);                                  }
if( (gt==0X41)&&(jt==0X47) )  { I (17: 8)=[1,1,1,1,1,0,1,0,0,1];
   I(7)=gdw(0);                 I(6:0)=jdw(6:0);     }
if( (gt==0X96)&&(jt==0X92) )  { I (17: 8)=[1,1,1,1,1,0,1,0,1,0];
   I(7:2)=gdw(5:0);             I(1:0)=jdw(1:0);     }
if( (gt==0X94)&&(jt==0X94) )  { I (17: 8)=[1,1,1,1,1,0,1,0,1,1];
   I(7:4)=gdw(3:0);             I(3:0)=jdw(3:0);     }
if( (gt==0X91)&&(jt==0X97) )  { I (17: 8)=[1,1,1,1,1,0,1,1,0,0];
   I(7)=gdw(0);                 I(6:0)=jdw(6:0);     }
if( (gt==0XA5)&&(jt==0XA3) )  { I (17: 8)=[1,1,1,1,1,0,1,1,0,1];
   I(7:3)=gdw(4:0);             I(2:0)=jdw(2:0);     }
if( (gt==0XA4)&&(jt==0XA4) )  { I (17: 8)=[1,1,1,1,1,0,1,1,1,0];
```

TABLE 21-continued

```
            I(7:4)=gdw(3:0);             I(3:0)=jdw(3:0);       }
if( (gt==0XA3)&&(jt==0XA5) )   {  I (17: 8)=[1,1,1,1,1,0,1,1,1,1];
            I(7:5)=gdw(2:0);             I(4:0)=jdw(4:0);       }
if( (gt==0XB5)&&(jt==0XB3) )   {  I (17: 8)=[1,1,1,1,1,1,0,0,0,0];
            I(7:3)=gdw(4:0);             I(2:0)=jdw(2:0);       }
if( (gt==0XB3)&&(jt==0XB5) )   {  I (17: 8)=[1,1,1,1,1,1,0,0,0,1];
            I(7:5)=gdw(2:0);             I(4:0)=jdw(4:0);       }
if( (gt==0X07)&&(jt==0X00) )   {  I (17: 7)=[1,1,1,1,1,1,0,0,1,0,0];
            I(6:0)=gdw(6:0);                                    }
if( (gt==0X04)&&(jt==0X03) )   {  I (17: 7)=[1,1,1,1,1,1,0,0,1,0,1];
            I(6:3)=gdw(3:0);             I(2:0)=jdw(2:0);       }
if( (gt==0X02)&&(jt==0X05) )   {  I (17: 7)=[1,1,1,1,1,1,0,0,1,1,0];
            I(6:5)=gdw(1:0);             I(4:0)=jdw(4:0);       }
if( (gt==0X16)&&(jt==0X11) )   {  I (17: 7)=[1,1,1,1,1,1,0,0,1,1,1];
            I(6:1)=gdw(5:0);             I(0)=jdw(0);           }
if( (gt==0X14)&&(jt==0X13) )   {  I (17: 7)=[1,1,1,1,1,1,0,1,0,0,0];
            I(6:3)=gdw(3:0);             I(2:0)=jdw(2:0);       }
if( (gt==0X11)&&(jt==0X16) )   {  I (17: 7)=[1,1,1,1,1,1,0,1,0,0,1];
            I(6)=gdw(0);                 I(5:0)=jdw(5:0);       }
if( (gt==0X26)&&(jt==0X21) )   {  I(17: 7)=[1,1,1,1,1,1,0,1,0,1,0];
            I(6:1)=gdw(5:0);             I(0)=jdw(0);           }
if( (gt==0X24)&&(jt==0X23) )   {  I (17: 7)=[1,1,1,1,1,1,0,1,0,1,1];
            I(6:3)=gdw(3:0);             I(2:0)=jdw(2:0);       }
if( (gt==0X32)&&(jt==0X35) )   {  I (17: 7)=[1,1,1,1,1,1,0,1,1,0,0];
            I(6:5)=gdw(1:0);             I(4:0)=jdw(4:0);       }
if( (gt==0X43)&&(jt==0X44) )   {  I (17: 7)=[1,1,1,1,1,1,0,1,1,0,1];
            I(6:4)=gdw(2:0);             I(3:0)=jdw(3:0);       }
if( (gt==0X41)&&(jt==0X46) )   {  I (17: 7)=[1,1,1,1,1,1,0,1,1,1,0];
            I(6)=gdw(0);                 I(5:0)=jdw(5:0);       }
if( (gt==0X94)&&(jt==0X93) )   {  I (17: 7)=[1,1,1,1,1,1,0,1,1,1,1];
            I(6:3)=gdw(3:0);             I(2:0)=jdw(2:0);       }
if( (gt==0X91)&&(jt==0X96) )   {  I (17: 7)=[1,1,1,1,1,1,1,0,0,0,0];
            I(6)=gdw(0);                 I(5:0)=jdw(5:0);       }
if( (gt==0XA4)&&(jt==0XA3) )   {  I (17: 7)=[1,1,1,1,1,1,1,0,0,0,1];
            I(6:3)=gdw(3:0);             I(2:0)=jdw(2:0);       }
if( (gt==0XA3)&&(jt==0XA4) )   {  I (17: 7)=[1,1,1,1,1,1,1,0,0,1,0];
            I(6:4)=gdw(2:0);             I(3:0)=jdw(3:0);       }
if( (gt==0XB5)&&(jt==0XB2) )   {  I (17: 7)=[1,1,1,1,1,1,1,0,0,1,1];
            I(6:2)=gdw(4:0);             I(1:0)=jdw(1:0);       }
if( (gt==0XB2)&&(jt==0XB5) )   {  I (17: 7)=[1,1,1,1,1,1,1,0,1,0,0];
            I(6:5)=gdw(1:0);             I(4:0)=jdw(4:0);       }
if( (gt==0X06)&&(jt==0X00) )   {  I (17: 6)=[1,1,1,1,1,1,1,0,1,0,1];
            I(5:0)=gdw(5:0);                                    }
if( (gt==0X03)&&(jt==0X03) )   {  I (17: 6)=[1,1,1,1,1,1,1,0,1,0,1,1];
            I(5:3)=gdw(2:0);             I(2:0)=jdw (2:0);      }
if( (gt==0X25)&&(jt==0X21) )   {  I (17: 6)=[1,1,1,1,1,1,1,0,1,1,0,0];
            I(5:1)=gdw(4:0);             I(0)=jdw(0);           }
if( (gt==0X23)&&(jt==0X23) )   {  I (17: 6)=[1,1,1,1,1,1,1,0,1,1,0,1];
            I(5:3)=gdw(2:0);             I(2:0)=jdw(2:0);       }
if( (gt==0X33)&&(jt==0X33) )   {  I (17: 6)=[1,1,1,1,1,1,1,0,1,1,1,0];
            I(5:3)=gdw(2:0);             I(2:0)=jdw(2:0);       }
if( (gt==0X43)&&(jt==0X43) )   {  I (17: 6)=[1,1,1,1,1,1,1,0,1,1,1,1];
            I(5:3)=gdw(2:0);             I(2:0)=jdw(2:0);       }
if( (gt==0X94)&&(jt==0X92) )   {  I (17: 6)=[1,1,1,1,1,1,1,1,0,0,0,0];
            I(5:2)=gdw(3:0);             I(1:0)=jdw(1:0);       }
if( (gt==0XA6)&&(jt==0XA0) )   {  I (17: 6)=[1,1,1,1,1,1,1,1,0,0,0,1];
            I(5:0)=gdw(5:0);                                    }
if( (gt==0XA3)&&(jt==0XA3) )   {  I (17: 6)=[1,1,1,1,1,1,1,1,0,0,1,0];
            I(5:3)=gdw(2:0);             I(2:0)=jdw(2:0);       }
if( (gt==0XB3)&&(jt==0XB3) )   {  I (17: 6)=[1,1,1,1,1,1,1,1,0,0,1,1];
            I(5:3)=gdw(2:0);             I(2:0)=jdw(2:0);       }
if( (gt==0XC3)&&(jt==0XC3) )   {  I (17: 6)=[1,1,1,1,1,1,1,1,0,1,0,0];
            I(5:3)=gdw(2:0);             I(2:0)=jdw(2:0);       }
if( (gt==0X05)&&(jt==0X00) )
    { I(17: 5)=[1,1,1,1,1,1,1,1,0,1,0,1,0];
            I(4:0)=gdw(4:0);                                    }
if( (gt==0X02)&&(jt==0X03) )
    { I(17: 5)=[1,1,1,1,1,1,1,1,0,1,0,1,1];
            I(4:3)=gdw(1:0);             I(2:0)=jdw(2:0);       }
if( (gt==0X14)&&(jt==0X11) )
    { I(17: 5)=[1,1,1,1,1,1,1,1,0,1,1,0,0];
            I(4:1)=gdw(3:0);             I(0)=jdw(0);           }
if( (gt==0X24)&&(jt==0X21) )
    { I(17: 5)=[1,1,1,1,1,1,1,1,0,1,1,0,1];
            I(4:1)=gdw(3:0);             I(0)=jdw(0);           }
if( (gt==0X35)&&(jt==0X30) )
    { I(17: 5)=[1,1,1,1,1,1,1,1,0,1,1,1,0];
            I(4:0)=gdw(4:0);                                    }
if( (gt==0X32)&&(jt==0X33) )
    { I(17: 5)=[1,1,1,1,1,1,1,1,0,1,1,1,1];
            I(4:3)=gdw(1:0);             I(2:0)=jdw(2:0);       }
if( (gt==0X30)&&(jt==0X35) )
    { I(17: 5)=[1,1,1,1,1,1,1,1,1,0,0,0,0];
            I(4:0)=jdw(4:0);                                    }
if( (gt==0X43)&&(jt==0X42) )
    { I(17: 5)=[1,1,1,1,1,1,1,1,1,0,0,0,1];
            I(4:2)=gdw(2:0);             I(1:0)=jdw(1:0);       }
if( (gt==0X41)&&(jt==0X44) )
    { I(17: 5)=[1,1,1,1,1,1,1,1,1,0,0,1,0];
            I(4)=gdw(0);                 I(3:0)=jdw(3:0);       }
if( (gt==0X91)&&(jt==0X94) )
    { I(17: 5)=[1,1,1,1,1,1,1,1,1,0,0,1,1];
            I(4)=gdw(0);                 I(3:0)=jdw(3:0);       }
if( (gt==0XA5)&&(jt==0XA0) )
    { I(17: 5)=[1,1,1,1,1,1,1,1,1,0,1,0,0];
            I(4:0)=gdw(4:0);                                    }
if( (gt==0XB5)&&(jt==0XB0) )
    { I(17: 5)=[1,1,1,1,1,1,1,1,1,0,1,0,1];
            I(4:0)=gdw(4:0);                                    }
if( (gt==0XB3)&&(jt==0XB2) )
    { I(17: 5)=[1,1,1,1,1,1,1,1,1,0,1,1,0];
            I(4:2)=gdw(2:0);             I(1:0)=jdw(1:0);       }
if( (gt==0XB2)&&(jt==0XB3) )
    { I(17: 5)=[1,1,1,1,1,1,1,1,1,0,1,1,1];
            I(4:3)=gdw(1:0);             I(2:0)=jdw(2:0);       }
if( (gt==0XB0)&&(jt==0XB5) )
    { I(17: 5)=[1,1,1,1,1,1,1,1,1,1,0,0,0];
            I(4:0)=jdw(4:0);                                    }
if( (gt==0X04)&&(jt==0X00) )
    { I(17: 4)=[1,1,1,1,1,1,1,1,1,1,0,0,1,0];
            I(3:0)=gdw(3:0);                                    }
if( (gt==0X11)&&(jt==0X13) )
    { I(17: 4)=[1,1,1,1,1,1,1,1,1,1,0,0,1,1];
            I(3)=gdw(0);                 I(2:0)=jdw(2:0);       }
if( (gt==0X23)&&(jt==0X21) )
    { I(17: 4 )=[1,1,1,1,1,1,1,1,1,1,0,1,0,0];
            I(3:1)=gdw(2:0);             I(0)=jdw(0);           }
if( (gt==0X41)&&(jt==0X43) )
    { I(17: 4)=[1,1,1,1,1,1,1,1,1,1,0,1,0,1];
            I(3)=gdw(0);                 I(2:0)=jdw(2:0);       }
if( (gt==0X91)&&(jt==0X93) )
    { I(17: 4)=[1,1,1,1,1,1,1,1,1,1,0,1,1,0];
            I(3)=gdw(0);                 I(2:0)=jdw(2:0);       }
if( (gt==0XA4)&&(jt==0XA0) )
    { I(17: 4)=[1,1,1,1,1,1,1,1,1,1,0,1,1,1];
            I(3:0)=gdw(3:0);                                    }
if( (gt=0XB2)&&(jt==0XB2) )
    { I(17: 4)=[1,1,1,1,1,1,1,1,1,1,1,0,0,0];
            I(3:2)=gdw(1:0);             I(1:0)=jdw(1:0);       }
if( (gt==0XC3)&&(jt==0XC1) )
    { I(17: 4)=[1,1,1,1,1,1,1,1,1,1,1,0,0,1];
            I(3:1)=gdw(2:0);             I(0)=jdw(0);           }
if( (gt==0XC1)&&(jt==0XC3) )
    { I(17: 4)=[1,1,1,1,1,1,1,1,1,1,1,0,1,0];
            I(3)=gdw(0);                 I(2:0)=jdw(2:0);       }
if( (gt==0X03)&&(jt==0X00) )
    { I(17: 3)=[1,1,1,1,1,1,1,1,1,1,1,0,1,1,0];
            I(2:0)=gdw(2:0);                                    }
if( (gt==0X33)&&(jt==0X30) )
    { I(17: 3)=[1,1,1,1,1,1,1,1,1,1,1,0,1,1,1];
            I(2:0)=gdw(2:0);                                    }
if( (gt==0X30)&&(jt==0X33) )
    { I(17: 3)=[1,1,1,1,1,1,1,1,1,1,1,1,0,0,0];
            I(2:0)=jdw(2:0);                                    }
if( (gt==0X41)&&(jt==0X42) )
    { I(17: 3)=[1,1,1,1,1,1,1,1,1,1,1,1,0,0,1];
            I(2)=gdw(0);                 I(1:0)=jdw(1:0);       }
if( (gt=0X91)&&(jt==0X92) )
    { I(17: 3)=[1,1,1,1,1,1,1,1,1,1,1,1,0,1,0];
            I(2)=gdw(0);                 I(1:0)=jdw(1:0);       }
if( (gt==0XA3)&&(jt==0XA0) )
    { I(17: 3)=[1,1,1,1,1,1,1,1,1,1,1,1,0,1,1];
            I(2:0)=gdw(2:0);                                    }
if( (gt==0XB3)&&(jt==0XB0) )
    { I(17: 3)=[1,1,1,1,1,1,1,1,1,1,1,1,1,0,0];
            I(2:0)=gdw(2:0);                                    }
if( (gt==0XB0)&&(jt==0XB3) )
    { I(17: 3)=[1,1,1,1,1,1,1,1,1,1,1,1,1,0,1];
```

TABLE 21-continued

```
                              I(2:0)=jdw(2:0);   }
if( (gt==0X02)&&(jt==0X00) )
  { I(17: 2)=[1,1,1,1,1,1,1,1,1,1,1,1,1,0,0];
    I(1:0)=gdw(1:0);                            }
if( (gt==0X11)&&(jt==0X11) )
  { I(17: 2)=[1,1,1,1,1,1,1,1,1,1,1,1,1,0,1];
    I(1)=gdw(0);            I(0)=jdw(0);        }
if( (gt==0X32)&&(jt==0X30) )
  { I(17: 2)=[1,1,1,1,1,1,1,1,1,1,1,1,1,1,0];
    I(1:0)=gdw(1:0);                            }
if( (gt==0XB2)&&(jt==0XB0) )
  { I(17: 2)=[1,1,1,1,1,1,1,1,1,1,1,1,1,1,1];
    I(1:0)=gdw(1:0);                            }
```

It is to be understood that even though numerous characteristics and advantages of various embodiments of the invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, the particular elements may vary depending on the particular application for the communication system while maintaining substantially the same functionality without departing from the scope and spirit of the present invention. In addition, although the embodiments described herein are directed to a coding system for a disc drive, it will be appreciated by those skilled in the art that the teachings of the present invention can be applied to system such as satellite communications and cellular phones, without departing from the scope and spirit of the present invention. Also, a digital "word" can have any number of bits in alternative embodiments of the present invention.

What is claimed is:

1. A method of encoding digital information in a system, the method comprising:
   (a) receiving a sequence of successive data words; and
   (b) encoding the sequence of successive data words into a sequence of successive code words such that a running digital sum (RDS) of the sequence of successive code words is bounded and is constrained to predetermined, non-adjacent values at boundaries between the code words.

2. The method of claim 1 wherein each code word comprises a plurality of bits and (b) comprises interleaving at least some of the bits in each code word with at least some of the bits in another, adjacent one of the code words in the sequence of successive code words.

3. The method of claim 1 wherein one of the predetermined, non-adjacent values is zero.

4. The method of claim 3 wherein the running digital sum is constrained to the values of zero and six at the boundaries between the code words.

5. The method of claim 1 wherein each data word has 18 bits and each code word has 20 bits such that the method has a code rate of 18/20.

6. The method of claim 1 wherein (b) comprises, for each user data word:
   (b)(1) generating a first segment of the code word based on a corresponding one of the user data words and the running digital sum of the sequence at the boundary between that code word and a previous one of the code words in the sequence, wherein the first segment also has a running digital sum; and
   (b)(2) generating a second segment of the code word based on the corresponding user data word, the running digital sum of the sequence at the boundary between the code word and the previous code word in the sequence, and the running digital sum of the first segment.

7. The method of claim 1 wherein (b) comprises, for each user data word:
   (b)(1) separating the user data word into a first fragment, a second fragment and a third fragment;
   (b)(2) mapping the second fragment to a first segment of a corresponding one of the code words;
   (b)(3) mapping the third fragment to a second segment of the corresponding code word; and
   (b)(4) combining the first segment and the second segment to form the corresponding code word.

8. The method of claim 7 wherein (b)(1) comprises separating the user data word into the first, second and third fragments based on a pattern formed by the first fragment.

9. An encoder for encoding digital information, the encoder comprising:
   an input for receiving a sequence of successive data words; and
   encoding means for encoding the sequence of successive data words into a sequence of successive code words such that a running digital sum (RDS) of the sequence of successive code words is bounded and is constrained to predetermined, non-adjacent values at boundaries between the code words.

10. The encoder of claim 9 wherein each code word comprises a plurality of bits and the encoding means comprises means for interleaving at least some of the bits in each code word with at least some of the bits in another, adjacent one of the code words in the sequence of successive code words.

11. The encoder of claim 9 wherein one of the predetermined, non-adjacent values is zero.

12. The encoder of claim 11 wherein the running digital sum is constrained to the values of zero and six at the boundaries between the code words.

13. The encoder of claim 9 wherein each data word has 18 bits and each code word has 20 bits such that the method has a code rate of 18/20.

14. The encoder of claim 9 wherein the encoding means comprises, for each user data word:
   means for generating a first segment of the code word based on a corresponding one of the user data words and the running digital sum of the sequence at the boundary between that code word and a previous one of the code words in the sequence, wherein the first segment also has a running digital sum; and
   means for generating a second segment of the code word based on the corresponding user data word, the running digital sum of the sequence at the boundary between the code word and the previous code word in the sequence, and the running digital sum of the first segment.

15. The encoder of claim 9 wherein the encoding means comprises, for each user data word:
   means for separating the user data word into a first fragment, a second fragment and a third fragment, mapping the second fragment to a first segment of a corresponding one of the code words, mapping the third fragment to a second segment of the corresponding code word, and combining the first segment and the second segment to form the corresponding code word.

16. The encoder of claim 15 wherein the encoding means further comprises means for separating the user data word into the first, second and third fragments based on a pattern formed by the first fragment.

17. A method of encoding digital information in a system, the method comprising:

(a) receiving a sequence of successive data words;

(b) encoding the sequence of successive data words into a sequence of successive code words such that a running digital sum (RDS) of the sequence of successive code words is bounded and is constrained to predetermined, non-adjacent values at boundaries between the code words; and (c) interleaving at least some bits in each code word with at least some bits in another, adjacent one of the code words in the sequence of successive code words.

18. The method of claim 17 wherein the running digital sum of the sequence of successive code words is constrained at boundaries between the code words to zero and another predetermined value that is non-adjacent to zero in a series of otherwise possible values for the running digital sum.

19. The method of claim 18 wherein the running digital sum is constrained to the values of zero and six at the boundaries between the code words.

20. The method of claim 17 wherein each data word has 18 bits and each code word has 20 bits such that the method has a code rate of 18/20.

21. The method of claim 17 wherein (b) comprises, for each user data word:

(b)(1) generating a first segment of the code word based on a corresponding one of the user data words and the running digital sum of the sequence at the boundary between that code word and a previous one of the code words in the sequence, wherein the first segment also has a running digital sum; and (b)(2) generating a second segment of the code word based on the corresponding user data word, the running digital sum of the sequence at the boundary between the code word and the previous code word in the sequence, and the running digital sum of the first segment.

22. The method of claim 17 wherein (b) comprises, for each user data word:

(b)(1) separating the user data word into a first fragment, a second fragment and a third fragment;

(b)(2) mapping the second fragment to a first segment of a corresponding one of the code words;

(b)(3) mapping the third fragment to a second segment of the corresponding code word; and (b)(4) combining the first segment and the second segment to form the corresponding code word.

23. The method of claim 22 wherein (b)(1) comprises separating the user data word into the first, second and third fragments based on a pattern formed by the first fragment.

24. A method of decoding digital information in a system, the method comprising:

(a) receiving a sequence of successive code words; and (b) decoding the sequence of successive code words into a sequence of successive data words according to a code in which a running digital sum (RDS) of the sequence of successive code words is bounded and is constrained to predetermined, non-adjacent values at boundaries between the code words.

* * * * *